United States Patent
Kaeriyama et al.

(10) Patent No.: US 8,072,253 B2
(45) Date of Patent: Dec. 6, 2011

(54) CLOCK ADJUSTING CIRCUIT AND SEMICONDUCTOR INTEGRATED CIRCUIT DEVICE

(75) Inventors: Shunichi Kaeriyama, Minato-ku (JP); Masayuki Mizuno, Minato-ku (JP)

(73) Assignee: NEC Corporation, Tokyo (JP)

(*) Notice: Subject to any disclaimer, the term of this patent is extended or adjusted under 35 U.S.C. 154(b) by 90 days.

(21) Appl. No.: 12/440,967

(22) PCT Filed: Sep. 11, 2007

(86) PCT No.: PCT/JP2007/067649
§ 371 (c)(1),
(2), (4) Date: Mar. 12, 2009

(87) PCT Pub. No.: WO2008/032701
PCT Pub. Date: Mar. 20, 2008

(65) Prior Publication Data
US 2010/0039157 A1    Feb. 18, 2010

(30) Foreign Application Priority Data
Sep. 13, 2006 (JP) .................. 2006-247980
Jan. 31, 2007 (JP) .................. 2007-021159

(51) Int. Cl.
*H03H 11/16* (2006.01)

(52) U.S. Cl. ............................................ 327/231

(58) Field of Classification Search ............ None
See application file for complete search history.

(56) References Cited

U.S. PATENT DOCUMENTS

| | | | |
|---|---|---|---|
| 5,945,862 A | 8/1999 | Donnelly et al. | |
| 6,028,461 A | 2/2000 | Kobayashi | |
| 6,125,157 A | 9/2000 | Donnelly et al. | |
| 6,127,858 A * | 10/2000 | Stinson et al. | 327/99 |
| 6,806,750 B1 * | 10/2004 | Rasmussen et al. | 327/156 |
| 6,891,421 B2 | 5/2005 | Slawecki | |
| 7,065,172 B2 * | 6/2006 | Xiu et al. | 375/376 |
| 2003/0065962 A1 * | 4/2003 | Lim et al. | 713/401 |
| 2006/0294410 A1 * | 12/2006 | Kizer et al. | 713/500 |

FOREIGN PATENT DOCUMENTS

| | | |
|---|---|---|
| JP | 09-186682 A | 7/1997 |
| JP | 11-024783 A | 1/1999 |

* cited by examiner

*Primary Examiner* — Lincoln Donovan
*Assistant Examiner* — Khareem E Almo
(74) *Attorney, Agent, or Firm* — Sughrue Mion, PLLC

(57) ABSTRACT

Disclosed is a clock adjusting circuit comprising a phase shifter that receives a clock signal and variably shifts, based on a control signal, respective timing phases of a rising edge and a falling edge of the clock signal; and a control circuit that supplies the control signal to the phase shifter circuit before each edge is output; wherein the clock signal, in which at least one of a period, a duty ratio, jitter and skew/delay of the input clock signal is changed over an arbitrary number of clock cycles, is output.

32 Claims, 65 Drawing Sheets

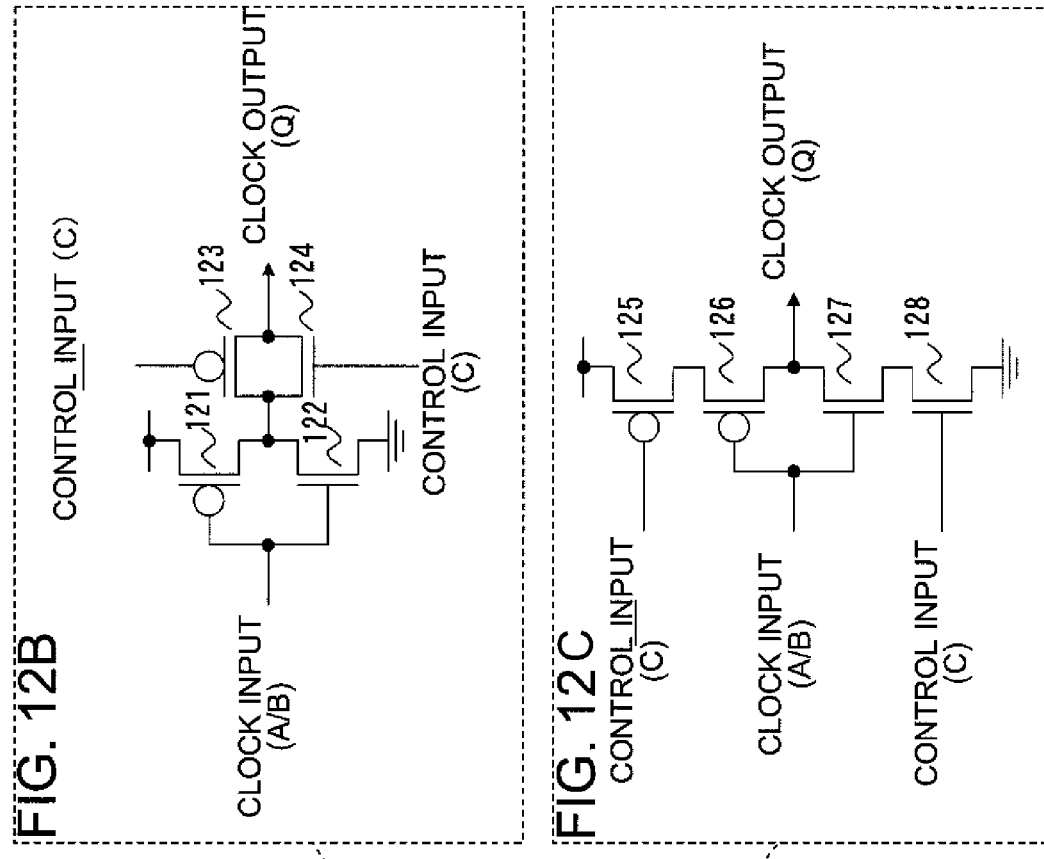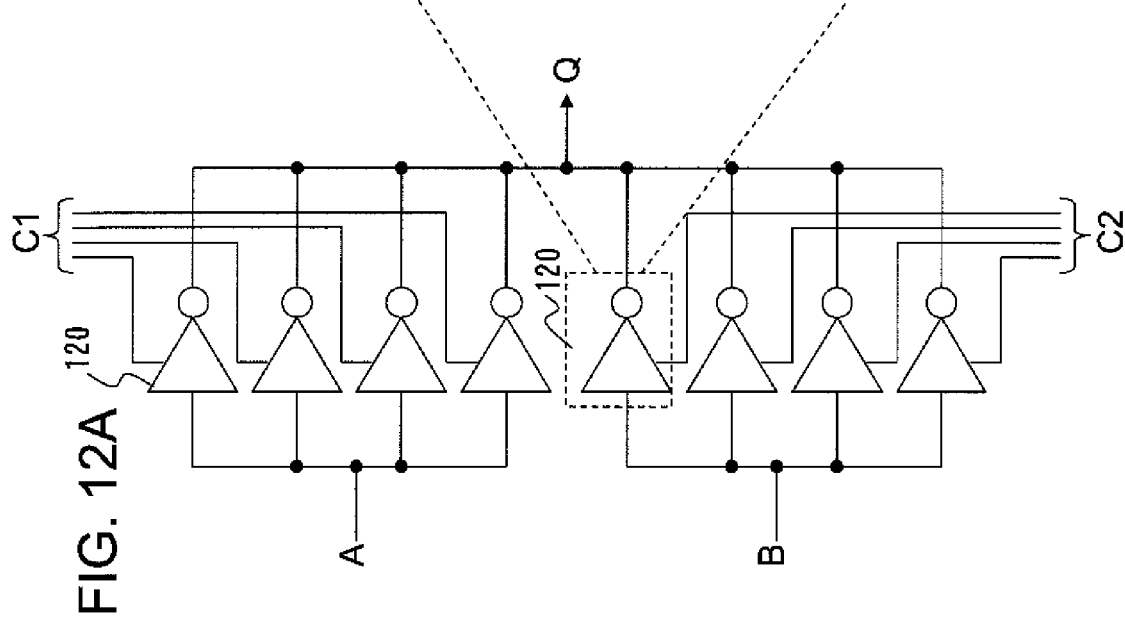

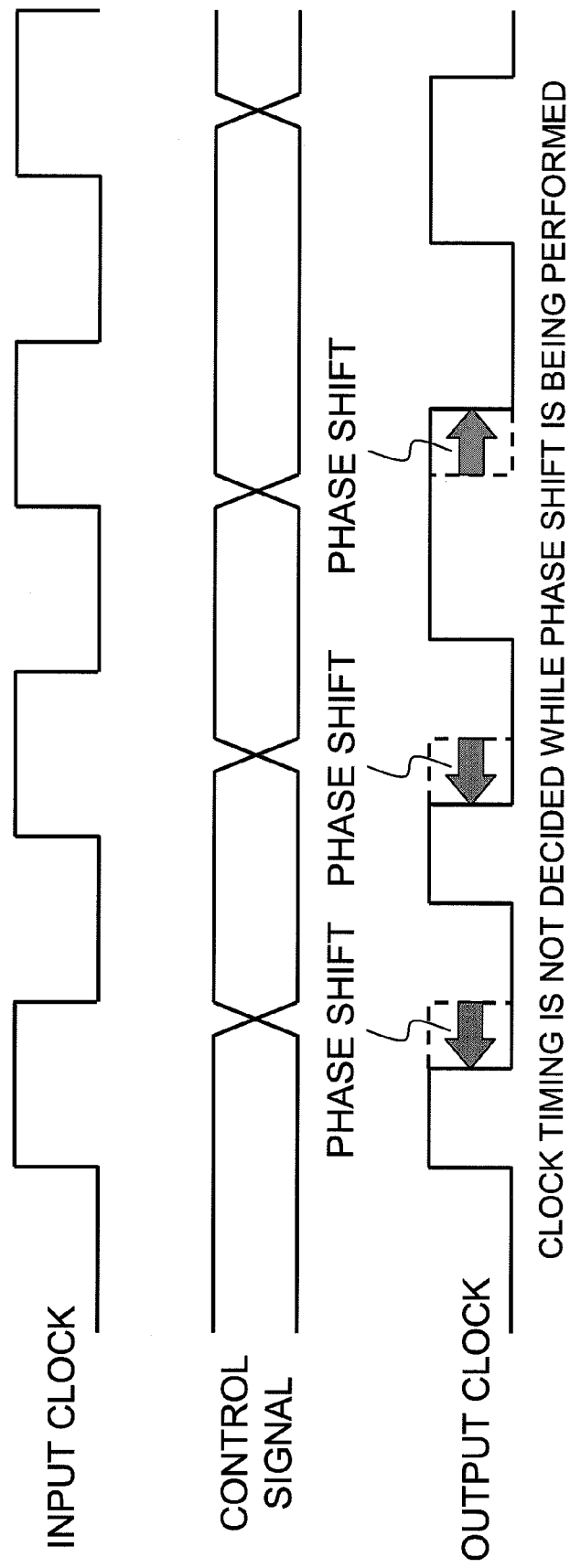

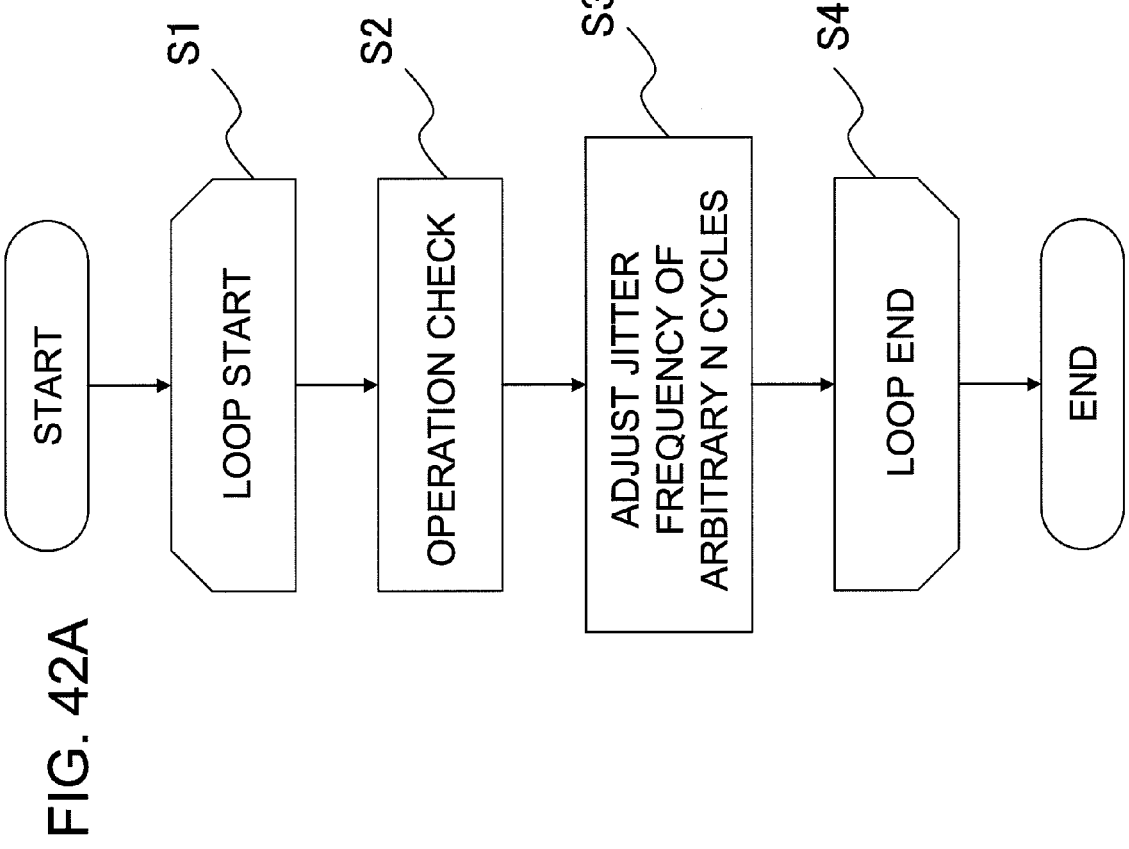

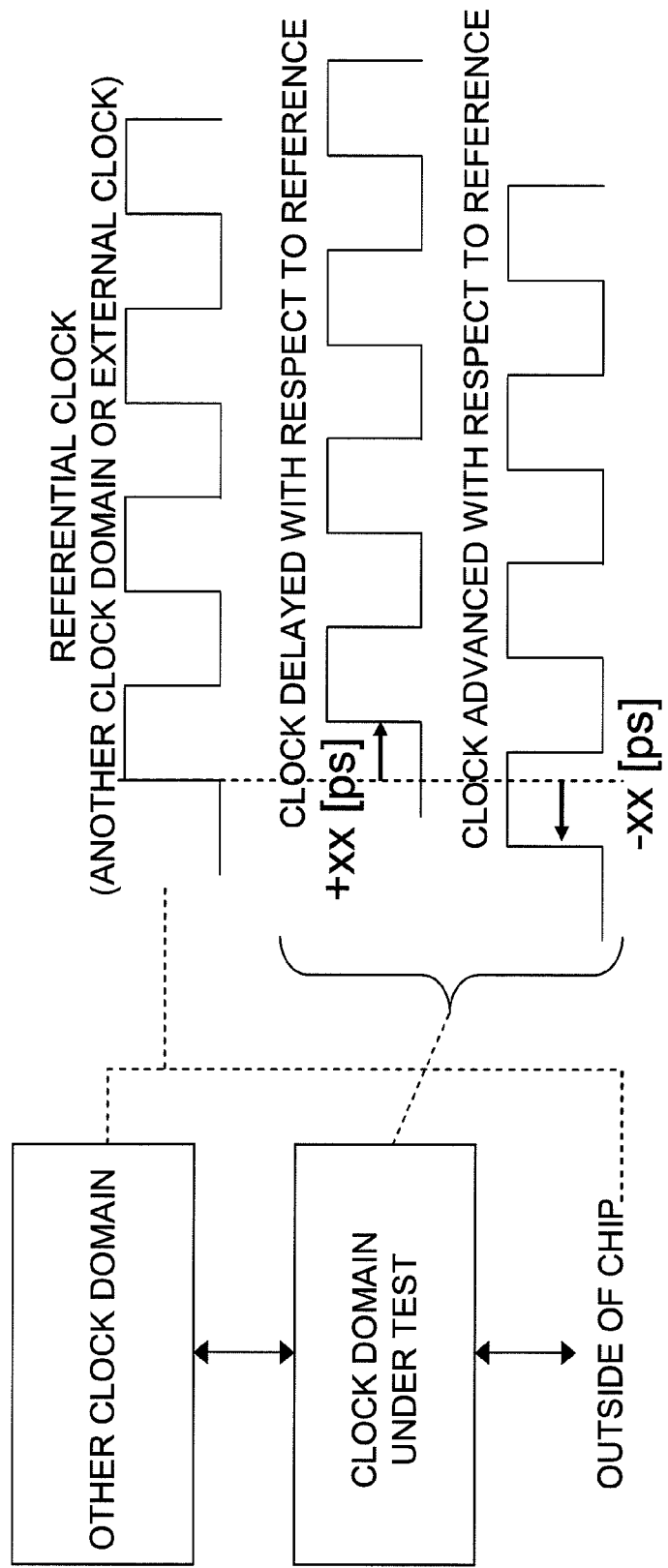

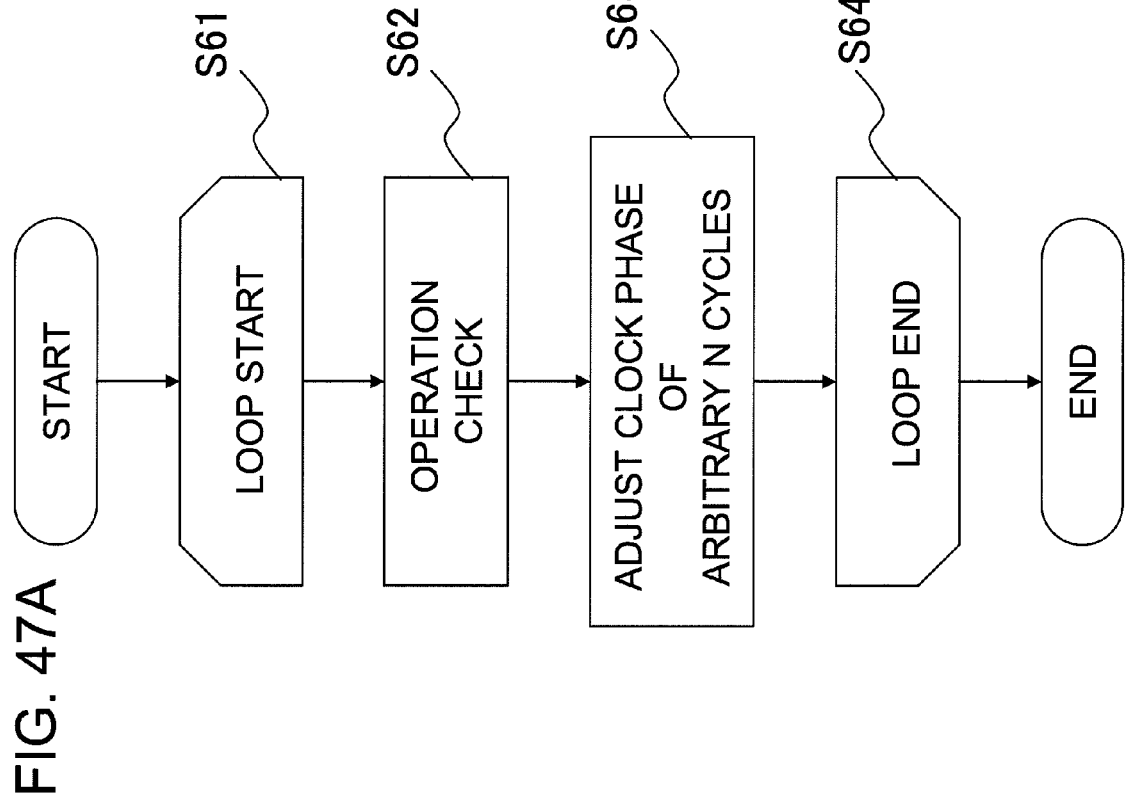

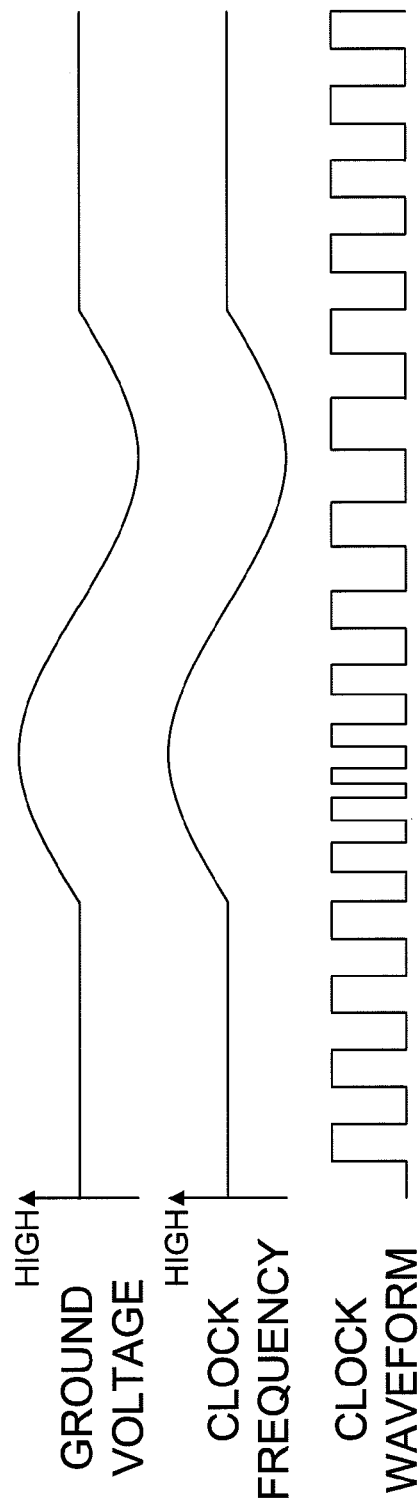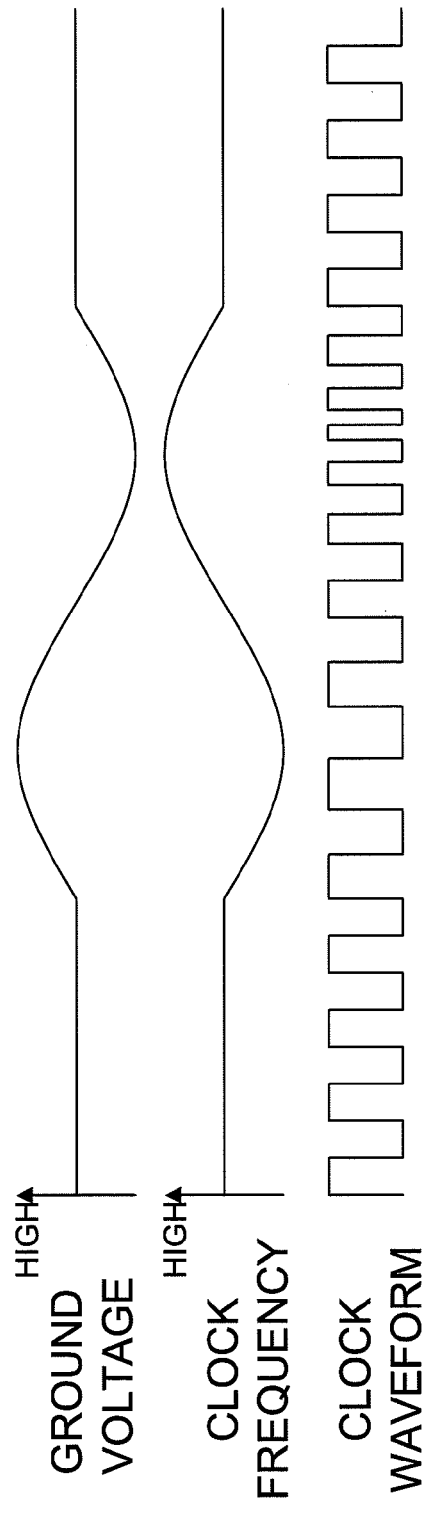

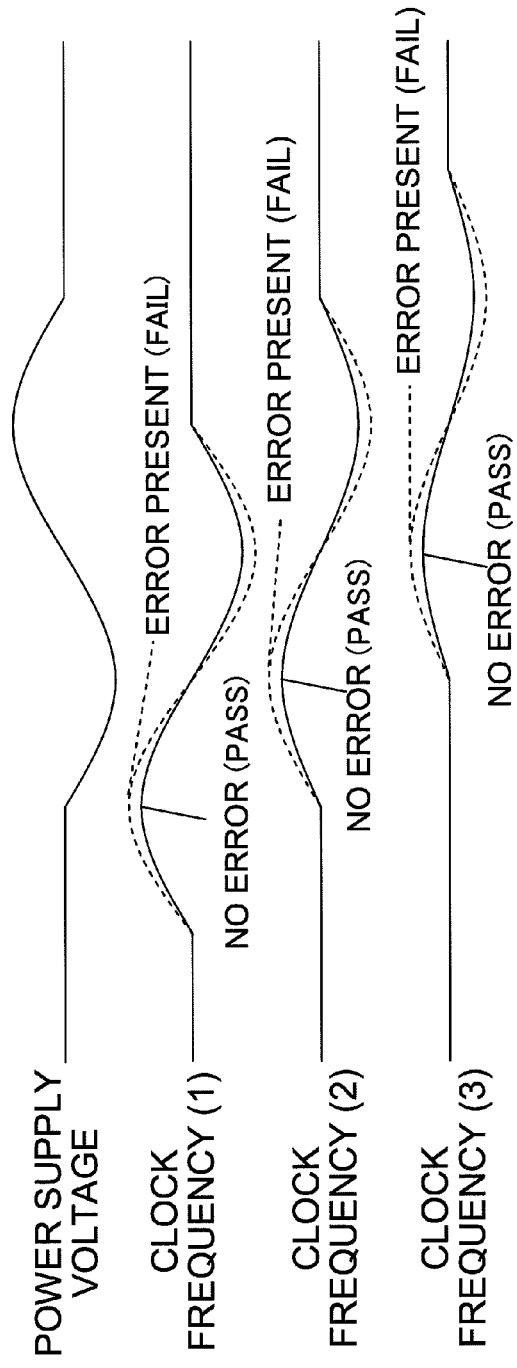
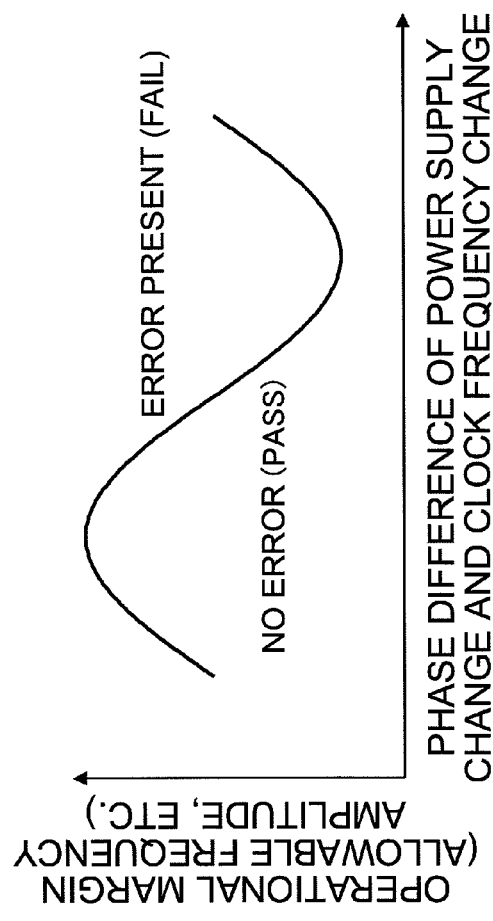
FIG. 59A
FIG. 59B

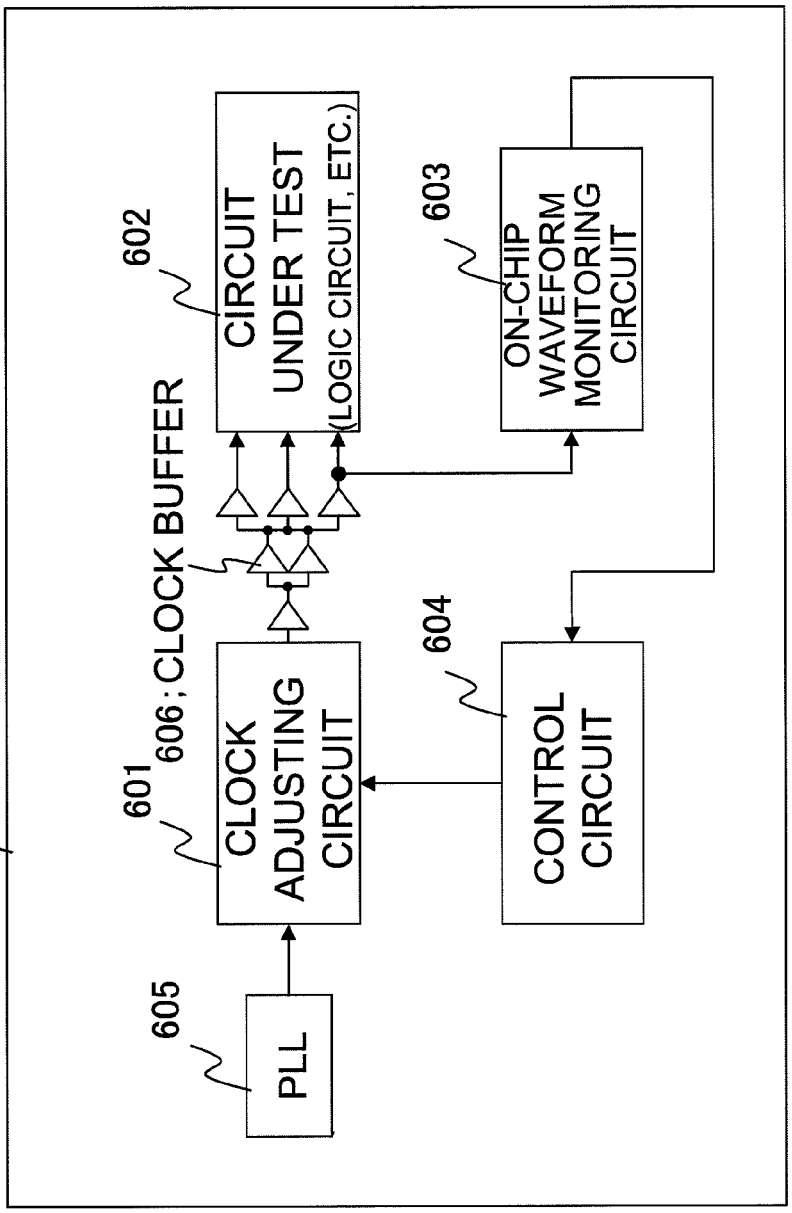

CLOCK ADJUSTING CIRCUIT AND SEMICONDUCTOR INTEGRATED CIRCUIT DEVICE

CROSS-REFERENCE TO RELATED APPLICATIONS

This application is based upon and claims the benefit of the priority of Japanese patent applications No. 2006-247980 filed on Sep. 13, 2006 and No. 2007-021159 filed on Jan. 31, 2007, the disclosures of which are incorporated herein in their entirety by reference thereto.

TECHNICAL FIELD

The present invention relates to technology for improving reliability of semiconductor integrated circuits, and circuits for realization thereof; and, in particular, relates to operation margin test technology for the semiconductor integrated circuits and to clock signal generation technology for realizing the test.

BACKGROUND ART

Device screening test and operation margin test of conventional semiconductor integrated circuits are performed by an LSI tester. With the increasing scale of LSI and increasing complexity of functions, there is often a case wherein it is not possible to detect a fault or fail only by testing a critical path of logic delay. An LSI that has passed the test causes an operational fault on an actual product on which the LSI is mounted.

Consequently, in order to prevent a failure in detection of a fault or fail, a technique is used in which the LSI is mounted on a printed circuit board of an actual device, or a test printed circuit board simulating an actual device, and an overall system is operated to perform a test.

In a test of an LSI, in general, the test is performed under more severe conditions that actual operational conditions, and an LSI having an operation margin to some extent is selected and shipped. However, as described above, when a test of an LSI is performed under the condition that the LSI is mounted on the printed circuit board, it is not possible to test the margin while adjusting operational frequency of the LSI. For example, in general, in case an operational test is performed with the overall system, it is necessary to operate an interface of a LAN (Local Area Network), a USB (Universal Serial Bus), a HDD (Hard Disk Drive), a video signal or the like.

With respect to this type of interface, since the operational frequency, allowable duty ratio, and the like, are not prescribed by a specification, it is not possible to change the frequency of a system reference clock, in order to perform an operation by the overall system.

A reference clock supplied from outside an LSI to the LSI is generally supplied from a crystal oscillator. The oscillation frequency of this crystal oscillator is determined at the time of manufacture, and it is not possible to perform adjustment thereafter.

Since a clock signal inside an LSI, in general, is generated by a Phase Locked Loop (referred to as PLL), it is not possible to adjust duty ratio or the like of the clock signal inside the LSI from outside the LSI.

Thus, with regard to an LSI mounted on a printed circuit board, it is not possible to adjust a clock signal from the outside.

Consequently, in order to perform the operation margin test on the semiconductor integrated circuit, it is necessary to mount a circuit for adjusting period, duty ratio, delay, and the like, of the clock signal inside the LSI.

With a conventional LSI tester, when performing a test of the semiconductor integrated circuit, it is possible to adjust operational frequency inside the semiconductor integrated circuit by adjusting the clock frequency which the LSI tester applies to the semiconductor integrated circuit. In this way, it is possible to test the operation margin of the semiconductor integrated circuit.

However, in general, the semiconductor integrated circuit has the Phase Locked Loop (PLL) internally, and a clock signal inside the semiconductor integrated circuit uses a clock output by this PLL. As a result, adjusting duty ratio, phase offset, or the like, of a clock inside the semiconductor integrated circuit from outside is not possible as long as a dedicated circuit for adjusting these is not provided.

From these types of problems, there has been proposed a technique of mounting a circuit for adjusting the period of the clock signal inside the semiconductor integrated circuit, and performing the operation margin test (Patent Document 1: U.S. Pat. No. 6,127,858, and Patent Document 2 (U.S. Pat. No. 6,891,421 (B2)).

With this circuit being mounted, it is possible to adjust a clock period and a duty ratio inside a semiconductor integrated circuit mounted in an actual device.

Conventional examples of a circuit that can control delay of a clock signal in a semiconductor integrated circuit, by a clock adjusting circuit mounted in the semiconductor integrated circuit, include Patent Document 3 (U.S. Pat. No. 5,945,862) and Patent Document 4 (U.S. Pat. No. 6,125,157).

These circuits are able to shift, without limitation, a clock phase. Using this characteristic, a DLL (Delay Locked Loop) function that makes either a rising edge or a falling edge of an output clock coincide with timing of a reference clock edge, is realized.

In performing a test of timing margin or the like, by a semiconductor integrated circuit mounted on a printed circuit board, it is necessary to mount a circuit for adjusting the period, the duty ratio, or the like, of a clock signal, on the semiconductor integrated circuit.

In Patent Document 1 (U.S. Pat. No. 6,127,858), and Patent Document 2 (U.S. Pat. No. 6,891,421(B2)) that disclose a circuit for adjusting the period or the like of the clock signal, inside a semiconductor integrated circuit, as described above, a circuit as shown in FIG. 1 is proposed. This circuit can adjust the clock period, the clock duty ratio, or the like, by dynamically switching delays of clock signals. In an example of FIG. 1, a coarse delay adjustment is performed by delay elements and a selector, and a detailed delay adjustment is performed by a variable delay circuit. The variable delay circuit is realized by a switch which changes over driving capability of a transistor. For example, when the selector is switched so that the delay is shortened, since a next clock phase is made fast with respect to a previous clock, the clock period becomes shorter, only for one clock cycle in which switching of delay is performed. Conversely, when switching is performed so that the delay is increased, a next clock phase is delayed, and the clock period of this instant is elongated. Though this system can with ease perform expansion and shortening of the clock period, the number of clock cycles in which the clock period can be expanded and shortened is limited by the number of stages of delay element. Since the delay amount of one delay element stage fluctuates due to variations, a user cannot accurately know how much the clock period fluctuates, by one-stage switching of the delay.

Meanwhile, in order to detect a fault and fail of the semiconductor integrated circuit, a clock adjusting circuit 23 is preferably built-in inside a semiconductor integrated circuit, as shown in FIG. 2, and with respect to a clock signal of an arbitrary number of cycles, jitter, duty ratio, skew, delay or the like, and period (frequency)

can be adjusted.

In order to adjust the period (frequency), the duty ratio, the jitter, the delay and the like, of a clock signal (clock pulse) of an arbitrary number of cycles, a function is necessary by which the phase of the clock signal can be shifted without limitation.

In order to realize this, for example, a circuit may be configured in which an arbitrary phase, in which one clock period is divided by N, can be output. In FIG. 2, output of the clock adjusting circuit 23 is supplied as a clock of a logic circuit, an I/O circuit, a memory circuit or the like, via a clock distribution circuit (clock tree buffer) 24. The output clock of the clock distribution circuit 24 is selected via the selector 22, and is received by the PLL 21.

As shown in FIG. 3A, a system is considered, in which a clock edge can be generated at arbitrary timing, wherein one period of a clock is divided by N. If the clock phase is gradually delayed, in due course it is delayed by one period from the original phase. Since a state of a delay of one period is equal to that of the original phase, in order to further delay the phase, a similar operation may be repeated.

Considering this point in FIG. 3B, delaying of the clock phase is a phase rotation on a circle, and this in due course performs one rotation and returns to the original phase.

If it is desired to further delay the phase, the same operation may be performed. Similarly, in case in which the phase is made quick conversely, the circle rotates in a reverse circuit and in due course the clock phase performs one rotation.

In this way, if a circuit is provided in which a clock period (360 degree) is divided approximately equally by N, and a clock of arbitrary phase is extracted from among these N phases, it is possible to delay or to speed up the phase without limitation.

FIGS. 4A and 4B are diagrams showing one example of a configuration of a phase shifter in which one clock period is divided by N, and an arbitrary phase clock thereof is produced.

In an L phase clock generation circuit 44, an L phase clock (L is an integer) is generated. The L phase clock generation circuit 44 has L output terminals, and clock phases output from the L output terminals are each shifted by 360/L degrees. A phase shifter 40 includes selectors 41 and 42 which receive L phase clock signals from the L output terminals from the L phase clock generation circuit 44, and a phase compensation circuit 43. Phase control signals are supplied to the selectors 41 and 42 and the phase compensation circuit 43.

The selectors 41 and 42 select two clock signals from the L clock signals. In the selectors 41 and 42, a phase of a clock signal output from clock output is coarsely determined. The two signals selected by the selectors 41 and 42 have neighboring phases, a phase difference of which is 360/L degrees.

The two clock signals selected by the selectors 41 and 42 are received by the phase compensation circuit 43. The phase compensation circuit 43 receives two clock signals whose phase is shifted, compensates the phases of the two clock signals in M stages, and outputs an intermediate phase.

If the phases of the two received clock signals are of x degrees and y degrees, with respect to an output clock, it is possible to output an arbitrary phase between x and y, at intervals of every (x−y)/M degrees. In this way, by dividing more finely the clock phase selected by the selector, the phase of the clock output is adjusted.

For example, in case of L=8, and M=16, clock signals at intervals of every 45 degrees are produced by the L phase clock generation circuit, and the phase compensation circuit can adjust the phase of the clock signal at intervals of every 45/16=2.8125 degrees, and can output a clock signal of any one in phases obtained by dividing one period clock signal into (L×M=) 128 stages.

Under this condition, in generating a clock of 25 degrees, for example, clocks of 45 degrees and 90 degrees are selected by a selector circuit.

The phase compensation circuit 43 can produce a clock with a phase difference of 4-stage (2.8125×4=11.25) from 45 degrees by compensating the 45 degree clock and the 90 degree clock at a ratio of 12:4.

FIG. 5 is a diagram showing another configuration example of a phase shifter. In this example, all L phase clock signals from an L phase clock generation circuit 53 are phase-shifted using L phase compensation circuits 51, and L phase clock signals are generated and then, an arbitrary phase is generated by selecting one among these, by a selector 52.

Similar to a case of FIG. 4B, a case is considered in which the L phase clock generation circuit outputs an 8-phase clock, and the phase compensation circuit compensates the phase in 16 stages (M=16).

Here, in generating a 56.25 degree clock, each phase compensation circuit compensates two received clock signals at a ratio of 12:4.

As a result, 11.25 degrees, 56.25 degrees, 101.25 degrees, 146.25 degrees, 191.25 degrees, 236.25 degrees, 281.25 degrees, and 326.25 degrees are output from the respective phase compensation circuits 51, of which there are 8. If 56.25 degrees, which is the second phase, is selected from among these by the selector and output, it is possible to output a desired phase clock.

FIG. 6 is an example in which a multi-phase clock generation circuit used in the phase shifters 40 and 50 of FIGS. 4A, 4B and FIG. 5 is configured by the phase locked loop (PLL). The phase locked loop (PLL) includes a phase comparator 61 which compares a reference clock and a phase of an output clock of an oscillator 64, a charge pump 62 which generates a voltage corresponding to a comparison result of the phase comparator 61, and a loop filter 63 which smoothes an output of the charge pump 62; the oscillator (VCO) 64, which receives an output voltage of the loop filter 63 as a control voltage, outputs a clock of an oscillation frequency corresponding to the control voltage. The oscillator (VCO) 64 includes a first stage inverter 65 and multi-stage delay circuits (non-inverting buffer) 66 (inverter 2-stage configuration) which compose a ring oscillator in which output of a final stage is fed-back as input to the first stage. By using a circuit that can generate equally spaced delays, and extracting clock signals with equally spaced delays, in the oscillator 64, a multi-phase clock can be obtained.

FIG. 7 is an example in which a multi-phase clock generation circuit is configured by a delay locked loop (DLL). The phase locked loop (PLL) includes a phase comparator 71 which compares phases of a reference clock and an output clock of a delay circuit sequence, a charge pump 72 which generates a voltage corresponding to a comparison result of the phase comparator 71, and a loop filter 73 which smoothes output of the charge pump 72; the delay circuit sequence, which receives an output voltage of the loop filter 73 as a control voltage, makes delay time variable. By using a circuit 74 that can generate equally spaced delays, and extracting clock signals with equally spaced delays, in the delay circuit sequence in the delay locked loop, a multi-phase clock can be obtained.

FIG. 8A is an example in which the multi-phase clock generation circuit is configured by a clock divider. A D-type flip-flop 811 receives at a data input terminal D thereof a signal obtained by inverting an output of a D-type flip-flop 814 by an inverter 83, and outputs an output signal of a data output terminal Q and an inverted signal thereof, as Q0, and /Q0. By configuring a state machine circuit of a type in which an internal state goes around once in an arbitrary cycle, it is possible to obtain a multi-phase clock signal. FIG. 8B shows a timing chart of an operation example thereof. In case an L-phase clock is generated by this circuit, in general, the frequency of an output clock is 1/L of the frequency of an input clock.

FIG. 9A is an example in which the multi-phase clock generation circuit is configured of delay elements and phase compensation circuits (PI). The phase compensation circuits 93 and 94 are circuits which output a signal with a phase that is intermediate between two input signals. The phase compensation circuit (PI) 93 receives an input clock A and a signal B delayed by a three-stage delay circuit (non-inverting buffer) 91, and outputs a signal with a phase intermediate therebetween, differentially. The phase compensation circuit (PI) 94 receives a signal B delayed by the three-stage delay circuit (non-inverting buffer) 91 and a signal /A obtained by inverting the input clock A by an inverter 92, and outputs a signal with a phase intermediate therebetween, differentially. FIG. 9B shows a timing chart of operation of this circuit. A phase that is intermediate between the input clock A and a clock B, which is the input clock A delayed, is C.

If phase difference between A and B is x, the phase of a clock signal output from C has a delay of x/2 compared with the phase of A.

With respect to a clock signal output from D, a phase intermediate between an inverted signal of A (a signal with a delay of 180 degrees from A) and B is output. That is, the phase is x/2+90 degrees delayed, with respect to the phase of clock A. As a result, it is possible to obtain two clocks C and D that have a phase difference of 90 degrees. Combining these inverted signals together, a 4-phase clock every 90 degrees is obtained.

FIGS. 10A and 10B are diagrams showing a configuration example of a phase compensation circuit used in the phase shifters of FIGS. 4A, 4B and FIG. 5. Referring to FIGS. 10A and 10B, there are provided NMOS transistors 101 and 102 having sources coupled together, gates supplied with the inverted signal /A of a clock signal A, and the clock signal A, and drains connected to differential terminals Q and /Q and connected to a power supply via a resistor, respectively; and NMOS transistors 103 and 104 having sources coupled together, gates supplied with the clock B and an inverted signal /B thereof, and drains connected to the drains of the NMOS transistors 101 and 102, connected to the differential terminals Q and /Q, respectively, and connected to a power supply via a resistor. The coupled sources of the NMOS transistors 101 and 102 are connected to a plurality of constant current sources 106 via a plurality of switch transistors 105 that are ON-OFF controlled by control signals C1; and the coupled sources of the NMOS transistors 103 and 104 are connected to a plurality of constant current sources 108 via a plurality of switch transistors 107 that are ON-OFF controlled by control signals C2. The number of switch transistors 106 and 107 that are turned ON is determined by the control signals C1 and C2, a current value that drives the differential pair 101 and 102 and the differential pair 103 and 104 is controlled, and a compensation ratio (internal division ratio) of the signals A and B is determined. That is, this circuit can compensate and output two phases of the two clock inputs (A and B). Internally, the circuit is configured such that two signals are added (current summing), and voltage is output via a load resistor. A switch elements and control terminals (C1 and C2) that control the switch elements are provided, in order that weightings of the two signals can be changed in current summing. If currents I1 and I2 that flow in the two differential pairs are adjusted by C1 and C2, a balance between a current flowing in the differential pair that receives signal A and a current flowing in the differential pair B can be adjusted. The weightings in the adding two signals is changed by this balance so that it become possible to output a phase close to A, or conversely, to output a phase close to B.

FIG. 11 is a diagram showing an operation principle of the phase compensation circuit. The clock signal A $(=\cos(\omega t))$ and the clock signal B $(=\cos(\omega t-\phi))$, being two clock signals whose phases are shifted, are received and these are added together. Assuming that the two signals are cosine waves, when two signals being added with the same weighting, an addition result Q $(=\cos(\omega t)+\cos(\omega t-\phi))$ outputs a phase $(=\omega t-\phi/2)$ that is intermediate between A and B.

FIGS. 12A to 12C are diagrams showing another configuration example of the phase compensation circuit. As shown in FIG. 12A, as a buffer circuit connected to two clock inputs A and B, a 3-state type is used or a transmission gate is disposed at output, and a plurality of buffers (tri-state buffers) 120 in which output can be set at a high impedance, are provided. A buffer in FIG. 12B has a configuration in which there are provided transmission gates (CMOS transfer gates) 123 and 124 at output of CMOS inverters (121 and 122); a buffer in FIG. 12C has a configuration in which there are provided a PMOS transistor 125 between a power supply and a source of a PMOS transistor 126 forming a CMOS inverter, and an NMOS transistor 128 between ground and a source of an NMOS transistor 127 forming a CMOS inverter, and complementary control signals /C and C are received by gates of the PMOS transistor 125 and the NMOS transistor 128. By controlling, among these plural buffers 120, the number of those that have outputs kept at a high impedance, and those that operate as a normal buffer, by the control signals C1 and C2, proportions in which the two clock signals are mixed, are adjusted. In this way, the two clock phases given by A and B are compensated and output from Q.

FIG. 13 is a diagram (refer to Patent Document 3) showing one example of a configuration of a delay adjustment circuit that uses a phase shifter. Referring to FIG. 13, the delay adjustment circuit 130 includes the phase shifter 131, a counter 132, and a phase comparator 133.

The counter 132 receives output of the phase comparator 133, counts an input clock, and outputs a count value as a control signal to the phase shifter 131. Phases of a reference clock and an output clock are compared by the phase comparator 133, and responsive to a comparison result thereof, the phase of the output clock is advanced or delayed, and a delay between the input clock and the output clock is adjusted to a desired value. The delay adjustment circuit that uses this type of configuration is referred to in Patent Documents 3 and 4 (U.S. Pat. No. 5,945,862, U.S. Pat. No. 6,125,157).

FIG. 14 shows an example of a timing chart in case a circuit of FIG. 13 is used to operate a phase shifter. FIG. 14 shows respective timing waveforms of an input clock, a control signal, and an output clock. If a phase shift is performed by this circuit, a phase of a clock signal becomes unstable at an instant at which a value of the control signal changes and the phase shifter switches a clock phase. This results in generating jitter that is not intended by a user. In case the control signal is operated with a period the same as a clock period, since only a phase of an edge on one side of the clock signal can be shifted, it is not possible to adjust duty.

In the circuit configuration of FIG. 13, in general, since the control signal of the phase shifter 131 can only adjust a clock phase output by the phase shifter 131 one stage at a time, it is not possible to rapidly expand or shorten the clock period.

In order to expand or shorten the clock period over a plurality of cycles, it is necessary to also increase or reduce the period of the reference clock. That is, the circuit with the configuration of FIG. 13 does not have a function for expanding or shortening the clock period autonomously.

[Patent Document 1]
U.S. Pat. No. 6,127,858
[Patent Document 2]
U.S. Pat. No. 6,891,421(B2)
[Patent Document 3]
U.S. Pat. No. 5,945,862
[Patent Document 4]
U.S. Pat. No. 6,125,157

DISCLOSURE OF THE INVENTION

Problems to be Solved by the Invention

The entire disclosures of Patent Documents 1 to 4 are incorporated herein by reference thereto.

The following analysis has been given according to the present invention.

Also heretofore, a clock adjusting circuit mounted inside an LSI has been proposed in Patent Document 1 (U.S. Pat. No. 6,127,858), Patent Document 2 (U.S. Pat. No. 6,891,421 (B2)), and the like.

However, in these circuits there are problems in that:

(1) the number of clock cycles in which it is possible to adjust a clock period is limited, and (2) due to variability, adjustment ranges of the clock period and duty change, and it is difficult to comprehend an absolute value of a test result.

In these approaches, as shown in FIG. 1, by dynamically switching the number of stages of delay elements 11 inserted into a clock distribution system, by a selector 12, adjustment of the clock period and the like is performed. For example, by switching such that the number of delay stages a clock signal passes becomes shorter, in the selector 12, a phase of a clock that is output is advanced, and it is possible to shorten the clock period at that instant. Conversely, by switching such that the number of delay stages becomes longer, by the selector 12, since the clock phase is delayed, it is possible to lengthen the clock period at that instant. For example, in case the number of delay element 11 stages is 8, by switching so that the number of delay element 11 stages is shortened by one stage at a time, or switching to realize lengthening, with a clock of 8 consecutive cycles, it is possible to shorten or to lengthen the consecutive 8 cycle clock period.

However, since the number of delay element 11 stages is limited, the number of clock cycles in which consecutive clock periods can be shortened or lengthened is limited. By increasing the number of delay element 11 stages, it is possible to increase the number of clock cycles in which consecutive clock periods can be shortened or lengthened.

However, by inserting many delay elements in the clock distribution system, clock signal jitter becomes large. Furthermore, there is a problem in that delay inside a loop of the phase locked loop (PLL), which is generally used in clock generation, becomes large, and feedback loop stability deteriorates. As a result, the number of delay element stages cannot be made so large.

This approach is one in which an at-speed test is realized inside an LSI, and is effective in case 1 to 2 cycle clocks are given with respect to a logic delay critical path and a marginal test is performed.

However, this approach is one in which the test is performed with respect to a critical path assumed in advance by a designer, and as described above, in complex LSI of recent years there is a possibility that unexpected faults or fails may occur, and that these cannot be detected.

Consequently, in order to prevent a detection failure, a circuit is desired in which it is possible to adjust a clock frequency, duty, and the like, for a clock signal of an arbitrary number of cycles.

Furthermore, semiconductor integrated circuits of recent years increasingly have plural clock domains. With decreasing timing margin due to speeding up of operation frequency and increasing skew due to enlarging scale, a case can be considered in which an operation failure occur in communication between these different clock domains.

Testing as to whether sufficient timing margin is ensured in communication between these clock domains has become important.

However, this type of test is not suitable for the conventional clock adjusting circuits disclosed in Patent Documents 1, 2, and the like, because delay adjustment range is limited to a relatively narrow range.

In a test between the clock domains, input/output circuits, or the like, a circuit is desirable in which a clock phase is arbitrarily changed to any phase in a range larger than one clock period.

Furthermore, in a conventional technique in which the number of delay element stages or drive power is switched, there is a problem in that, since delay amount of the delay elements changes due to variability and the like, it is difficult to read an absolute value of the delay amount from the number of delay stages.

Furthermore, in the clock adjusting circuit of this conventional method, in case timing of both a rising edge and a falling edge of the clock signals is controlled, a control circuit that controls the number of delay element stages must output control signals twice in one clock period. Particularly in a clock adjusting circuit that handles high clock frequency, there is a problem in that generating the control signals twice in one clock period in this way is difficult.

Meanwhile, there is a proposal also of a clock adjusting circuit in which it is possible to shift a clock phase without limitation (refer to Patent Documents 3, 4, and the like).

In these conventional examples, a phase shifter circuit is realized in which it is possible to select and output an arbitrary phase from among phases obtained by dividing one clock period by N. When a phase of a clock signal to be output is advanced or delayed N stages by this phase shifter, the clock phase rotates once and returns to the original phase. As a result, it is possible to advance or delay the phase without limitation. This phase shifter circuit generates a multi-phase clock signal, internally, and by compensating two phases selected from among these, by a phase compensation circuit, generates a clock signal of an arbitrary phase.

The clock adjusting circuits disclosed in Patent Documents 3, 4, and the like, as shown in FIG. 13, are configured to include a phase shifter 131, a counter 132, and a phase comparator 133, and a control signal of the phase shifter 131 is adjusted so that phases of a reference clock and an output clock match. However, these circuits only have a Delay Locked Loop function which adjusts clock delay, based on information of the reference clock. Since it is not possible to adjust a clock period, duty ratio, jitter, and the like, there is a problem in that usage is not possible in operation margin tests of the semiconductor integrated circuit.

Furthermore, as shown in FIG. 14, when the clock phase is shifted, timing at which a clock signal state is not determined, occurs.

At this timing, there is a case in which the clock signal becomes unstable, and jitter occurs. As a result, there is a problem in that disturbance not intended by a user enters the clock signal so that the operation margin test cannot be performed correctly.

SUMMARY

Therefore, it is a principal object of the present invention to provide a circuit that solves the abovementioned problems and can detect a fail or fault in a semiconductor integrated circuit with respect to a clock operation margin, and a semiconductor integrated circuit device provided with the circuit.

The invention disclosed in the present application is generally configured as below, in order to solve one or more of the abovementioned problems.

A semiconductor integrated circuit device in accordance with a first aspect of the present invention includes
a means that receives a clock signal and generates a clock signal in which a timing phase of both edges or one edge of a clock pulse is changed, based on a control signal; a means that generates the control signal; and a clock adjusting circuit in which the timing phase of an edge of the clock pulse can be changed by a clock period base, and which supplies a clock signal, for which at least one parameter out of a clock period, duty ratio, jitter, and skew between clock domains is variably adjusted, to a clock supply destination inside a semiconductor integrated circuit; wherein a timing operation margin can be evaluated.

In the present invention, evaluation of the timing operation margin may be preformed by a self test, and in case the operation margin does not satisfy a predetermined specified value, a warning is output or control to stop operation is performed.

A clock adjusting circuit according to the present invention includes a phase shifter circuit which receives a clock signal and variably shifts and outputs a timing phase of both or one of a rising edge and a falling edge of a clock pulse, based on a control signal; and a control circuit which supplies the control signal at timing before an edge of the clock signal output from the phase shifter circuit, to the phase shifter circuit; and a clock signal, for which at least one parameter out of a clock period, duty ratio, jitter and skew, is changed with clock cycle units, can be output.

In a clock adjusting circuit according to the present invention, the phase shifter circuit includes a first and a second phase shifter which receive an input clock signal in common; and a selector which receives output of the first and second phase shifters, and selectively outputs one thereof based on a selection control signal. The control circuit supplies a first and a second control signal to the first and second phase shifters; the first and second phase shifters variably shift each of a rising edge of the clock signal and a falling edge of the clock signal; and, from the selector, output of the first phase shifter is selected as a rising edge of the clock signal, and output of the second phase shifter is selected as a falling edge of the clock signal.

In the clock adjusting circuit according to the present invention, a signal generated from an output signal of the selector is used in the selection control signal.

The clock adjusting circuit according to the present invention may be configured such that the phase shifter circuit includes a plurality of circuit units, each including a pair of phase shifters which receive the input clock in common, and a selector which receives output of the pair of phase shifters and selectively outputs one thereof based on a selection control signal, the control circuit supplying control signals to each phase shifter of each of the plurality of circuit units.

The clock adjusting circuit according to the present invention includes at least a first and a second circuit unit, as the circuit units. A selector of the first circuit unit receives output of a selector of the second circuit unit, as a selection control signal. A selector of the second circuit unit receives output of the selector of the first circuit unit, as a selection control signal.

The clock adjusting circuit according to the present invention may be configured such that the phase shifter circuit includes: a first selector which receives a multi-phase clock signal, and which selects and outputs a clock signal of one phase; a second selector which receives the multi-phase clock signal, and which selects and outputs a clock signal of a different phase from the clock signal of one phase; a phase compensation circuit which receives the clock signals selected by the first and second selectors, and which generates a clock signal obtained by compensating phase difference of the received two clock signals, based on a control signal; and a logic circuit which generates a control signal supplied by the phase compensation circuit and a signal which controls selection of the first and second selectors, based on a control signal from the control circuit.

The clock adjusting circuit according to the present invention may be configured such that the control circuit includes: an adder which has as input, control code specifying a clock period; and a register which holds output of the adder; and output of the register is received by the adder, and also is supplied to the phase shifter circuit.

The clock adjusting circuit according to the present invention may be configured such that the control circuit includes: a first adder which has as input, control code specifying a clock period; and a register which holds output of the first adder. Output of the register is received by the first adder. The configuration may be further provided with a second adder which adds ½ of the control code and output of the register; and output of the register is supplied to the first phase shifter circuit, and output of the second adder is supplied to the second phase shifter circuit.

The clock adjusting circuit according to the present invention may be configured such that the control circuit includes: a first adder which has as input, control code specifying a clock period; and a register which holds output of the first adder. An output of the register is received by the first adder. The clock adjusting circuit may be provided with a second adder which adds ½ of the control code and output of the register. Output of the register and output of the second adder are supplied to one pair of phase shifter circuits of the first circuit unit. The clock adjusting circuit may be further provided with a third adder which adds ¼ of the control code and output of the register; and a fourth adder which adds ½ of the control code specifying the clock period and output of the third adder. Outputs of the third and fourth adders are supplied to one pair of phase shifter circuits of the second circuit unit.

The clock adjusting circuit according to the present invention may be configured to be provided with a pair of adders which add control code for any one of a clock phase, skew, and duty, to output of the register and output of the second adder; and a pair of adders which add control code for any one of clock phase, skew, and duty, to output of the third and fourth adders.

The clock adjusting circuit according to the present invention may be configured such that the control circuit includes a counter which counts a clock signal; a decoder which receives a count value of the counter and which generates an address signal; and a memory which reads data of an address signal output from the decoder, to be output as the control signal.

The clock adjusting circuit according to the present invention may be configured such that the control circuit includes a shift register which receives a clock signal, performs a shift operation, and outputs a shift result as the control signal.

The clock adjusting circuit according to the present invention may be configured such that an output clock of the phase shifter circuit is used as a clock signal of the control circuit.

The semiconductor integrated circuit device according to the present invention includes: the clock adjusting circuit; a circuit which receives via a buffer an output clock of the clock adjusting circuit; and a phase comparator which compares a phase of a reference clock and a clock signal received by the circuit which receives via a buffer an output clock of the clock adjusting circuit; to supply a comparison result to the control circuit.

The semiconductor integrated circuit device according to the present invention includes a PLL (phase locked loop) circuit; the clock adjusting circuit; a buffer circuit which distributes clock signals; and a phase comparator which compares phases of a clock signal supplied to a circuit which receives a clock from the buffer circuit, and an input clock signal of the PLL circuit; to supply a comparison result to the control circuit.

The semiconductor integrated circuit device according to the present invention executes at least one among: changing a clock period of an arbitrary cycle; changing a jitter amplitude, and/or jitter frequency of a clock signal of an arbitrary cycle; changing a frequency, and/or a duty ratio of a clock signal of an arbitrary cycle; delaying or advancing a phase of a clock of a clock domain that is to be tested, with respect to another clock domain or an external clock; and changing a phase of a clock signal of an arbitrary cycle, and/or a duty ratio of a clock signal; to decide whether or not there is an error.

The semiconductor integrated circuit according to another aspect of the present invention includes the clock adjusting circuit according to the present invention, a circuit that operates responsive to a clock signal supplied from the clock adjusting circuit, and an on-chip waveform monitoring circuit which monitors a waveform of a prescribed signal inside a semiconductor integrated circuit.

In the present invention, the on-chip waveform monitoring circuit monitors change in power supply voltage or ground voltage, or both, of a circuit that operates responsive to a clock signal supplied from the clock adjusting circuit.

In the present invention, the on-chip waveform monitoring circuit may be configured to monitor change in at least one of an input signal, an output signal, and an input-output signal of the circuit that operates responsive to a clock signal supplied from the clock adjusting circuit, and an internal signal of the circuit.

The present invention may be configured to have a replica circuit for predicting characteristic change of a circuit that operates responsive to a clock signal supplied from the clock adjusting circuit, and the on-chip waveform monitoring circuit may monitor change in at least one of an input signal, an output signal, and an input-output signal of the replica circuit, and an internal signal of the replica circuit.

The semiconductor integrated circuit in accordance of further aspect of the present invention, includes the clock adjusting circuit according to the present invention, a circuit that operates responsive to a clock signal supplied from the clock adjusting circuit, and an on-chip temperature measuring circuit which measures temperature inside a semiconductor integrated circuit.

The semiconductor integrated circuit in accordance of further aspect of the present invention, includes the clock adjusting circuit according to the present invention, a circuit that operates responsive to a clock signal supplied from the clock adjusting circuit, and a replica circuit for predicting characteristic change of a circuit that operates responsive to; a clock signal supplied from the clock adjusting circuit.

In the present invention, the control circuit generates the control signal based on a monitoring result by the on-chip waveform monitoring circuit, and variably controls a waveform of a clock signal output from the clock adjusting circuit.

In the present invention, the control circuit may be configured to generate the control signal based on a measurement result by the on-chip temperature measuring circuit, and to variably control a waveform of a clock signal output from the clock adjusting circuit.

In the present invention, the control circuit may be configured to generate the control signal based on an output signal of the replica circuit, and to variably control a waveform of a clock signal output from the clock adjusting circuit.

The present invention may be configured to have an error detection circuit for detecting a malfunction of a circuit that operates responsive to a clock signal supplied from the clock adjusting circuit.

The present invention may be configured to be provided with a clock generation circuit which generates a clock signal to supply the clock adjusting circuit, wherein the control circuit supplies a control signal to the clock generation circuit and variably controls a characteristic of the clock generation circuit. The clock generation circuit includes a phase lock looped circuit.

The present invention may be configured to be provided with a variable delay circuit which receives a clock signal output from the clock adjusting circuit, wherein a clock signal output from the variable delay circuit is supplied to a circuit that operates responsive to a clock signal supplied from the clock adjusting circuit, and the control circuit supplies a control signal to the variable delay circuit and variably controls a delay characteristic of the variable delay circuit.

The semiconductor integrated circuit in an even further aspect of the present invention includes a clock adjusting circuit which receives a control signal generated by a control circuit arranged inside a semiconductor integrated circuit device, and includes means for variably adjusting, with respect to the control signal supplied to at least one clock supply destination circuit inside a semiconductor integrated circuit device, at least one characteristic among a period, duty, jitter, and skew of the clock signal, on a clock cycle base; wherein the control circuit generates the control signal based on at least one of:

a waveform monitoring result of a prescribed power supply terminal inside a semiconductor integrated circuit device;

a waveform monitoring result of a prescribed ground terminal inside a semiconductor integrated circuit device;

a monitoring result of a signal waveform of the clock supply destination circuit;

a temperature measurement result inside a semiconductor integrated circuit device;

an output of a replica circuit arranged inside a semiconductor integrated circuit device for predicting a characteristic change in the clock supply destination circuit; and an error detection result related to output of the clock supply destination circuit.

The present invention is further provided with a clock generation circuit which generates a clock signal to supply the clock adjusting circuit, wherein control signals from the control circuit are respectively supplied, besides the clock adjusting circuit, to the clock generation circuit, and a characteristic of a clock signal supplied to the clock supply destination is variably controlled. Or, the invention is configured to be further provided with a variable delay circuit which receives a clock signal output from the clock adjusting circuit and supplies a clock to the clock supply destination circuit, wherein control signals from the control circuit are respectively supplied, besides the clock adjusting circuit, to the clock generation circuit and the variable delay circuit, and a characteristic of a clock supplied to the clock supply destination is variably controlled.

In yet a further aspect of the present invention, the semiconductor integrated circuit includes: a clock adjusting circuit which receives a control signal generated by a control circuit arranged inside a semiconductor integrated circuit device, and which includes means for variably adjusting, with respect to a clock signal supplied to at least one clock supply destination circuit inside a semiconductor integrated circuit device, in accordance with the control signal, at least one characteristic among a period, duty, jitter, and skew of the clock signal, on a clock cycle base; and
a waveform monitoring circuit which monitors waveform of a power supply voltage inside a semiconductor integrated circuit device; wherein the control circuit generates the control signal, based on a result of waveform monitoring of the power supply voltage, to control the clock adjusting circuit, and varies a phase difference of frequency change of a clock signal from the clock adjusting circuit, and change amount (amplitude of clock frequency change), with respect to change of the power supply voltage;

detects whether or not the clock supply destination circuit is operating correctly, with respect to each phase difference and clock frequency change amount, by an error detection circuit inside or outside the semiconductor integrated circuit device, and can obtain a relationship of a phase difference between power supply voltage change and clock frequency change, and operation margin, based on pass/fail information by the error detection circuit.

MERITORIOUS EFFECTS OF THE INVENTION

According to the present invention, a clock adjusting circuit for adjusting a period, a duty, skew, and the like of a clock signal is mounted in a semiconductor integrated circuit device; and in an LSI mounted in a circuit board of an actual device or a test circuit board simulating an actual device, by giving a disturbance to a parameter of the clock signal inside the LSI while operating the semiconductor integrated circuit device, and detecting an operation margin with regard to the disturbance, it is possible to select the LSI with high reliability and with a large margin. According to the present invention, it is possible to detect a fail or fault in the LSI under conditions more severe than in conventional LSI tests.

According to the present invention, it is possible to give a disturbance to a clock signal of a limitless or an arbitrary number of cycles that are consecutive. As a result, it is possible to further reduce false negatives of faults or fails, and an effect is obtained in which it is possible to select and ship a semiconductor integrated circuit device with higher reliability.

According to the present invention, since a phase obtained by dividing one clock period (360 degrees) by N is a change amount for one adjustment stage, is it easy to comprehend an absolute value of time and phase of the operation margin from a test result.

Furthermore, according to the present invention, it is possible to realize, for a clock, effects which are (1) phase of two edges can be dynamically controlled, (2) adjustment range of a clock phase changed in one cycle is large, and (3) jitter occurring when adjustment of a clock phase is performed, is small.

By having the clock adjusting circuit of the present invention built-in inside a semiconductor integrated circuit device, a self test of the operation margin is possible in an actual device after shipping. This is useful in preventing faults due to degradation over time.

The clock adjusting circuit of the present invention can adjust a period of a clock signal of a limitless number of cycles. As a result, usage is possible as a frequency synthesizer. In comparison to frequency synthesizers using PLL, reduction in circuit area and ease of design are realized.

According to the present invention, a circuit which generates a random number or a pseudo-random number in the control circuit is provided; it is possible to change the phase of a clock signal randomly, and it is possible to realize a function such as spread spectrum or the like.

Furthermore, according to the present invention, since the duty or skew of the clock signal can be adjusted, usage is also possible as a variation compensation circuit for duty or skew.

The clock adjusting circuit of the present invention can be applied to a modulation circuit such as a frequency modulation circuit, a phase modulation circuit, or the like, of a communication device, and effects are obtained in that various modulation systems can be realized in one circuit, the circuit area is reduced, and the like.

BRIEF DESCRIPTION OF THE DRAWINGS

FIGS. 12A to 12C are diagrams showing another example of the configuration of the phase compensation circuit.

FIG. 14 is a diagram describing an operation waveform of the circuit of FIG. 13.

FIGS. 42A and 42B are, respectively, a flow diagram showing a test procedure, and a descriptive diagram, of one exemplary embodiment of the present invention.

FIG. 46 is a diagram showing an example of a clock waveform in case clock skew is adjusted between different clock domains.

FIGS. 47A and 47B are, respectively, a flow diagram showing a test procedure, and a descriptive diagram, of one exemplary embodiment of the present invention.

FIGS. 55A and 55B are diagrams describing an operation margin test example of the exemplary embodiment of FIG. 54.

FIGS. 59A and 59B are diagrams describing an operation margin test example of the exemplary embodiment of FIG. 58, and FIG. 59B is a diagram showing one example of a relationship of a phase difference between a power supply change and clock frequency, and operation margin.

FIG. 60 is a diagram showing a configuration of another exemplary embodiment of the present invention.

PREFERRED MODES

Figure 1:
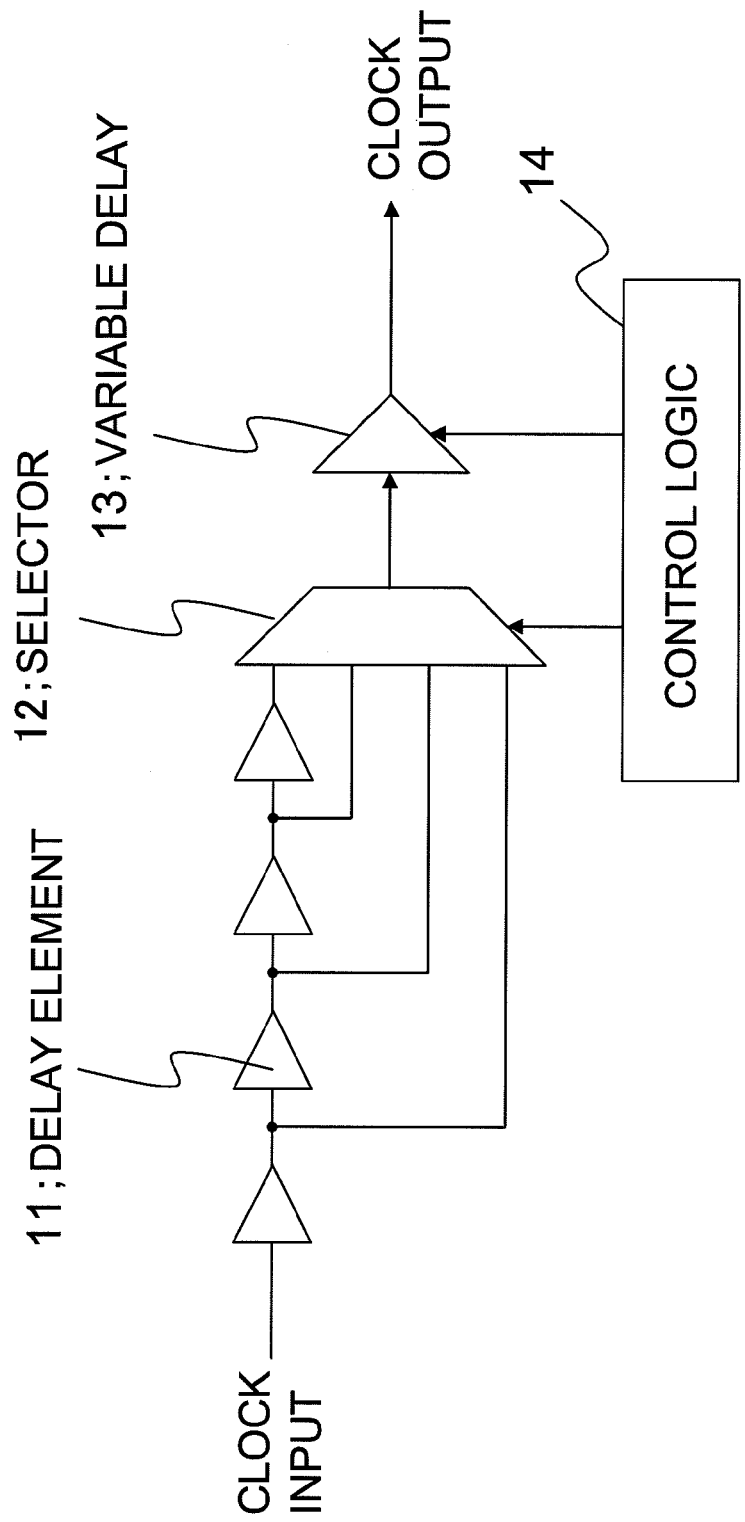
FIG. 1 is a diagram showing a configuration of a related art.
Figure 2:
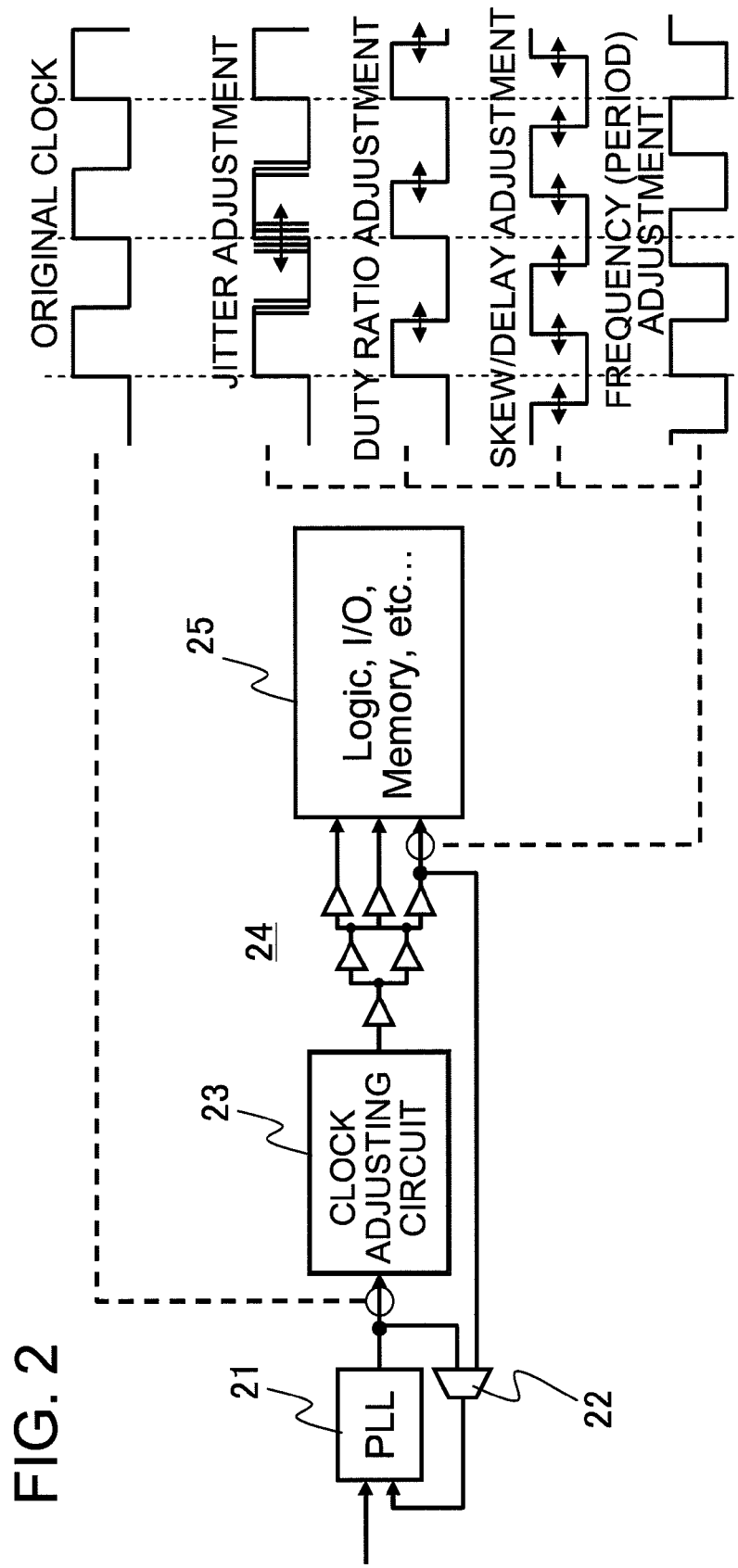
FIG. 2 is a diagram showing a system configuration in which a clock adjusting circuit of the present invention is applied.
Figure 3A:
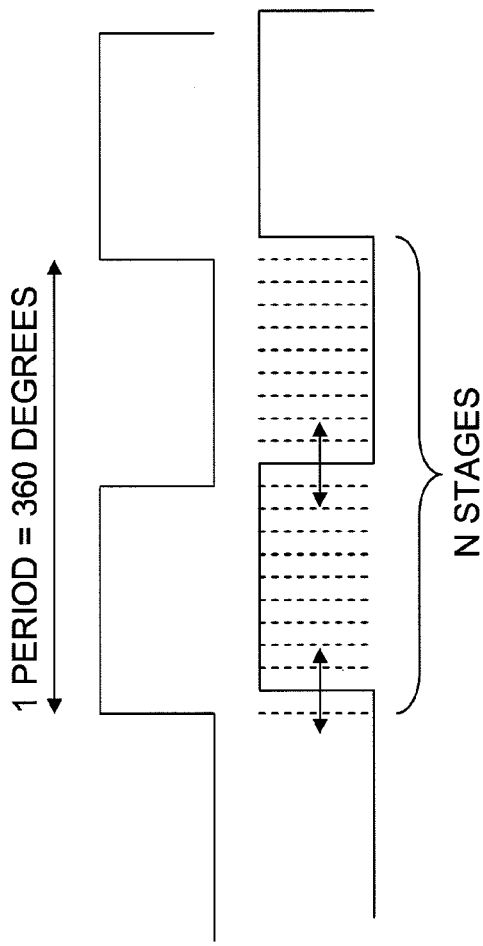
FIGS. 3A and 3B are diagrams describing FIG. 2.
Figure 3B:
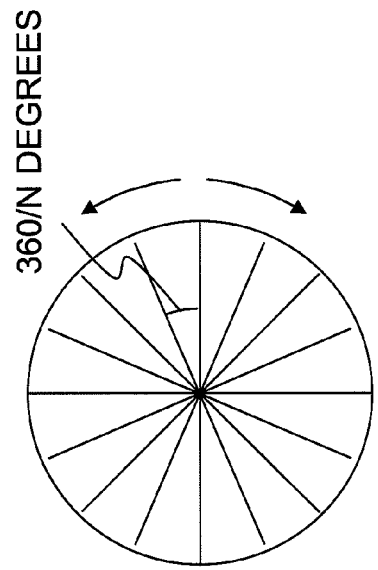

In the present invention, a semiconductor integrated circuit includes a circuit that can adjust a clock period, duty ratio, skew between clock domains, and the like, is built in a semiconductor integrated circuit. When the semiconductor integrated circuit is being tested, this circuit is used to perform an operation test while adjusting the clock period of a clock signal, duty, skew between the clock domains, and the like, inside a semiconductor integrated circuit, and to detect operation margin of each thereof. An LSI (Device Under Test) with little operation margin does not pass a selection test, and only semiconductor integrated circuits with a large margin are shipped.

Furthermore, using this adjustment circuit also after shipping of the semiconductor integrated circuit, a self test of the margin is performed with respect to the clock period, the duty, the skew, and the like, and in case the margin is less than a specified value, an operation of emitting a warning, or safely stopping operation, and the like, is performed.

As a configuration example of a circuit that can adjust the clock period, duty ratio, skew, and the like, a configuration is utilized in which a circuit (referred to as a phase shifter) that can generate a clock signal of arbitrary phase inside a semiconductor integrated circuit is provided, and by dynamically switching the clock phase that is output, it is possible to arbitrarily adjust the clock period inside a semiconductor integrated circuit. By providing a circuit that can output an arbitrary clock phase in which 360 degrees are divided by N, it is possible to limitlessly shift the clock phase. This circuit can be realized, for example, by combining a multi-phase clock generation circuit, a selector circuit, and a phase compensation circuit.

By using the phase shifter, it is possible to adjust the period or duty with respect to a clock of a limitless number of cycles or an arbitrary number of cycles. Since the clock phase can be adjusted at arbitrary timing, it is also possible to control the clock skew with respect to another clock domain. If this phase shifter circuit is used, since the phase of the clock is adjusted in units of 360/N degrees, a user can accurately comprehend a change amount of the clock phase.

A control circuit that controls the phase shifter performs control so that the phase of the clock signal has a value that is desired by the user. This control circuit has a function for control of a clock period, control of jitter amplitude and jitter frequency, control of duty ratio, and control of phase difference with other clocks such as a reference clock or the like, that are necessary for testing the semiconductor integrated circuit. This control can be implemented by using an accumulator circuit to perform addition or subtraction of the clock phase. By devising a configuration of this accumulator, a structure was invented that can adjust the clock period, while holding the duty of the clock signal at approximately 1:1. The clock period, the duty ratio, and delay at units of 10 ps or below can be adjusted.

In order to enable an arbitrary phase change pattern to be programmed by the user, a configuration may also be considered in which a vector table is formed using memory or a register circuit, so that a programmed control signal is sequentially output. By using this, it is possible to perform an operational test with respect to timing change of a specific clock defined by the user.

Furthermore, by having a random number generation circuit inside this control circuit, it is possible to have random jitter generated in the phase shifter. By usage thereof, an operation margin test with respect to random jitter is also made possible.

Normally, when the phase shifter circuit changes the clock phase, there is a case in which the phase shifter circuit generates jitter. This is because a constant delay time occurs from when a control signal for changing the clock phase is given until a phase of an output clock is switched to a desired phase. If an edge of an output clock appears during this delay time, timing of the clock edge becomes unstable, and jitter occurs. In particular, this phenomenon appears markedly in case the clock phase is largely shifted during one clock period.

In the test of the semiconductor integrated circuit as intended by the present invention, since it is desired to perform a margin test by largely changing a clock period or clock phase, an operation of largely shifting the clock phase during one clock cycle is often used.

However, in the test of the semiconductor integrated circuit, if jitter that is not intended by the user occurs, there is a possibility that the semiconductor integrated circuit will malfunction due to this jitter, and a correct margin test cannot be performed.

Consequently, a circuit configuration which inhibits jitter occurring when the clock phase is switched by the phase shifter circuit, is one aspect of the present invention.

The present invention has a configuration in which, by providing a plurality of phase shifters, each of the phase shifters adjusts a phase of only one of either of a rising edge and a falling edge of the clock signal. By using output of the plurality of phase shifters, while dynamically performing switching, it is possible to inhibit (avoid) an unstable signal, which appears temporarily when a phase shifter changes a clock phase, from being transmitted to a clock signal that operates a chip. In this way, it is possible to reduce jitter of the clock signal.

According to the configuration of the present invention in which a plurality of these phase shifters are used, from the fact that a control signal that controls the phase shifters may be generated at a frequency of one or fewer times in one clock cycle, the control circuit can be easily configured. As a result, according to the present invention, in particular, it is possible to configure a clock adjusting circuit that handles a high frequency.

In the configuration using the plurality of phase shifters, since a clock edge that one phase shifter must accurately output may be one of either of a rising edge or a falling edge, the control signal that controls the phase shifter may be generated at intervals of the rising edge or at intervals of the falling edge.

During a time (time period) in which an output signal of the phase shifter is not selected by the selector, since there is no effect on the output clock no matter what timing the clock phase is switched at, timing design of the control signal output by the control circuit is easy.

In a conventional clock adjusting circuit, it has been necessary to generate two signals, a control signal for a rising edge and a control signal for a falling edge, during one clock cycle.

As a result, from limitation of operating speed of the control circuit, there has been a problem in that operation at a high clock frequency has not been possible. This problem has been solved by the present invention.

The switching of the clock phase has had to be performed between a rising edge and a falling edge, and between a falling edge and a rising edge, and high accuracy has been necessary in control of timing of switching of the clock phase. The present invention solves these issues.

The present invention provides an approach of detecting a fail or fault of a LSI under more severe conditions than a conventional LSI test.

In order to realize this, the clock adjusting circuit for adjusting a period, duty, skew, and the like, of the clock signal is mounted in the LSI. In the LSI which is mounted on a circuit board of an actual device or on a test circuit board simulating an actual device, a disturbance is given to (1) period, (2) duty ratio, (3) skew, (4) jitter, and the like, of a clock signal inside the LSI while operating the LSI. By detecting the operation margin with respect to the disturbance of these parameters, an LSI with high reliability and with a larger margin is selected.

Different from the conventional clock adjusting circuit (for example, Patent Documents 1 and 2), according to the present invention it is possible to give a disturbance to (1) period, (2) duty ratio, (3) skew, (4) jitter, and the like, on a clock cycle base, with respect to a clock signal of a limitless or an arbitrary number of cycles that are consecutive.

From a characteristic of the present invention, failure in detection of a fault and fail can be further reduced, and it is possible to select and ship a semiconductor integrated circuit with a higher reliability.

In the conventional circuit configuration, since an inverter delay or the like is used in phase adjustment of a clock, there has been a problem in that a phase that changes in an adjustment of one stage is unknown.

According to the present invention, since a phase obtained by dividing one clock period (360 degrees) by N is a change amount for one adjustment stage, is it easy to comprehend an absolute value of time and phase of the operation margin from a test result.

Furthermore, different to clock phase adjustment methods used in conventional delay adjustment circuits, the present invention has an effect in that, with respect to a clock pulse,
(1) it is possible to dynamically control a phase of both edges,
(2) an adjustment range of a clock phase changed in one cycle is large, and
(3) jitter occurring when adjustment of a clock phase is performed is small By having the clock adjusting circuit of the present invention built-in inside a semiconductor integrated circuit device, a self test of the operation margin is possible in an actual device after shipping, and this is useful in preventing faults due to degradation over time.

From the fact that the clock adjusting circuit of the present invention can adjust a period of a clock signal of a limitless number of cycles, it can be used as a frequency synthesizer.

The clock adjusting circuit of the present invention has an effect in that, in addition to being able to reduce the circuit area in comparison to frequency synthesizers that use a PLL, design is easy. Furthermore, by adding a circuit that generates a random number or a pseudo-random number to the control circuit, it is possible to randomly change the clock signal phase, and it is possible to realize a function of spread spectrum and the like.

Since it is possible to adjust duty or skew of a clock signal, the clock adjusting circuit of the present invention can be used as a compensation circuit for variation of the duty or the skew.

In particular, together with miniaturization of semiconductor integrated circuits in recent years, there has been increased variations in signal quality and characteristic of the semiconductor integrated circuits, and the need for a compensation circuit for these has increased. Conventionally, a dedicated circuit has been mounted for compensating for variations in signal quality and characteristic of the semiconductor integrated circuits. Against this, by using the clock adjusting circuit according to the present invention, a test circuit and a frequency synthesizer can be both integrated, and realization of smaller area and lower power consumption is possible. Since control of these circuits is integrated, there is an advantage in that control thereof is facilitated.

Furthermore, since it is possible to switch the clock frequency or the clock phase instantly, the clock adjusting circuit of the present invention can be used as a modulation circuit, such as a frequency modulation circuit, a phase modulation circuit, or the like, of a communication device.

Since conventional modulation circuits are normally configured by analog circuits, there has been a demerit in that design is difficult, and also that passive element area is large.

In the clock adjusting circuit according to the present invention, since it is possible to perform modulation by a digital circuit, various types of effects are obtained, such as realizing ease of design, and in addition, realization of various modulation methods with one circuit is possible, and circuit area can be reduced. A description will be given according to the following exemplary embodiments.

Exemplary Embodiments

Figure 15A:
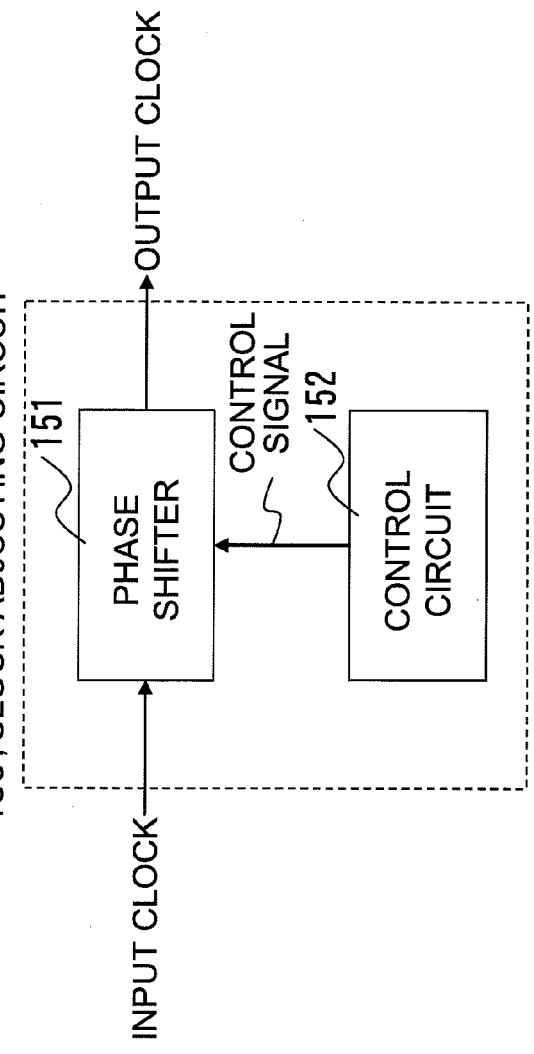
FIGS. 15A and 15B are diagrams showing a configuration of a clock adjusting circuit and an example of an operation waveform of one exemplary embodiment of the present invention.

FIG. 15A is a diagram showing a configuration of a clock adjusting circuit according to one exemplary embodiment of the present invention. The clock adjusting circuit 150 includes a phase shifter 151 and a control circuit 152. The phase shifter 151 is a circuit that adjusts a phase difference between an input clock and an output clock, and this phase difference is determined by a control signal given by the control circuit 152.

The phase difference between the input clock and the output clock is adjusted in N stages (N is an integer). A change amount of a clock phase in one adjustment stage is approximately 360/N degrees, and is a change amount T/N (where T is a clock period) of a delay of the clock.

Figure 4A:
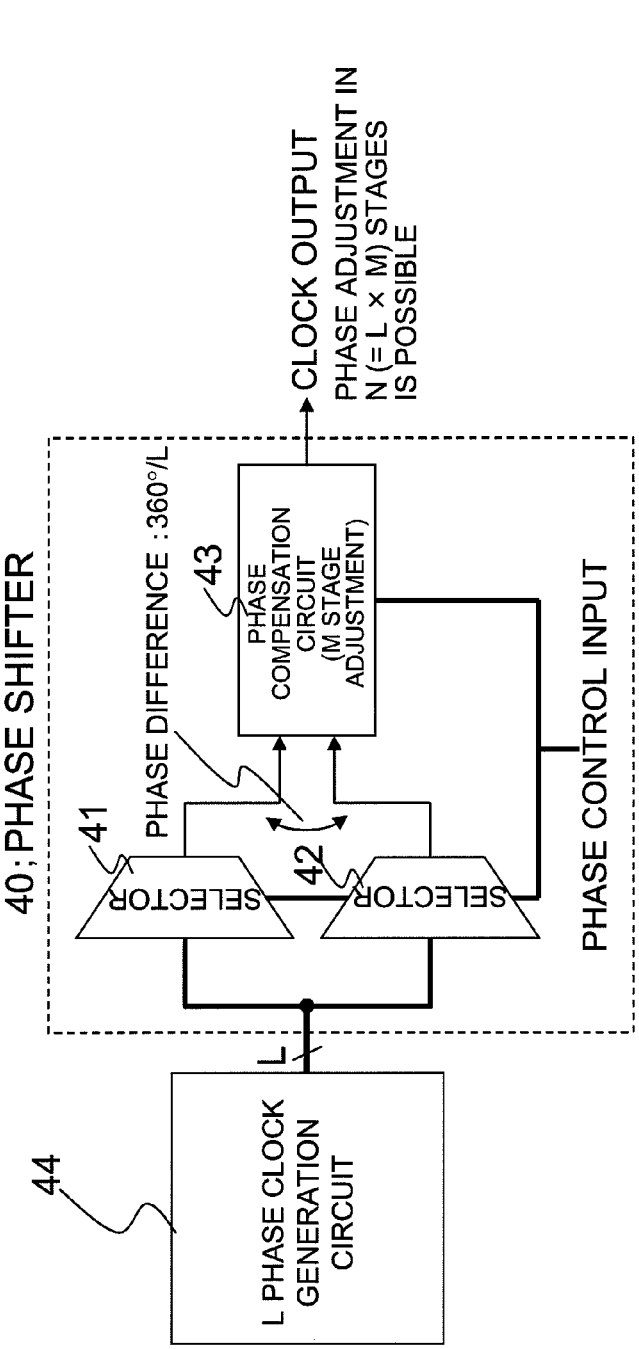
FIGS. 4A and 4B are diagrams showing a configuration of one exemplary embodiment of the present invention.
Figure 4B:
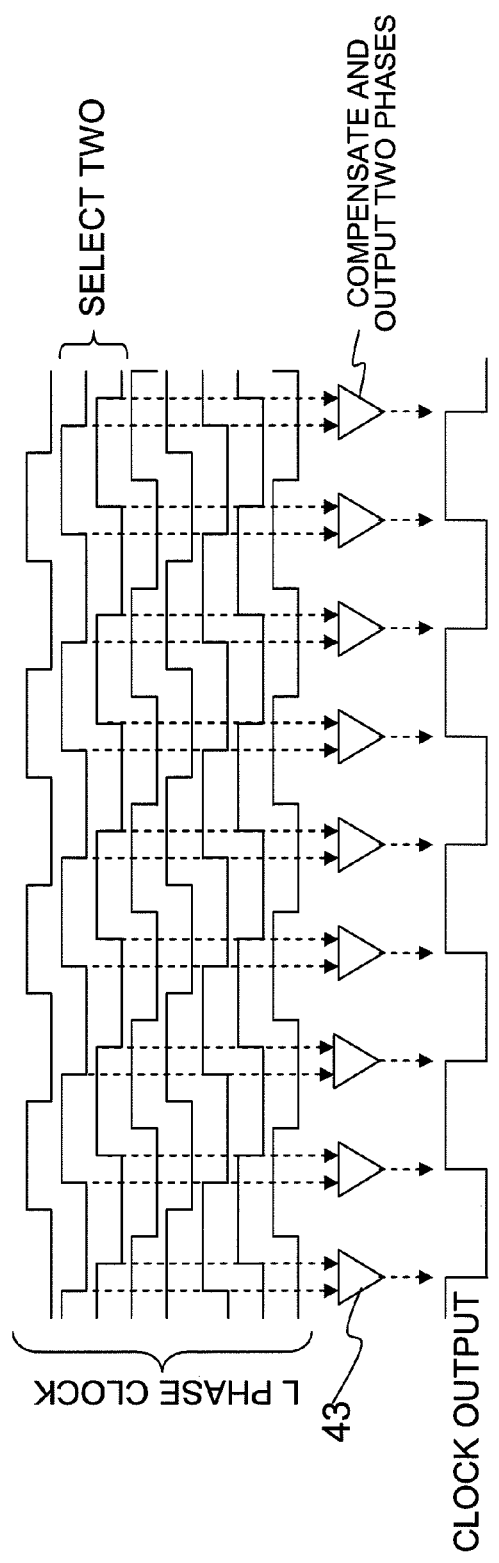
Figure 5:
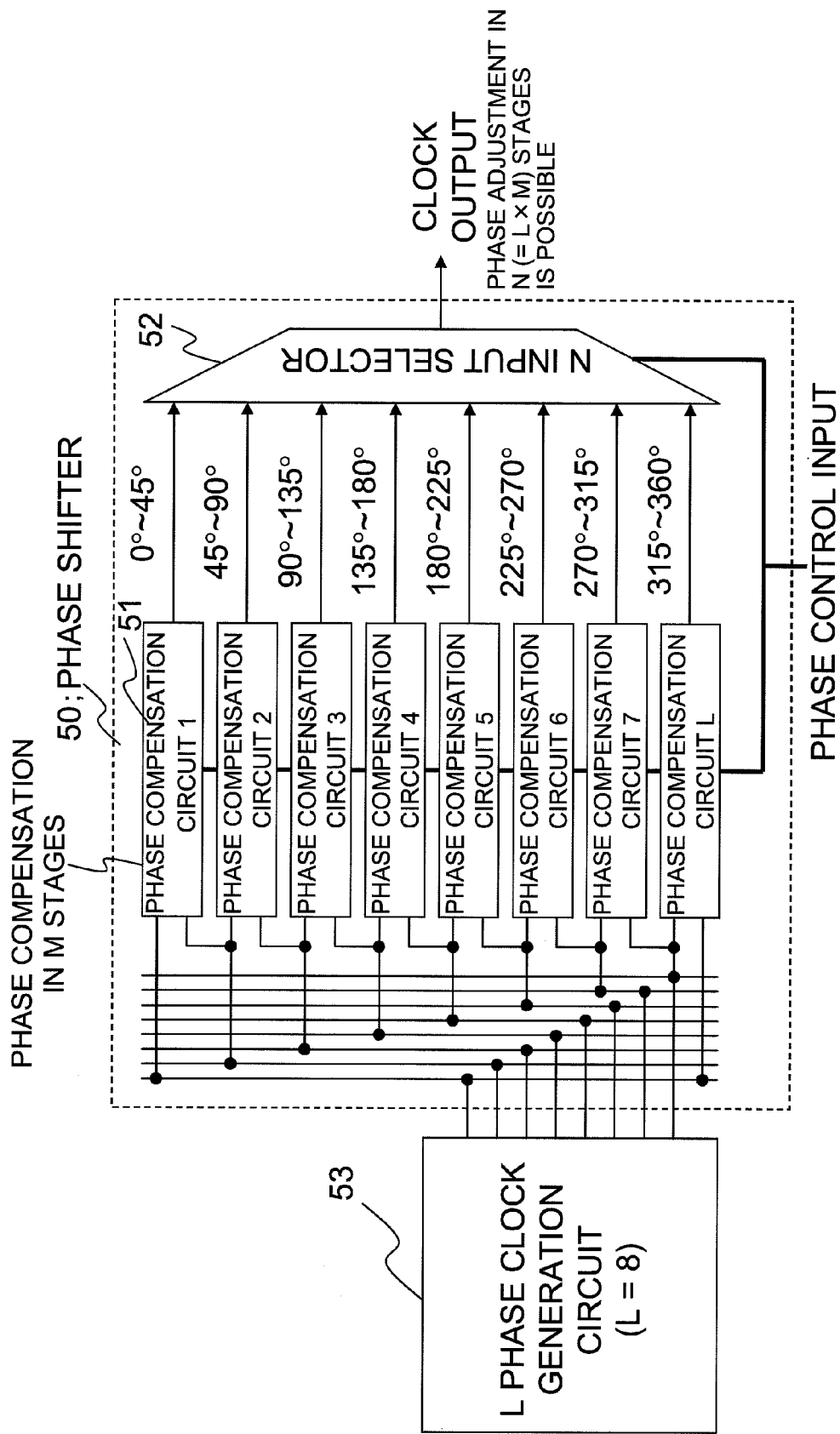
FIG. 5 is a diagram showing another example of a configuration of a phase shifter.
Figure 6:
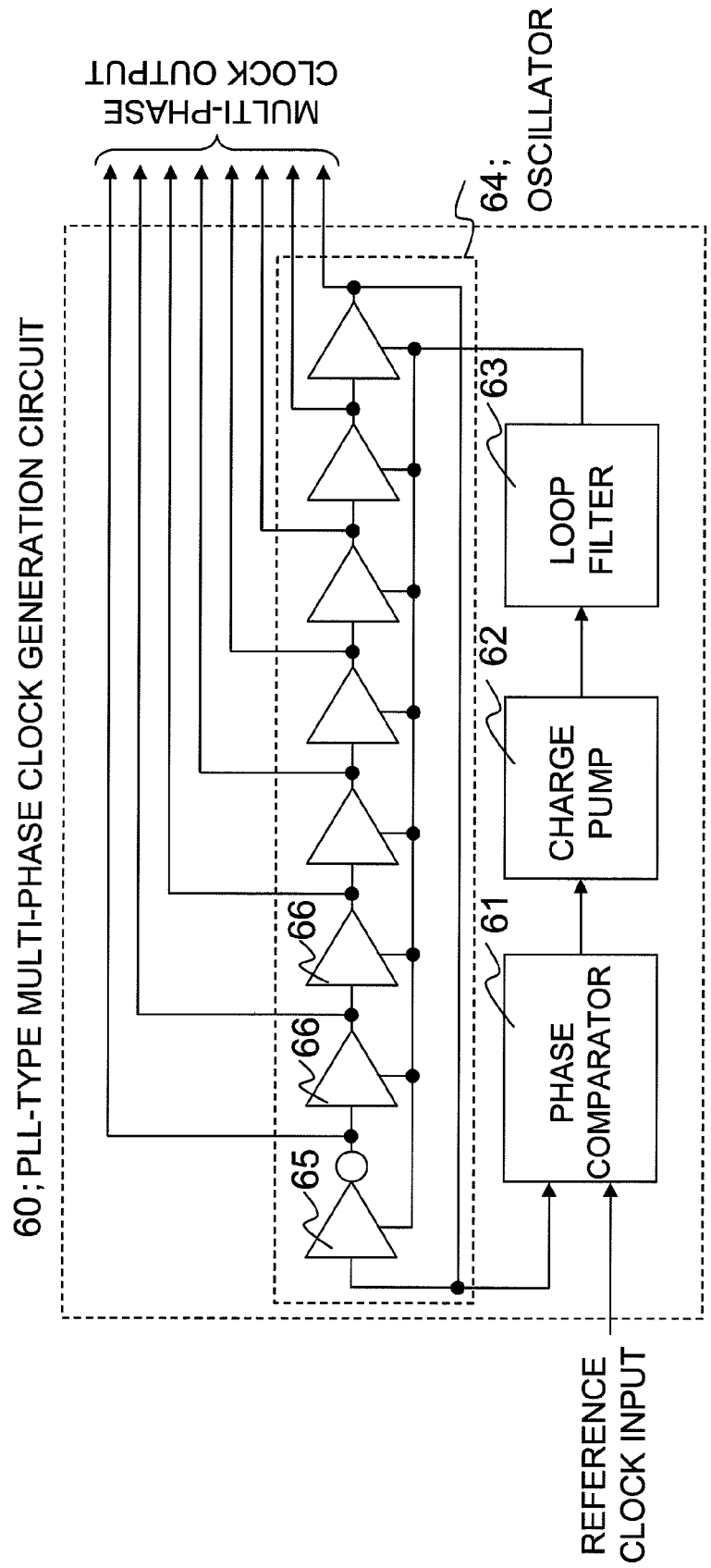
FIG. 6 is a diagram showing one example of a configuration of a multi-phase clock generation circuit.
Figure 7:
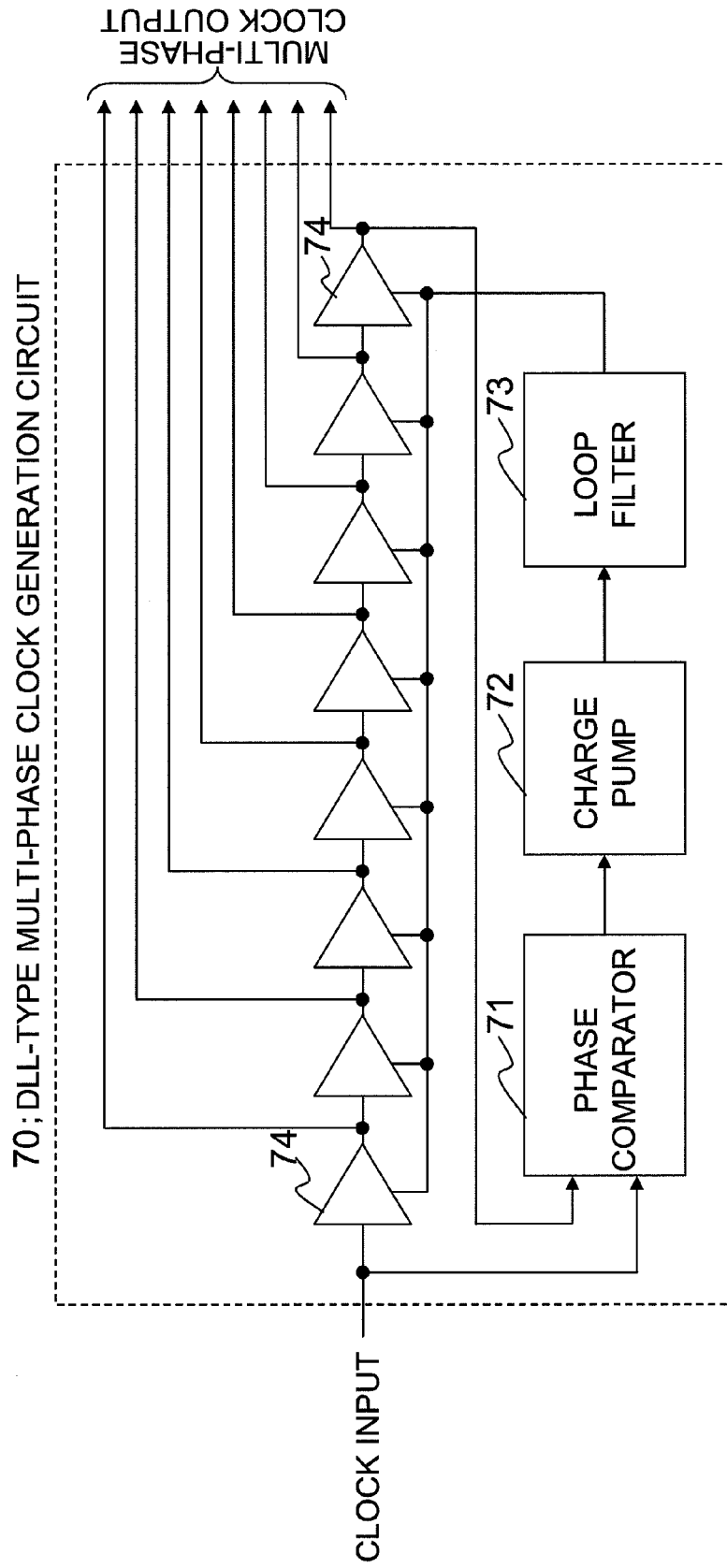
FIG. 7 is a diagram showing another example of the configuration of the multi-phase clock generation circuit.
Figure 8B:
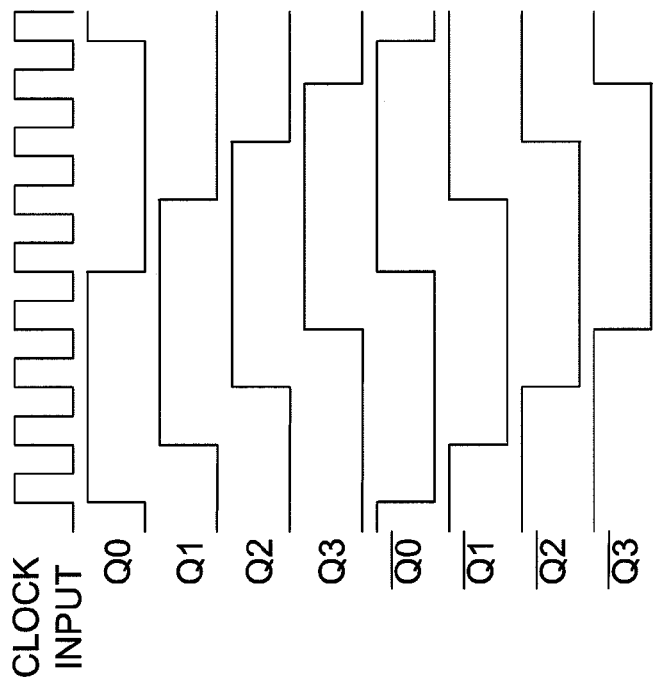
FIGS. 8A and 8B are diagrams showing an even further example of the configuration of the multi-phase clock generation circuit and an example of an operation waveform.
Figure 8A:
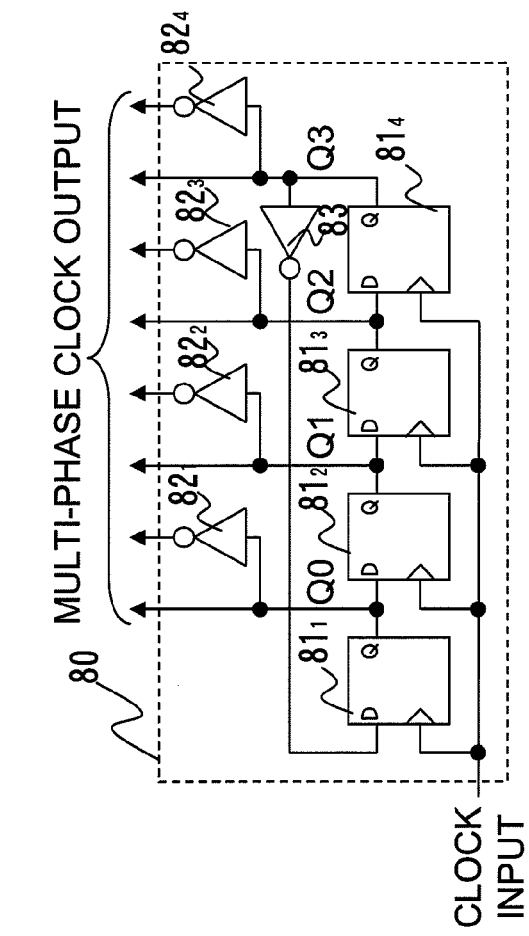
Figure 9A:
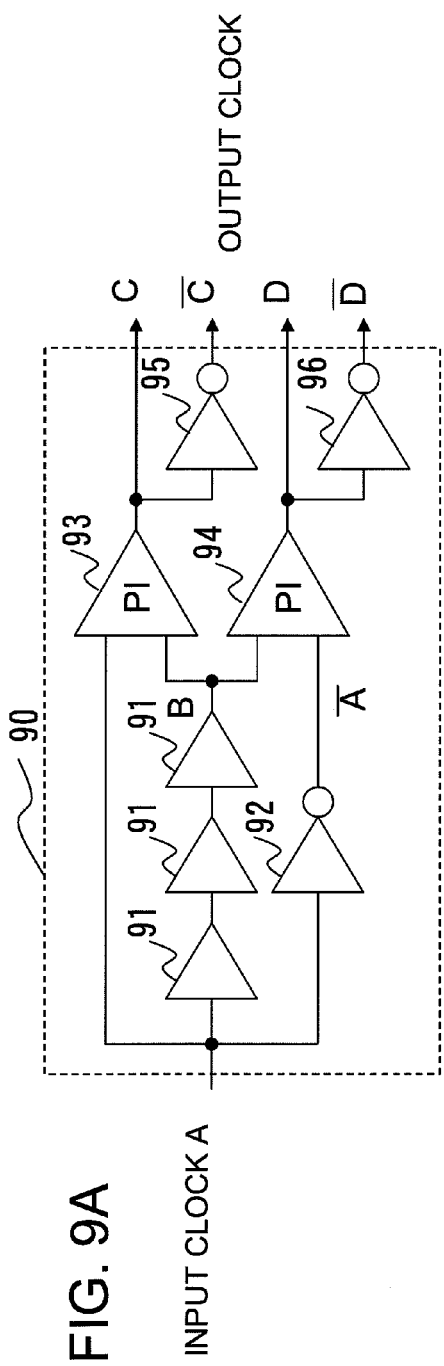
FIGS. 9A and 9B are diagrams showing an even further example of the configuration of the multi-phase clock generation circuit and an example of an operation waveform.
Figure 9B:
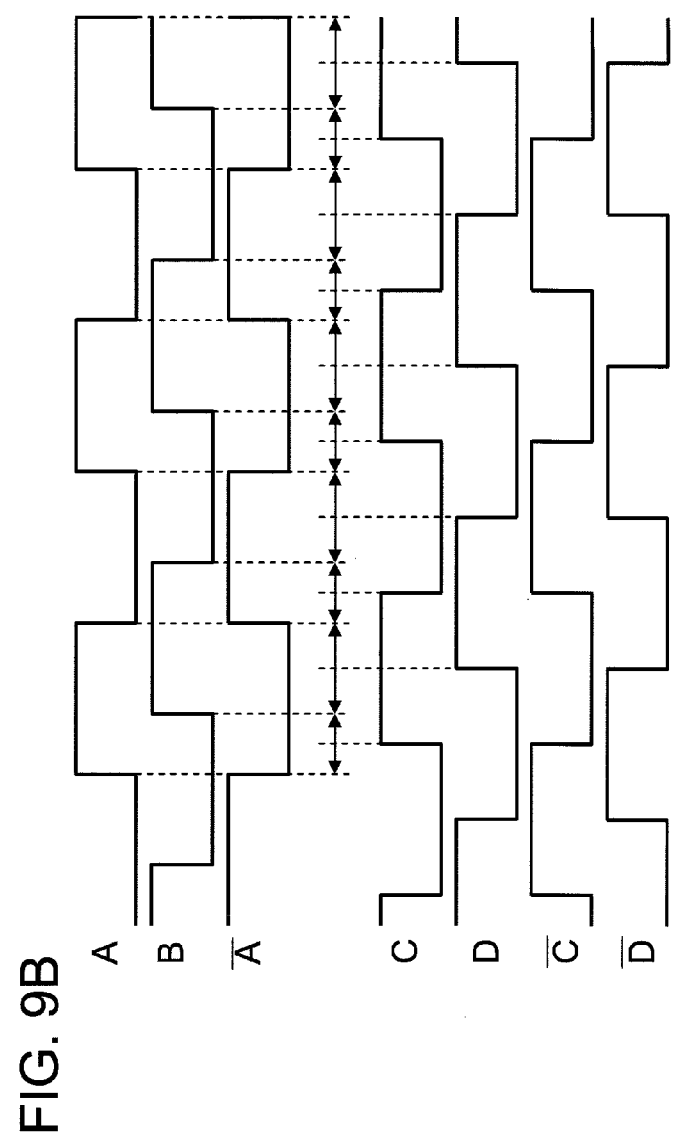

A circuit configuration as shown in FIG. 4A, 4B or FIG. 5, for example, is used in the phase shifter 151. As a matter of course, other configurations may be also adopted.

In order to change a phase of each edge of the output clock, a desired control signal may be given from the control circuit before each edge is output.

Figure 15B:
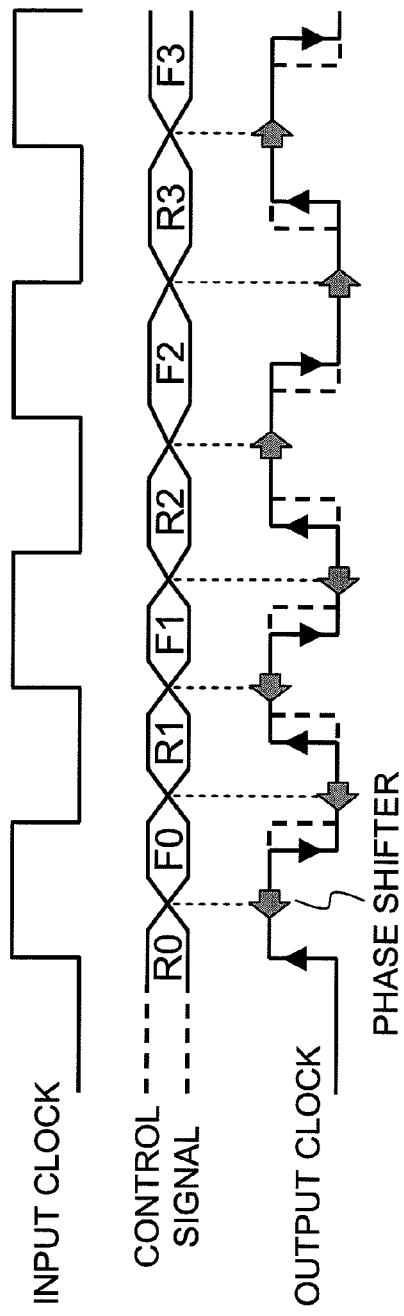

FIG. 15B is a timing chart for describing operation of the clock adjusting circuit shown in FIG. 15A. For example, the phase of the falling edge can be changed by giving the control signal FO before the first falling edge appears in the output clock.

In the example of FIG. 15B, the phase of this first falling edge is advanced, and the clock period is shortened. By giving a control signal R1 before a subsequent rising edge comes, the phase of the rising edge is changed. In this way, by changing the control signal at timing a little before each edge appears, the circuit is able to change the phase of each clock edge, so that the circuit is able to adjust a clock period, duty, and the like, for each one cycle.

In the clock adjusting circuit shown in FIG. 15A, in variably controlling the phase of both the rising edge and the falling edge of the clock pulse, the control signal received from the control circuit 152 by the phase shifter 151 must be changed twice during one clock cycle.

The control circuit 152 that generates the control signal is generally formed by a logic circuit, but this logic circuit must operate at a frequency double the output clock frequency. When the clock frequency is low, the configuration of FIG. 15A suffices. However when the clock frequency is high, the logic circuit cannot operate normally.

Figure 10A:
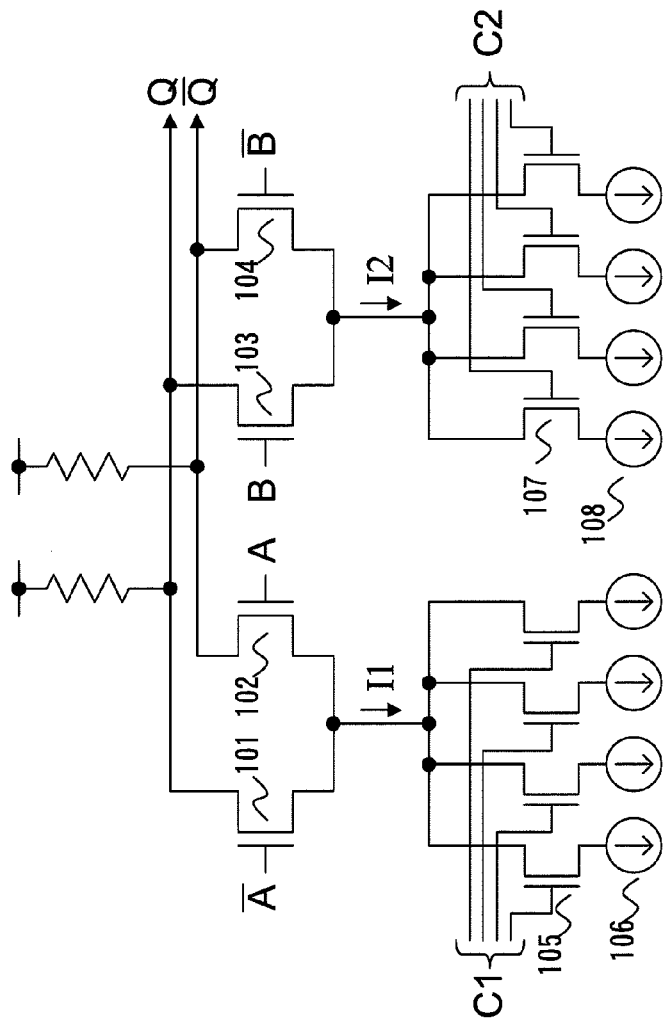
FIGS. 10A and 10B are diagrams showing a configuration of a phase compensation circuit and an example of an operation waveform.
Figure 10B:
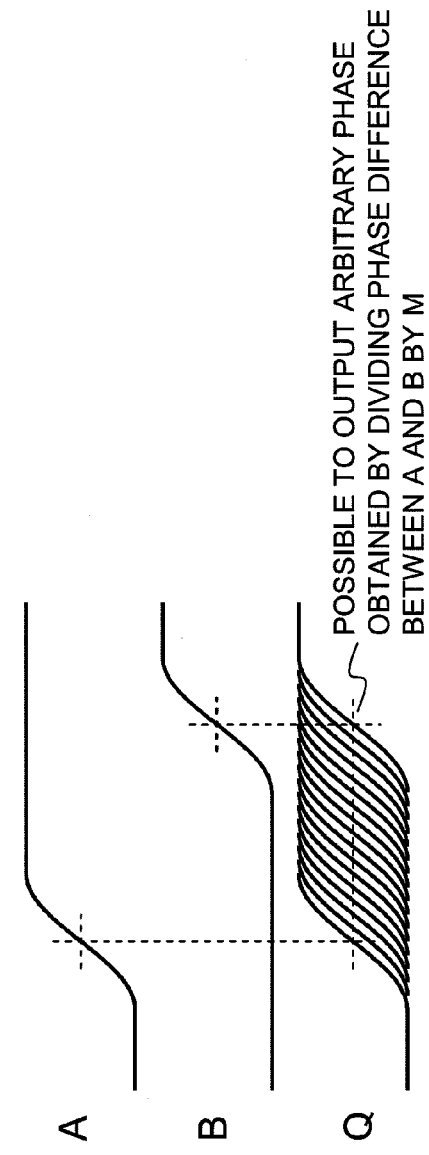
Figure 11:
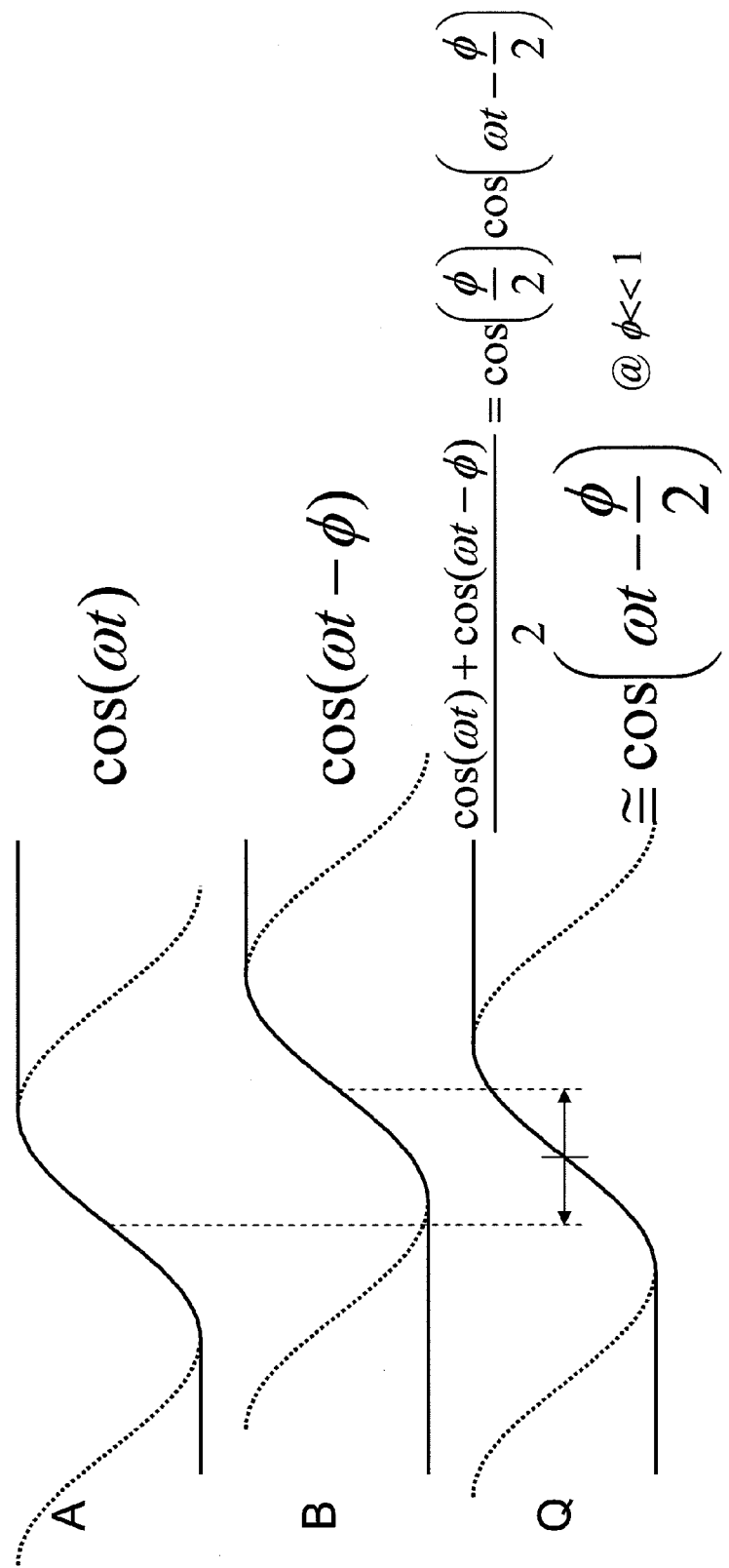
FIG. 11 is a diagram showing an example of an operation waveform of the phase compensation circuit.

In the phase shifter 151, immediately after the phase shifter 151 has changed the phase of the output clock, a voltage of a clock signal is in general not stable. In particular, in case the clock phase is changed to a large extent in one phase shift, this phenomenon appears markedly. When the phase shifter 151 switches the clock phase, a switch circuit (for example, switch transistors 105 and 107 in FIGS. 10A and 10B) arranged inside the phase shifter 151 is switched and a delay occurs in this switching. During a transition time-interval from a phase before the switching of this switch to switching until switching to a desired phase is completed, there is a timing at which voltage of the clock signal is somewhat stable. A state in which the voltage of this clock signal is not stable is generally converged in from several tens of ps to several hundreds of ps. However, if a subsequent clock edge comes in a state in which the voltage of the clock signal is not stable, the timing of the clock edge becomes unstable, and a jitter is generated.

As a result, the timing at which switching of the clock phase is performed (the timing at which the control signal is changed) must have sufficient margin with respect to timing of an edge of a subsequent output clock. This is not a problem in case of a clock signal of low frequency, but in case of adjusting the phase of a clock signal of high frequency, there is a problem in that control of the timing for changing the control signal is very difficult, or jitter is generated in the output clock.

Figure 16:
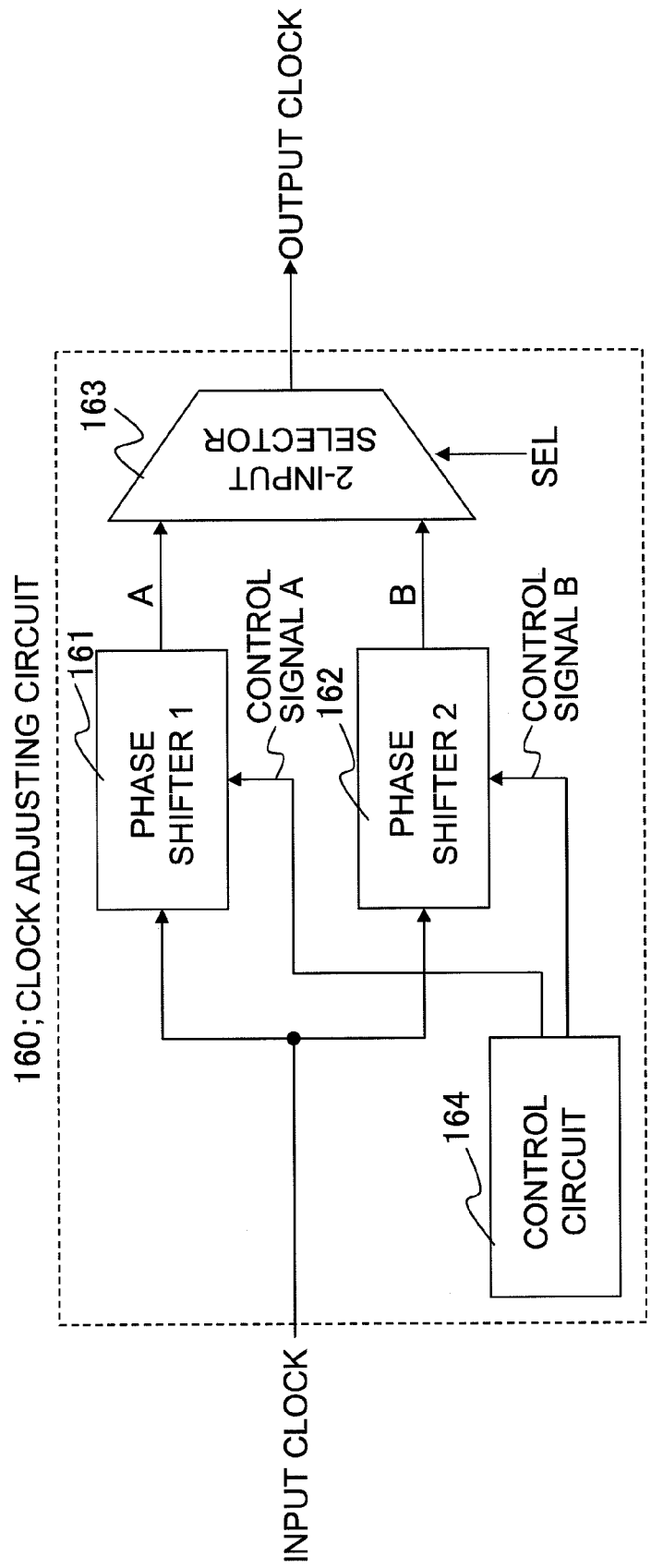
FIG. 16 is a diagram showing a configuration of the clock adjusting circuit of one exemplary embodiment of the present invention.

FIG. 16 is a diagram showing another configuration example of the clock adjusting circuit according to the exemplary embodiment of the present invention, which makes an improvement with respect to these problems. Referring to FIG. 16, in the clock adjusting circuit, a selector 163 alternately selects outputs of two phase shifters 161 and 162 to output a selected one. The two phase shifters 161 and 162 receive a clock in common and outputs are supplied to the selector 163. In the selector 163 selects and outputs one according to a value of a selection control signal SEL. Control signals A and B that control a phase shift amount are supplied from the control circuit 164 to the two phase shifters 161 and 162. For example, at timing before and after the phase shifter 1 outputs a rising edge, the selector 163 selects and outputs an output (A) of the phase shifter 1, and at timing before and after the phase shifter 2 outputs a falling edge, the selector 163 selects and outputs an output (B) of the phase shifter 2.

Figure 17:
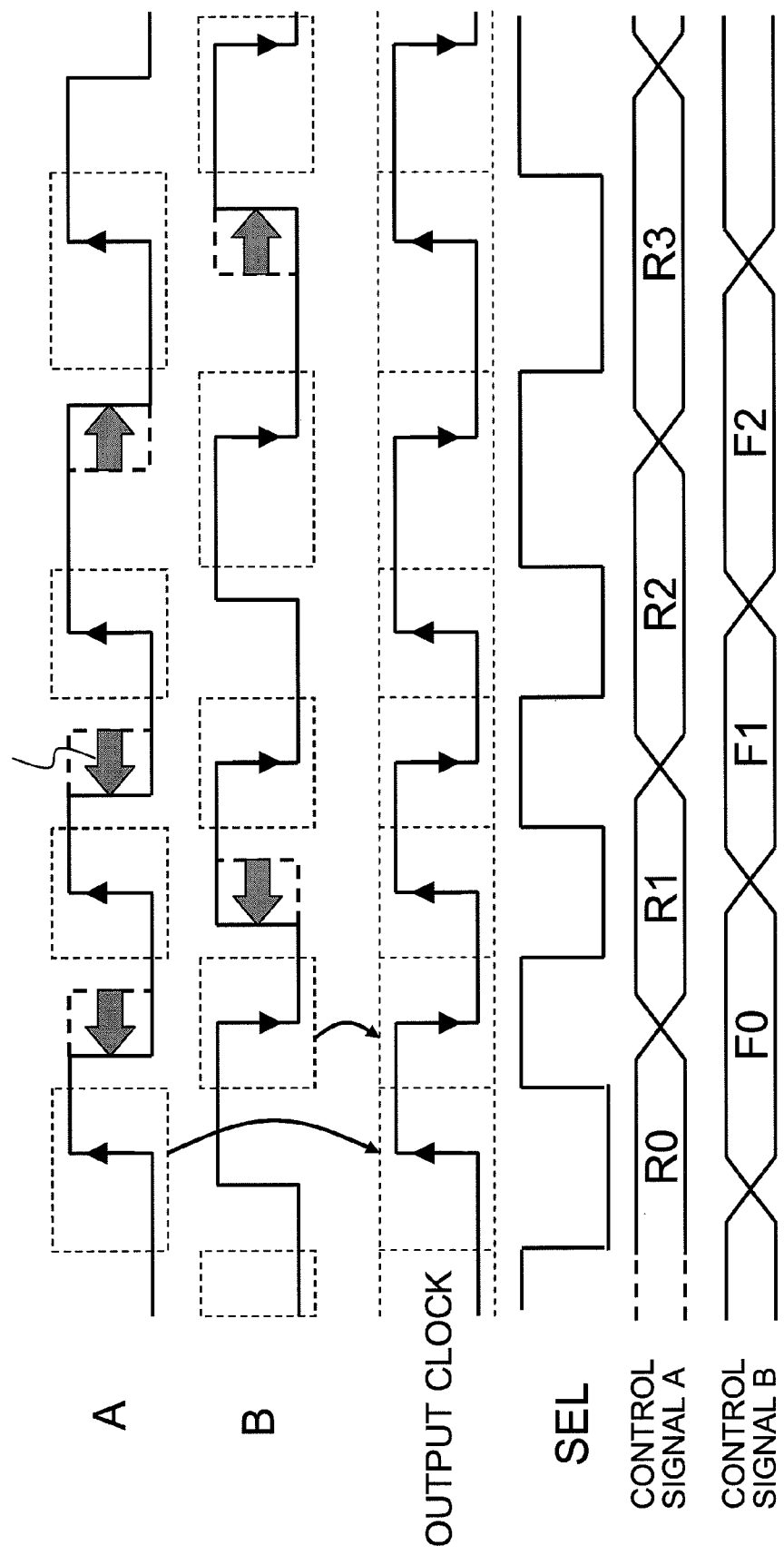
FIG. 17 is a diagram describing an operation waveform of the circuit of FIG. 16.

FIG. 17 is a timing chart for describing operation of the clock adjusting circuit of FIG. 16. Timing waveforms of outputs A and B of the phase shifters 161 and 162, output clock, SEL, control signal A, and control signal B, are shown. The output clock alternately selects and outputs an output (A) of the phase shifter 1 and an output (B) of the phase shifter 2, based on a value of the control signal SEL of the selector.

The control signal A is given to the phase shifter 1, so that the output (A) outputs a rising edge at a desired timing.

In the same way, the control signal B is given to the phase shifter 2, so that the output (B) outputs a rising edge at a desired timing.

The phase of a falling edge of the output (A) of the phase shifter 1 and the phase of a rising edge of the output (B) of the phase shifter 2 may be any type of phase.

In the circuit configuration of FIG. 16, a period in which the control signal is changed is the same as a period of the output clock. That is, the control circuit 164 may operate at a frequency of the output clock.

Furthermore, the timing at which the control signal A is changed is preferably between a rising edge and a subsequent rising edge of the output (A) of the phase shifter 1.

In the same way, the timing at which the control signal B is changed is preferably between a falling edge and a subsequent falling edge of the output (B) of the phase shifter 2.

In cases of the configuration of FIG. 15A, the control circuit 152 had to operate at a frequency double the output clock, whereas in case of the configuration of FIG. 16, operating frequency of the control circuit 164 may be low.

Since timing range at which it is possible to change the control signals can be set broader for the configuration of FIG. 16 than the configuration of FIGS. 15A and 15B, there is an advantage in that design of timing of the control signals is easy. In the configuration of FIG. 16, at timing at which the phase shifters 161 and 162 switch the phase of the output clock, the outputs of the phase shifters are cut off by the selector 163 and are not delivered to the outside. In this way, a state, in which a voltage of a clock signal generated at a phase shift is unstable, can be restrained from being propagated to the clock signal output to the outside, so that a waveform of the output clock can be kept completely as it is and jitter can be made small.

In FIG. 16, a signal of a selection control signal terminal SEL of the selector may be used in which the phase is delayed or advanced with respect to the output clock, at a frequency the same as the output clock. In such cases, the phase of the SEL signal is desirably delayed 90 degrees or advanced 90 degrees with respect to the output clock.

Figure 18:
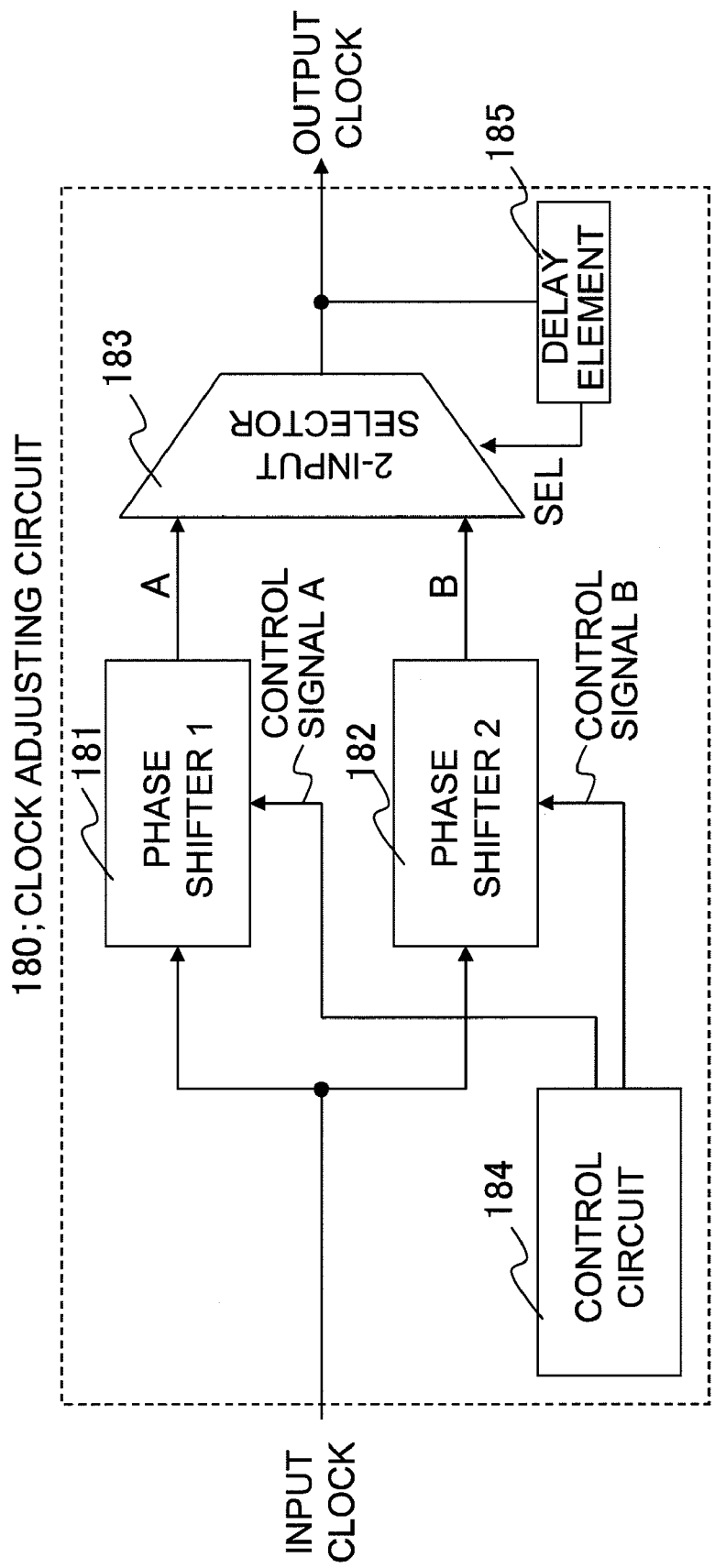
FIG. 18 is a diagram showing another configuration of the clock adjusting circuit of one exemplary embodiment of the present invention.

With regard to the exemplary embodiment of the present invention, FIG. 18 shows a circuit configuration for cases in which the selection control signal SEL of the selector 183 is generated from the output clock. For the selection control signal SEL of the selector 183, a signal in which the output clock is delayed by a delay element 185 is used. A delay between the output clock and the SEL terminal, in this circuit, is preferably about ¼ of a clock period.

Figure 19:
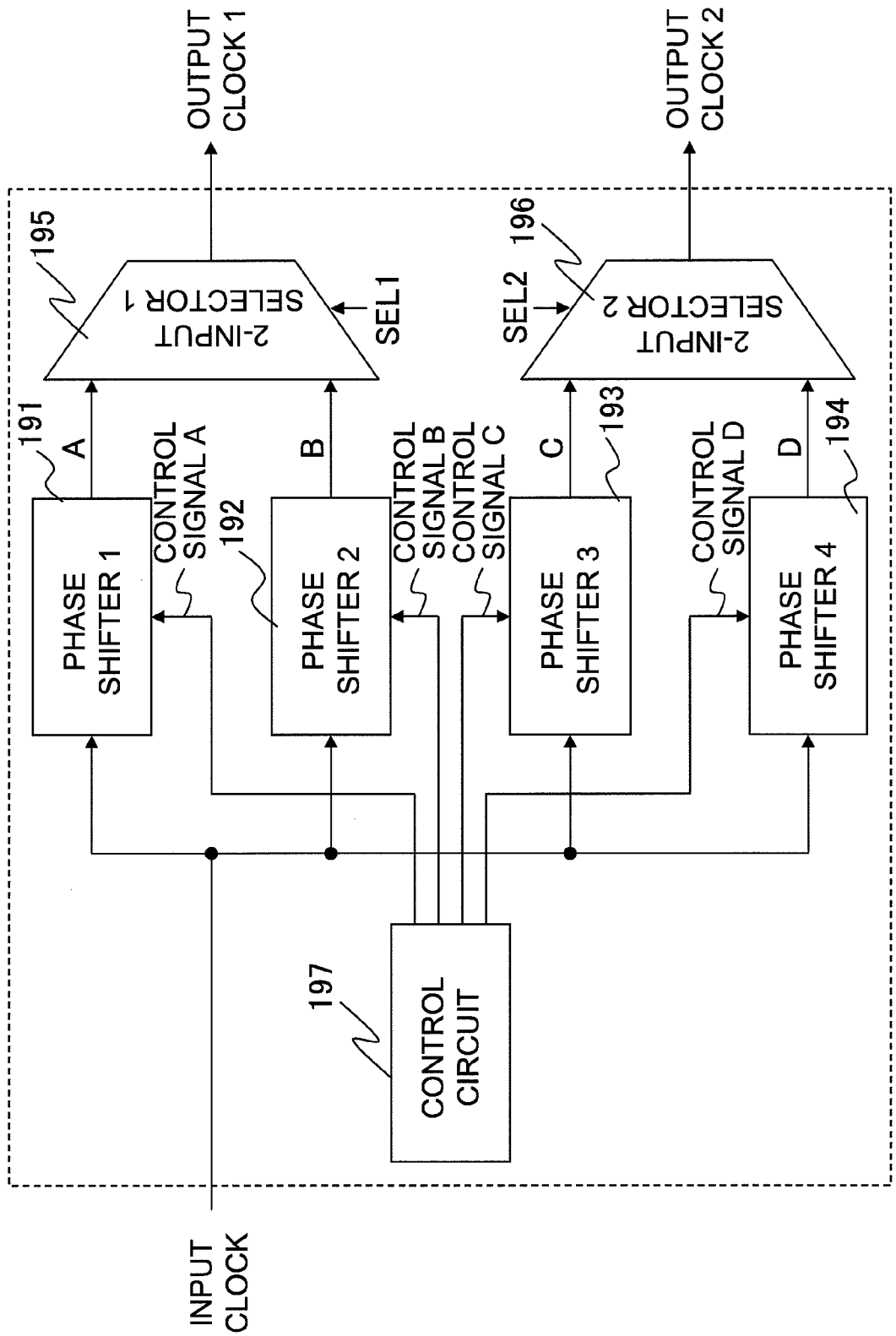
FIG. 19 is a diagram showing an even further configuration of the clock adjusting circuit of one exemplary embodiment of the present invention.

FIG. 19 is a diagram showing one example of a configuration of the clock adjusting circuit of the exemplary embodiment of the present invention, having multi-phase clock output. Referring to FIG. 19, this clock adjusting circuit includes two sets, each set including selectors and a pair of phase shifters of FIG. 18, and the control circuit provides control signals A, B, C, and D, to four phase shifters. In this circuit, clock signals are output, with an output clock 1 and an output clock 2 having different phases. For example, a circuit in which a four phase clock is necessary, is useful in case the output clock 2, which is 90 degrees delayed with respect to the output clock 1, is necessary.

In the clock adjusting circuit of FIG. 19, when the four phase clock is generated, for example, the phase shifter 1 (191) adjusts timing of a rising edge, the phase shifter 2 (192) adjusts timing of a falling edge, the phase shifter 3 (193) adjusts timing of a rising edge, and the phase shifter 4 (194) adjusts timing of a falling edge.

Here, with respect to the timing of the rising edge generated by the phase shifter 3 (193), timing intermediate between the rising edge of the output (A) of the phase shifter 1 (191) and the falling edge of the output (B) of the phase shifter 2 (192) is generated.

In the same way, with respect to the timing of the falling edge generated by the phase shifter 4 (194), timing intermediate between the falling edge of the output (B) of the phase shifter 2 (192) and the rising edge of the output (A) of the phase shifter 1 (191) is generated.

A 2-input selector 1 (195) selects a rising edge of A and a falling edge of B, by an input value of a selection control signal terminal SEL1, and outputs to the output clock 1.

In the same way, a 2-input selector 2 selects a rising edge of C and a falling edge of D, by an input value of a selection control signal terminal SEL2, and outputs to the output clock 2.

Here, with regard to signals given to the selection control signal terminal SEL1, a waveform with a phase advanced or delayed about 90 from the output clock 1 is preferable. In the same way, with regard to signals given to the selection control signal terminal SEL2, a waveform with a phase advanced or delayed about 90 from the output clock 2 is preferable.

Figure 20:
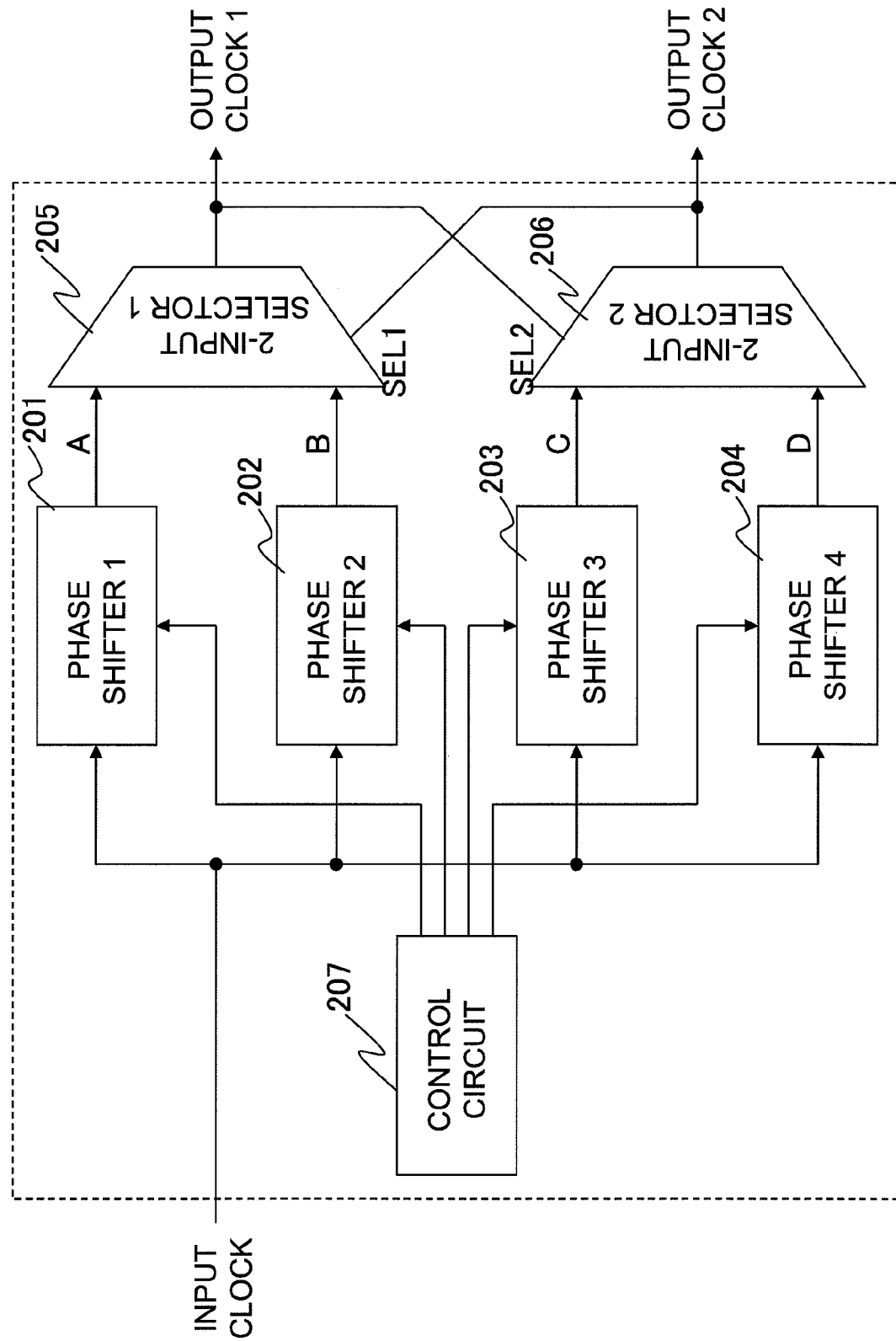
FIG. 20 is a diagram showing an even further configuration of the clock adjusting circuit of one exemplary embodiment of the present invention.
Figure 21:
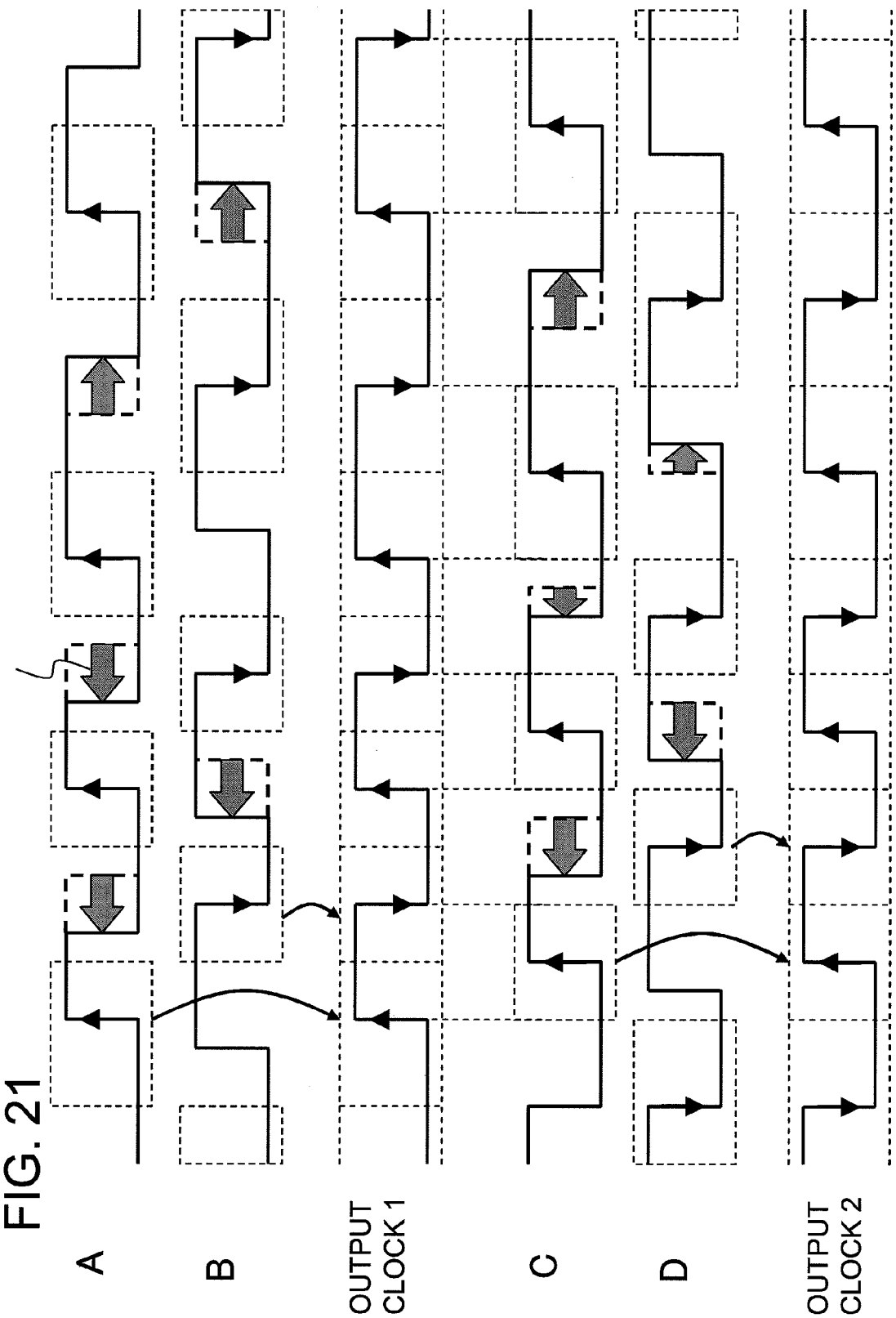
FIG. 21 is a timing waveform diagram describing operation of the circuit of FIG. 20.

When the phases of the output clock 1 and the output clock 2 are mutually out of alignment by 90 degrees, as shown in FIG. 20, the output clock 1 may be connected to the selection control signal SEL 2 of the selector 2 (206), and the output clock 2 may be connected to the selection control signal SEL 1 of the selector 1 (205). FIG. 21 shows an operation waveform of the circuit of FIG. 20.

Figure 22:
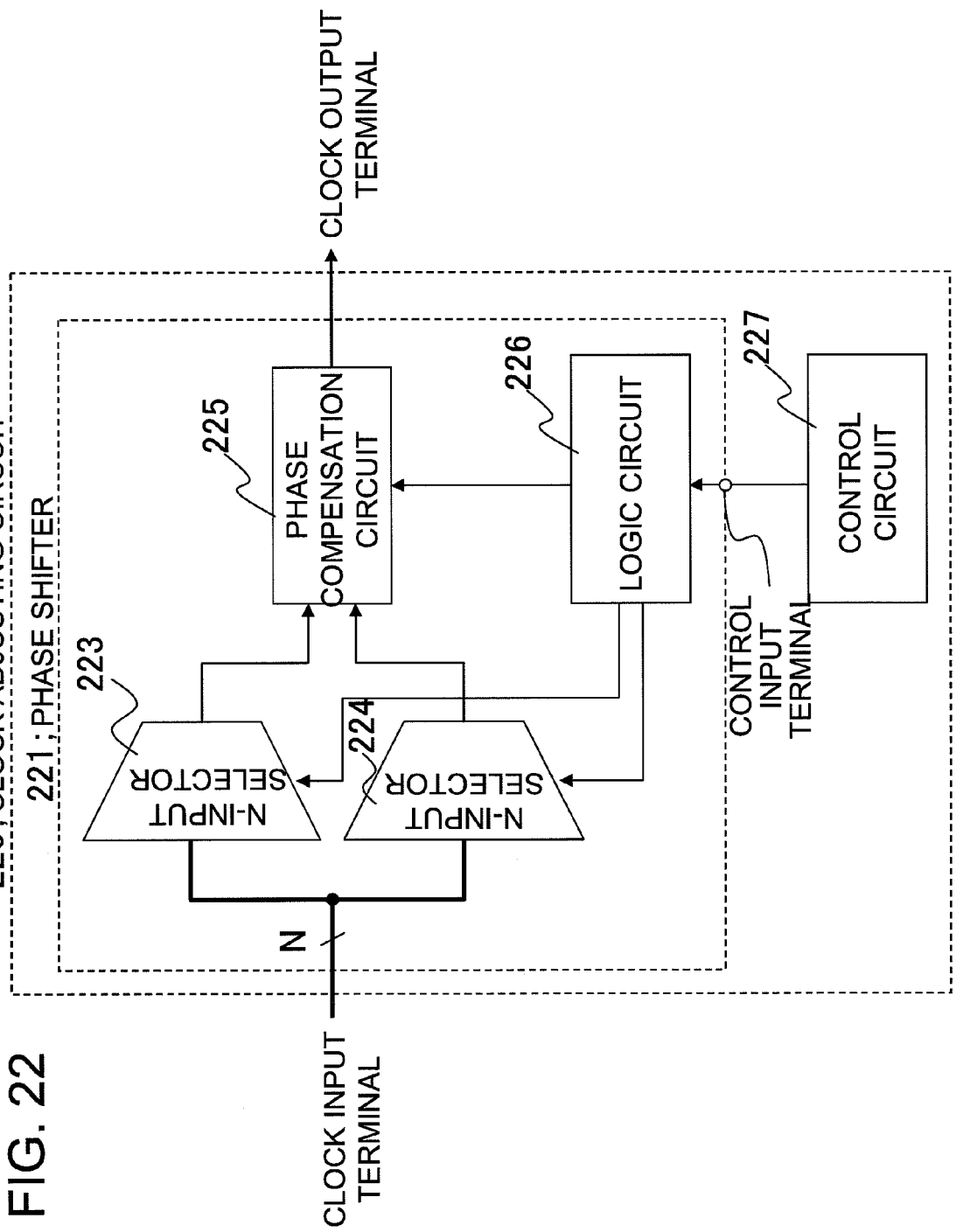
FIG. 22 is a diagram showing an even further configuration of the clock adjusting circuit of one exemplary embodiment of the present invention.

FIG. 22 is a diagram showing one example of a configuration of a clock adjusting circuit of the exemplary embodiment of the present invention. A phase shifter 221 includes selectors 223 and 224 which select one among N inputs, a phase compensation circuit 225 which receives output of the selectors 223 and 224, and a logic circuit 226 which receives a control signal from a control circuit 227 and generates a signal controlling selection of the selectors 223 and 224, and a phase compensation amount of the phase compensation circuit 225. A multi-phase clock signal is received from a clock input terminal, and two clock signals with phases close to a desired clock phase are selected therefrom by the selectors 223 and 224. The two phase clock signals selected by the selectors 223 and 224 are received by the phase compensation circuit 225, and the phase compensation circuit 225 compensates and generates an arbitrary phase between the two phases, and outputs to a clock output terminal. In this way, it is possible to extract a clock signal of an arbitrary phase.

Figure 23:
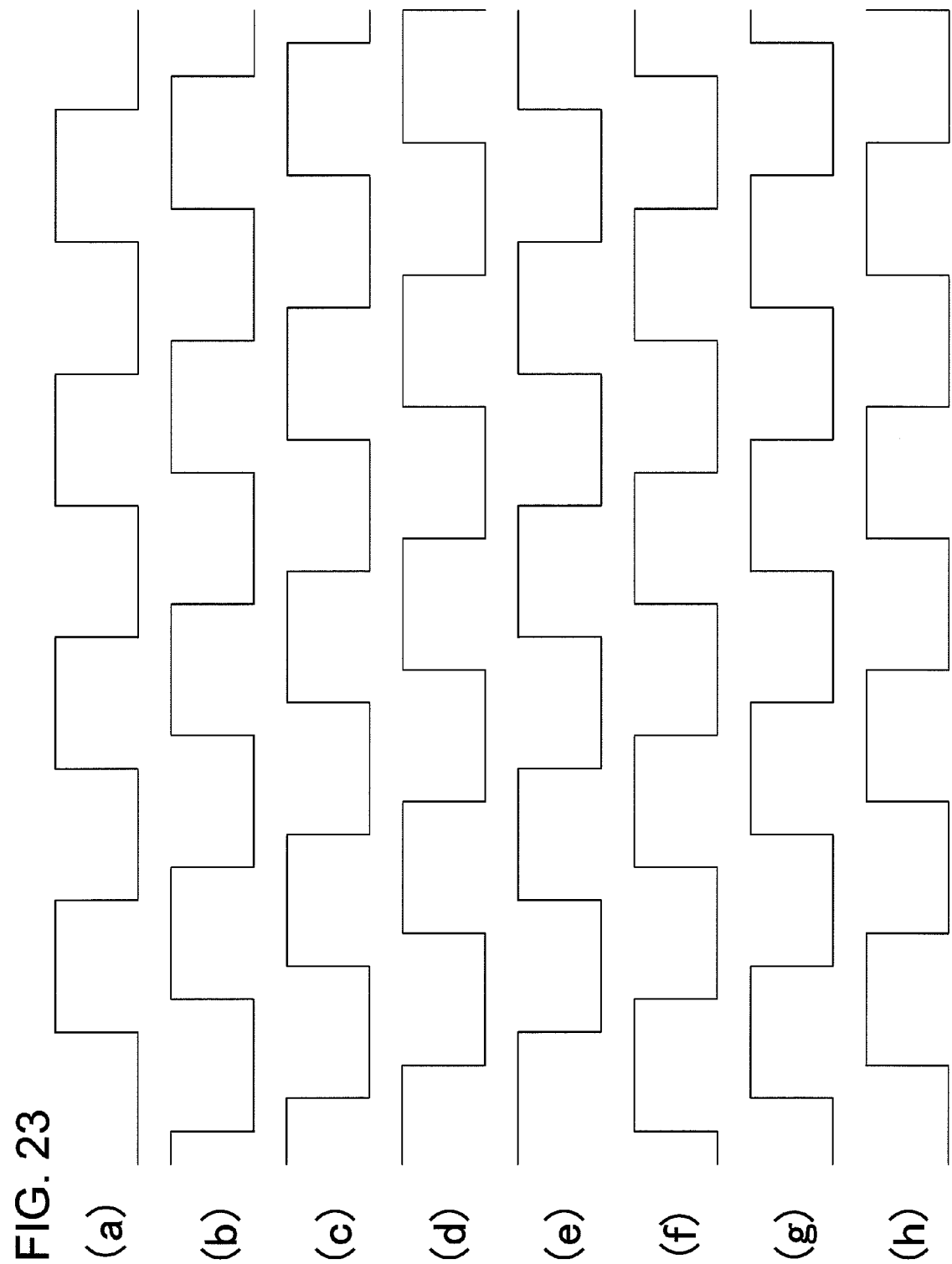
FIG. 23 is a timing waveform diagram describing operation of the circuit of FIG. 22.

Here, with regard to the multi-phase clock signal received by the clock input terminal, as shown in FIG. 23 (a) to (h), phase differences of each clock input are at regular intervals. The multi-phase clock generation circuit may use a structure as shown in FIG. 6 to FIG. 9B, and the phase compensation circuit may use a structure as shown in FIG. 10A, 10B or FIGS. 12A-12C.

Figure 24:
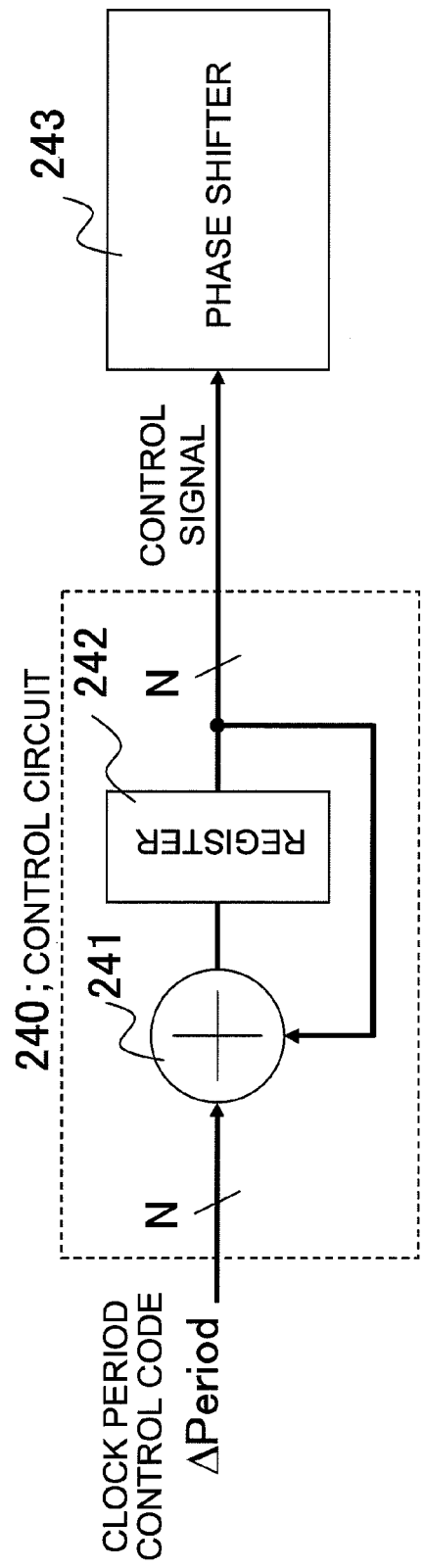
FIG. 24 is a diagram showing a configuration of a control circuit of one exemplary embodiment of the present invention.

FIG. 24 is a diagram showing one example of a configuration of a control circuit (a control circuit which variably controls a shift amount of a phase shifter) of the clock adjusting circuit of the present exemplary embodiment. Referring to FIG. 24, this control circuit 240 includes an adder 241 and a register 242, and the adder 241 outputs a result of adding a clock period control code ΔPeriod and output of the register 242, as a control signal. In order to control the clock period, the control signal of the phase shifter 243 may be advanced or delayed from the present phase. For example, if a value of the control signal of the phase shifter 243 is added N at a time, at each clock cycle, the phase of a clock signal output by the phase shifter 243 is shifted each clock Δθ. As a result, the clock period changes by ΔT.

As in the control circuit 240 of FIG. 24, by using the control circuit 240 that adds ΔPeriod each clock, to the control signal given to the phase shifter 243, it is possible to change the clock period output by the phase shifter.

Furthermore, by changing this ΔPeriod for each clock, it is possible to generate jitter in the clock signal output from the phase shifter 243.

Figure 13:
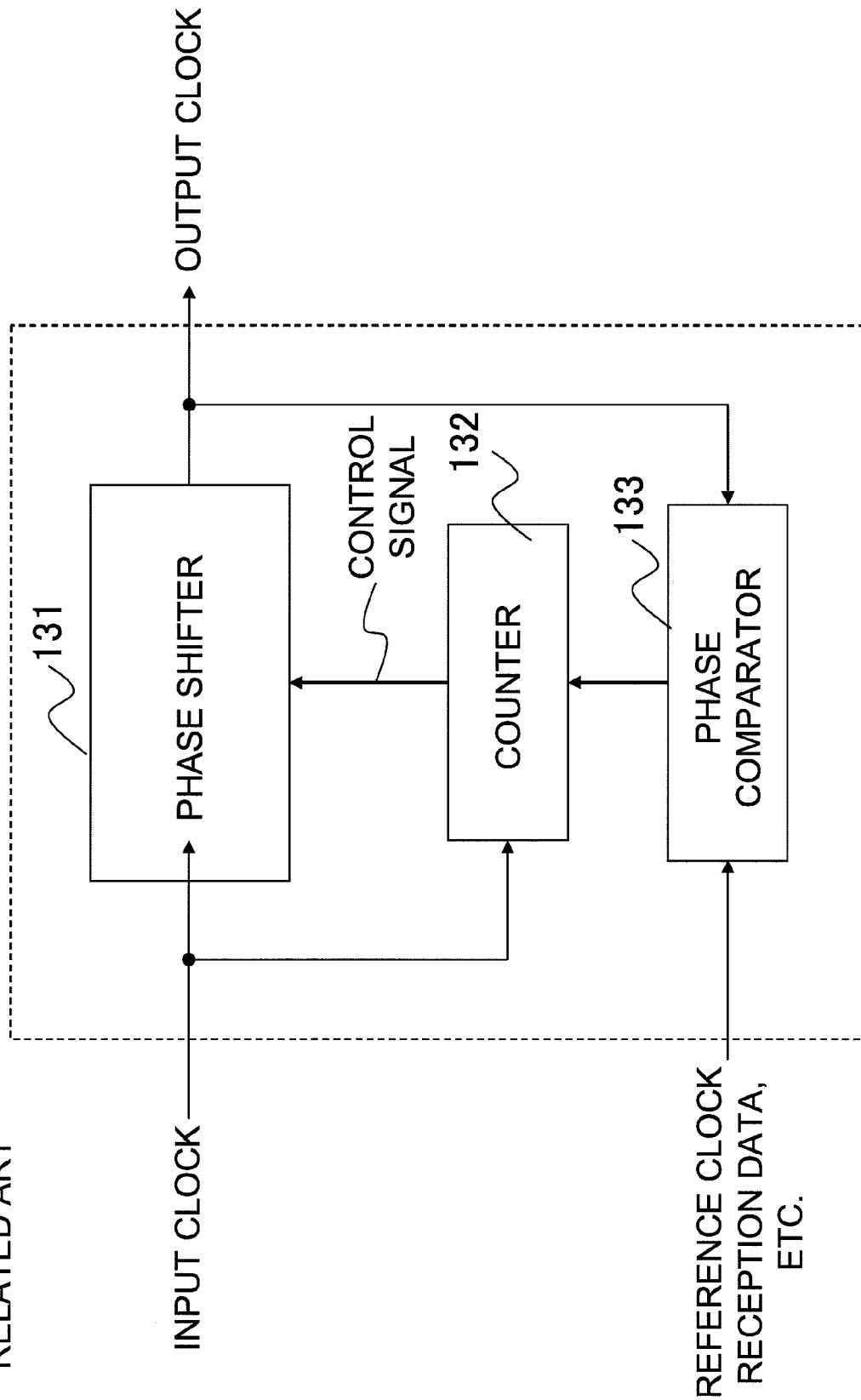
FIG. 13 is a diagram showing a configuration of a delay adjustment circuit of a related art.

With a delay adjustment circuit as shown in FIG. 13, it is possible to only output a clock of a period for which time of one resolution step of the phase shifter 131 was added or subtracted, with respect to a period of an input clock.

If the control circuit 240 of the configuration shown in FIG. 24 is employed, since a phase can be shifted only an arbitrary number of steps of the phase shifter 243, a range of clock periods in which the phase shifter can output is widened.

Furthermore, in the circuit of FIG. 13, if the period or phase of the reference clock was not adjusted, it is not possible to adjust the period of the output clock of N cycles that are sequential, but in the circuit of FIG. 24, it is possible to adjust the clock period without using the reference clock.

Figure 25:
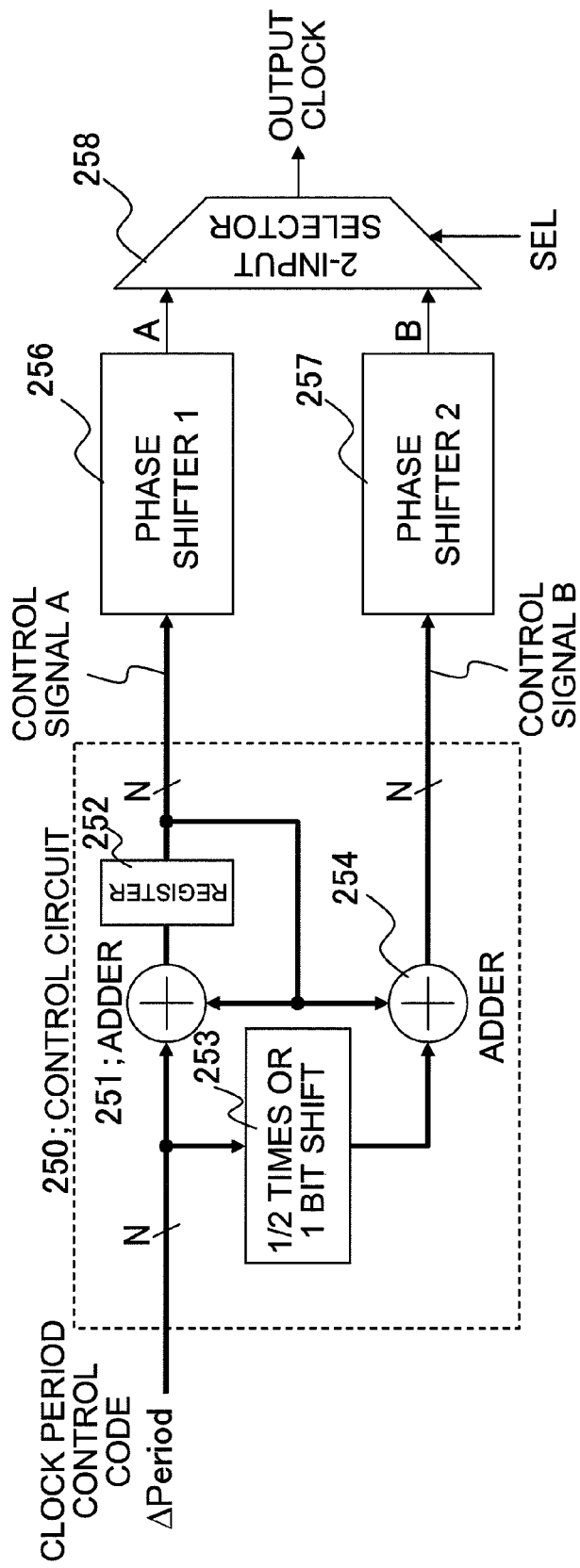
FIG. 25 is a diagram showing another configuration of the control circuit of one exemplary embodiment of the present invention.

FIG. 25 is a diagram showing another example of a configuration of the control circuit of the clock adjusting circuit in the present exemplary embodiment. This control circuit 250 is used in a control circuit of a clock adjusting circuit of a configuration in which selection is made by a selector using two of the phase shifters shown in FIG. 16. The control circuit 250, phase shifters 256 and 257, and a selector 258 correspond to the control circuit 164, the phase shifters 161 and 162, and the selector 163 of FIG. 16. In FIG. 25, a method of generating a control signal A received by the phase shifter 1 (256) from the control circuit 250 is the same as a method of generating a control signal received by the phase shifter 243 from the control circuit 240 of FIG. 24.

In the clock adjusting circuit shown in FIG. 16, for example, if the phase shifter 1 (161) controls a phase of a rising edge, the phase shifter 2 (162) is used to control a phase of a falling edge. In case intervals of rising edges have a ΔPeriod change, in order to adjust a position of a falling edge to between two rising edges, the falling edge may have a ΔPeriod/2 change.

Consequently, as shown in FIG. 25, the configuration is such that the control signal B of the phase shifter 2 (257) only changes by ΔPeriod/2, from the present phase. With respect to the control signal B, a clock period control code is ½ of the ΔPeriod; therefore, a circuit 253 that performs a 1 bit shift (right shift) on the ΔPeriod code, and an adder 254 which outputs a result of adding output of the circuit 253 and output of a register 252, as the control signal B, are provided. By using the control circuit 250, it is possible to adjust the clock period, while holding the duty ratio of the clock signal at 1:1.

In case the control circuit of the configuration shown in FIG. 25 is used in the clock adjusting circuit of the present invention shown in FIG. 16, timing at which the control signal A changes and timing at which the control signal B changes are preferably out of alignment by approximately half a clock period with respect to one another, as shown in FIG. 17.

Figure 26:
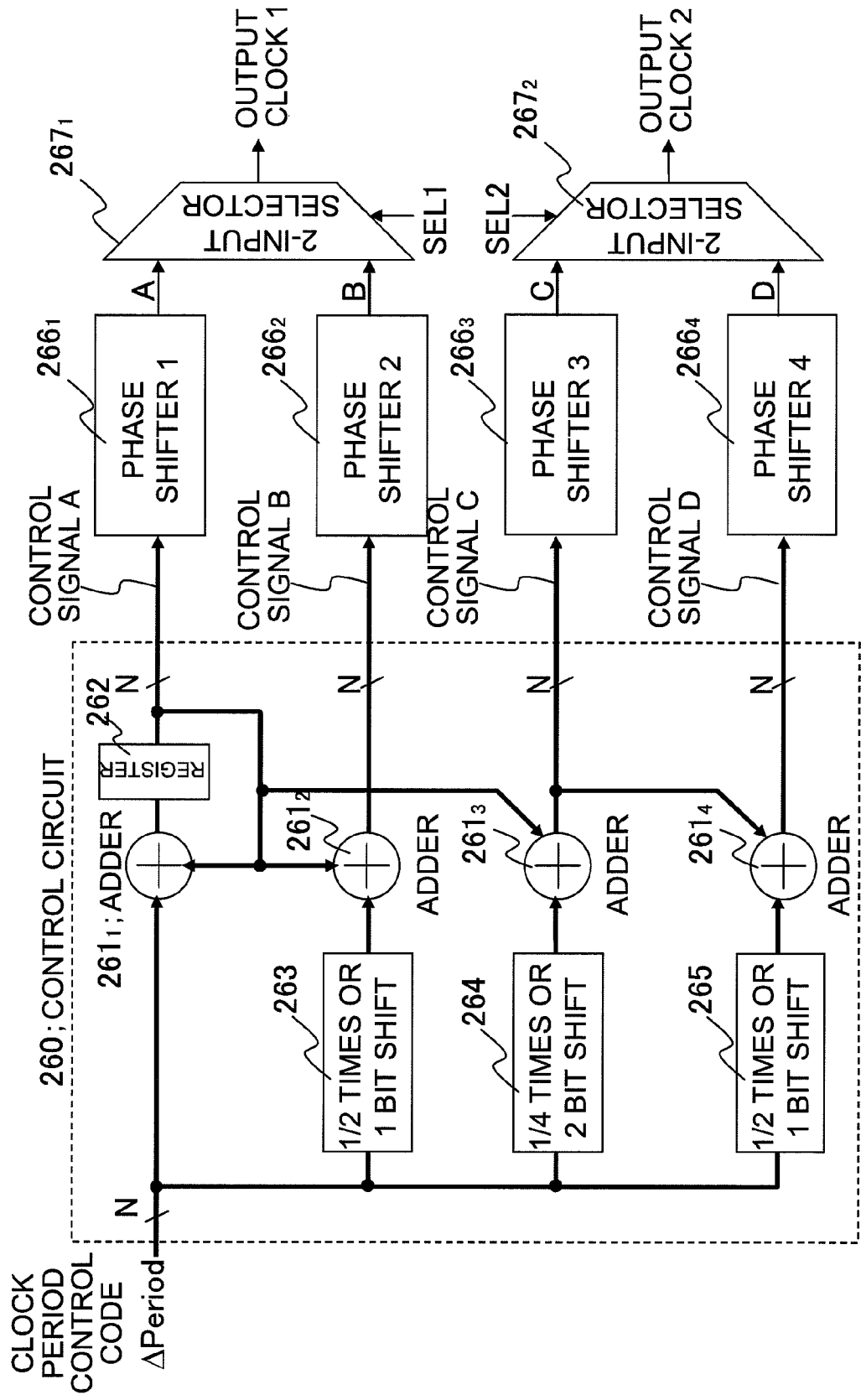
FIG. 26 is a diagram showing an even further configuration of the control circuit of one exemplary embodiment of the present invention.

FIG. 26 is a diagram showing an example of a configuration of the control circuit of a four-phase clock adjusting circuit using four phase shifters, as shown in FIG. 19. Referring to FIG. 26, a method of generating a control signal A received by the phase shifter 1 ($266_1$) and a control signal B received by the phase shifter 2 ($266_2$) is the same as that of FIG. 25. In the clock adjusting circuit shown in FIG. 19, the phase shifter 3 outputs a rising edge at timing intermediate between a rising edge output by the phase shifter 1, and a falling edge output by the phase shifter 2.

In case the clock period has a change of ΔPeriod with respect to an original clock period, a clock edge output by the phase shifter 2, as shown by the example of FIG. 25, has a change of ΔPeriod/2.

In FIG. 26, a clock phase output by a phase shifter 3 (266₃) is at a midway point of phases output by the phase shifter 1 (266₁) and the phase shifter 2 (266₂), so that a change amount of clock jitter is ΔPeriod/4. Therefore, a control signal C received by the phase shifter 3 (266₃) may output a value obtained by adding ΔPeriod/4 to the present phase (output of the register 262). The ΔPeriod/4 is obtained, for example, by performing a two-bit shift (right shift) on the ΔPeriod code.

In the same way, a phase output by the phase shifter 3 (266₃) is at a midway point of a phase (ΔPeriod/2 change) output by the phase shifter 2 (266₂) and a phase (ΔPeriod change) output subsequently by the phase shifter 1 (266₁), so that the change amount thereof is 3× (ΔPeriod/4).

Figure 27:
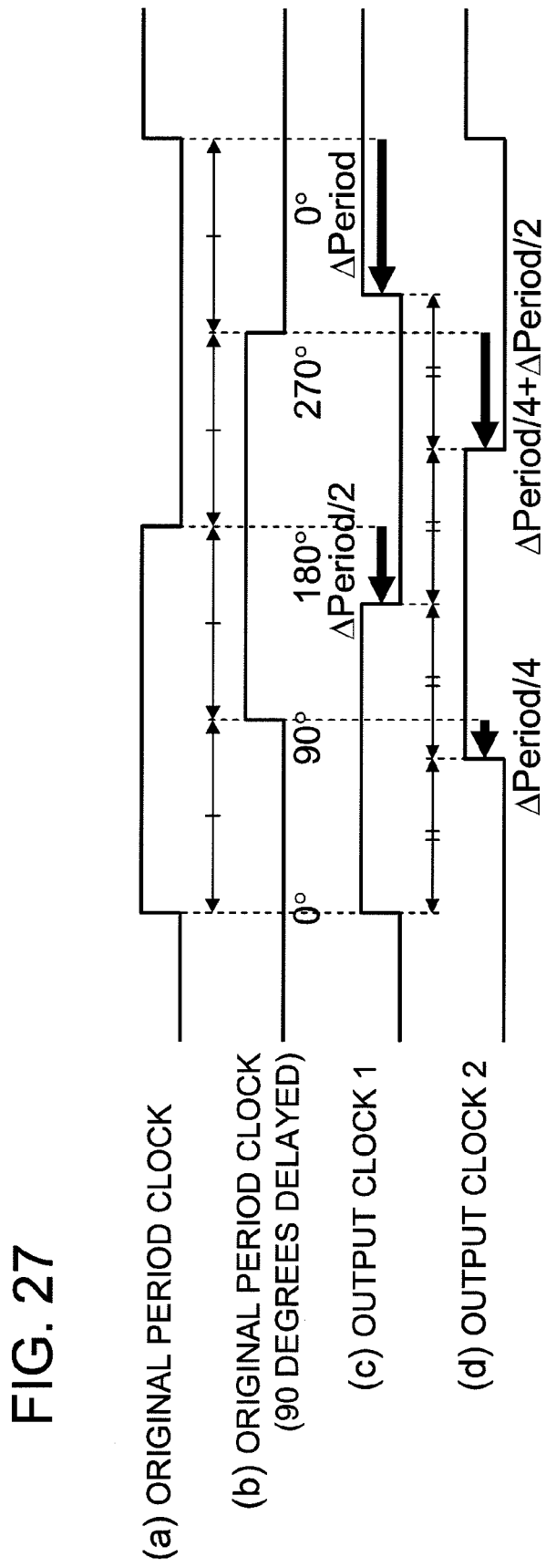
FIG. 27 is a timing waveform diagram describing operation of the circuit of FIG. 26.

However, since this phase is equal to ΔPeriod/2 added to the clock phase output by the phase shifter 3 (266₃), a value obtained by adding ½ of the clock period control signal ΔPeriod to the control signal C given to the phase shifter 3 (266₃) can be used as the control signal D, as in FIG. 26. This aspect is shown as a waveform diagram in FIG. 27. In FIG. 27, (a) is a timing waveform of a clock of the original period, (b) is a timing waveform of a clock that is the original clock delayed by 90 degrees, (c) is a timing waveform of an output clock 1 of FIG. 26, and (d) is a timing waveform of an output clock 2 of FIG. 26. By using the control circuit 260 as in FIG. 26, it is possible to adjust the clock period, while keeping equal intervals of the four clock edges (rising edge and falling edge of the output clock 1, and rising edge and falling edge of the output clock 2).

Figure 28:
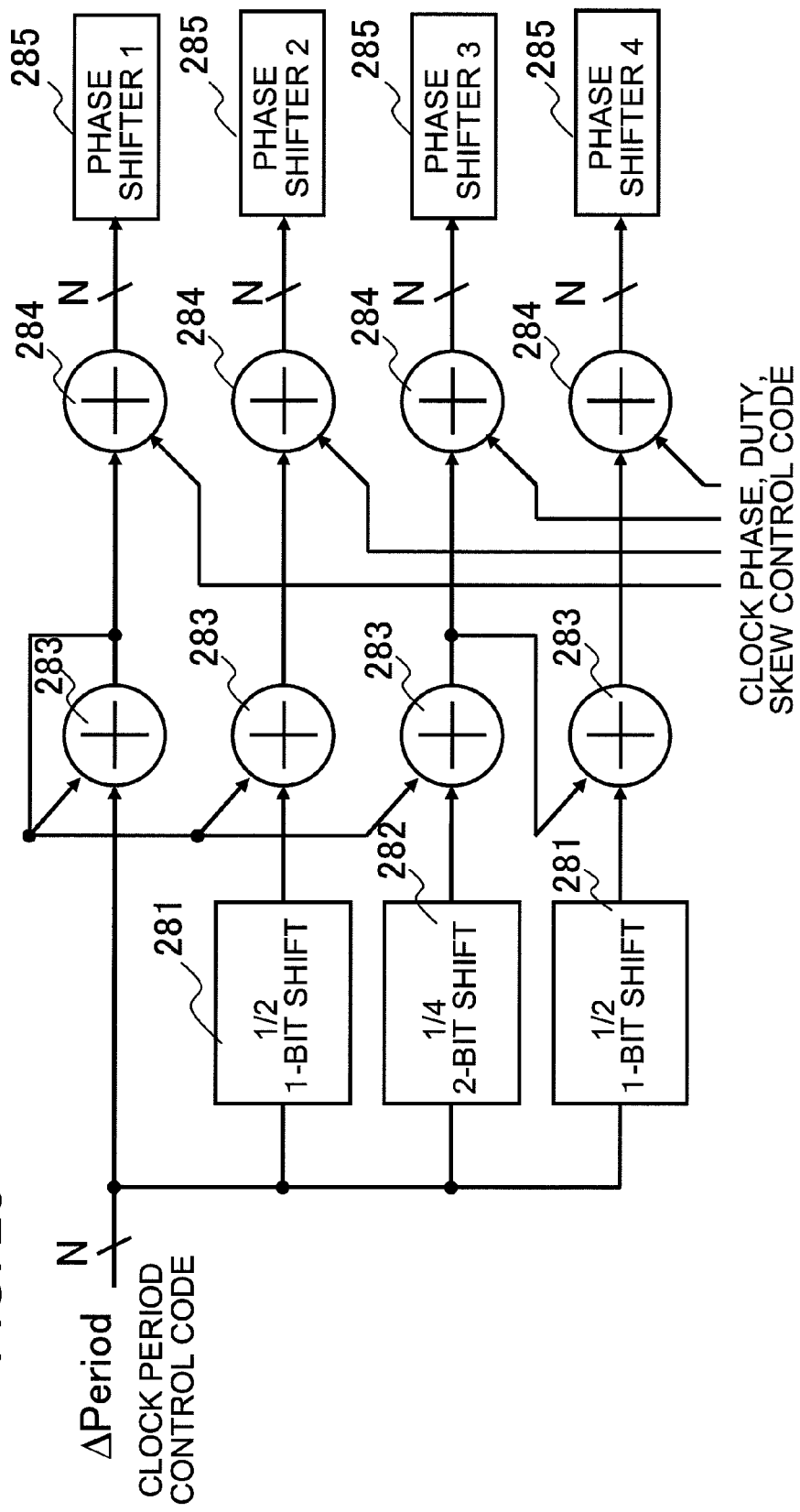
FIG. 28 is a diagram showing an even further configuration of the control circuit of one exemplary embodiment of the present invention.

FIG. 28 is a diagram showing a configuration provided with a function of controlling the clock phase, the duty, or the skew delay, in the control circuit of the present invention as shown in FIG. 26. An N-bit adder 284 is provided witch adds control code for controlling the clock phase, the duty, or the skew delay, between output of adders 283 and input of phase shifters 285.

In the control circuit shown in FIG. 25 and FIG. 26, the clock period is changed while holding the duty ratio of the output clock at approximately 1:1. Here, in case it is desired to also adjust the duty ratio and the like of the output clock, a circuit for this is separately required.

According to the configuration shown in FIG. 28, by further adding control code individually to the control signals A to D generated in the control circuit shown in FIG. 26, it is possible to individually adjust timing of four clock edges. In this way, it is possible to adjust the duty, delay, or the like, of the output clock.

The control circuit of the clock adjusting circuit of the present exemplary embodiment can also be configured so as to output a control signal programmed in advance by the user.

Figure 29A:
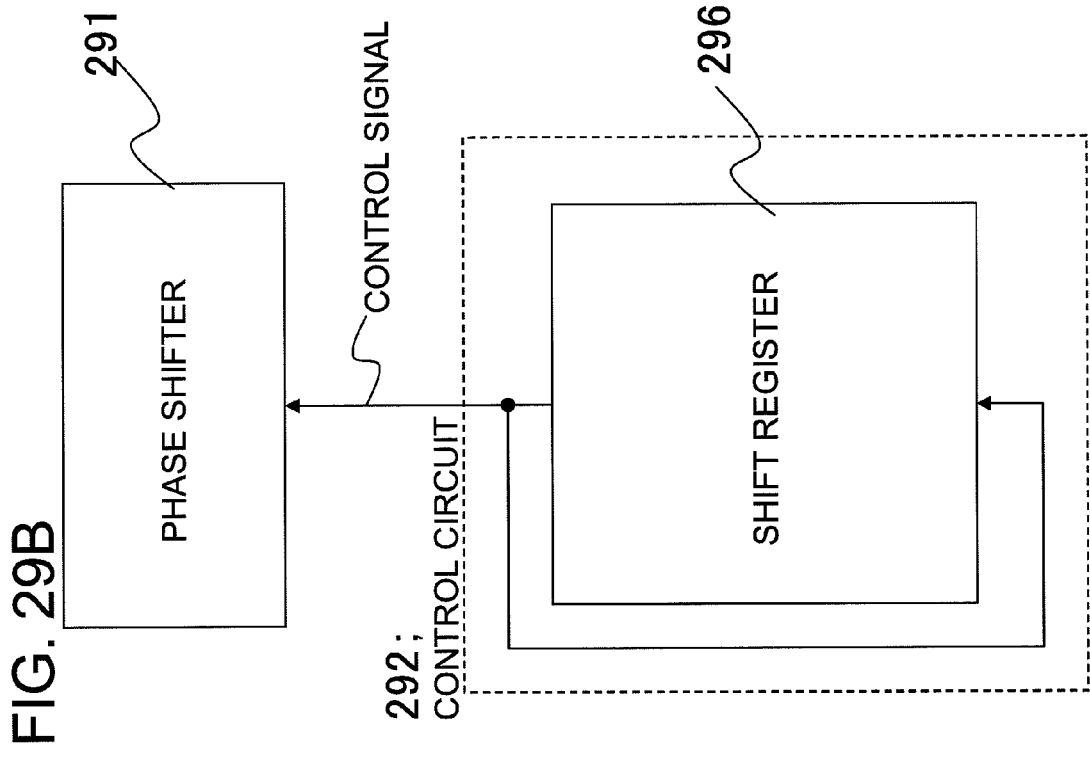
FIGS. 29A and 29B are diagrams showing configurations of a clock adjusting circuit of another exemplary embodiment of the present invention.

FIG. 29A is a diagram showing a configuration of a control circuit of another exemplary embodiment of the present invention, and is a diagram showing one example of a configuration of the control circuit that uses memory. The user writes a control signal pattern for a phase shifter 291 to the memory 293 in advance, and by sending this data sequentially to the phase shifter 291, a clock signal of an arbitrary pattern is generated. An address obtained by decoding a count value of a counter 295 by an address decoder 294 is supplied to the memory 293.

Figure 29B:
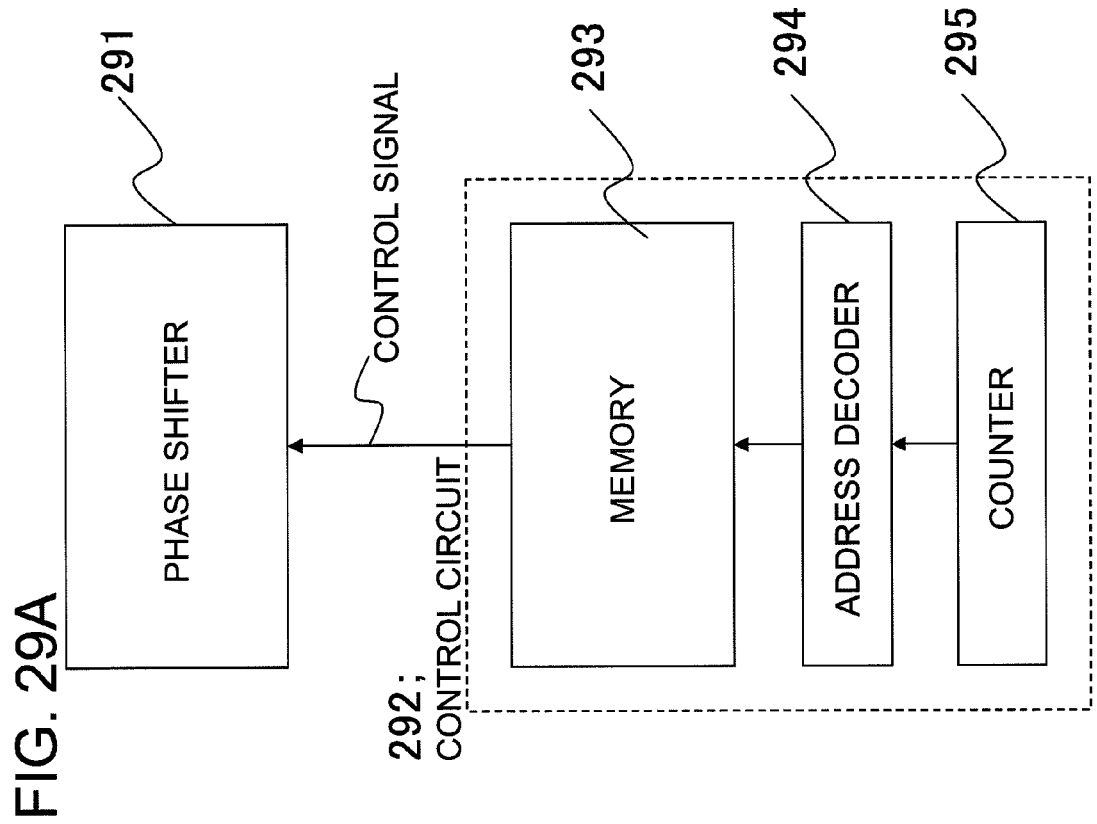

FIG. 29B is a diagram showing one example of a configuration of a control circuit that uses a shift register 296. The user writes a control signal pattern for the phase shifter 291 to the shift register 296 in advance, and by sequentially transmitting this data to the phase shifter 291 while shifting the data, a clock signal of an arbitrary pattern is generated.

Figure 30:
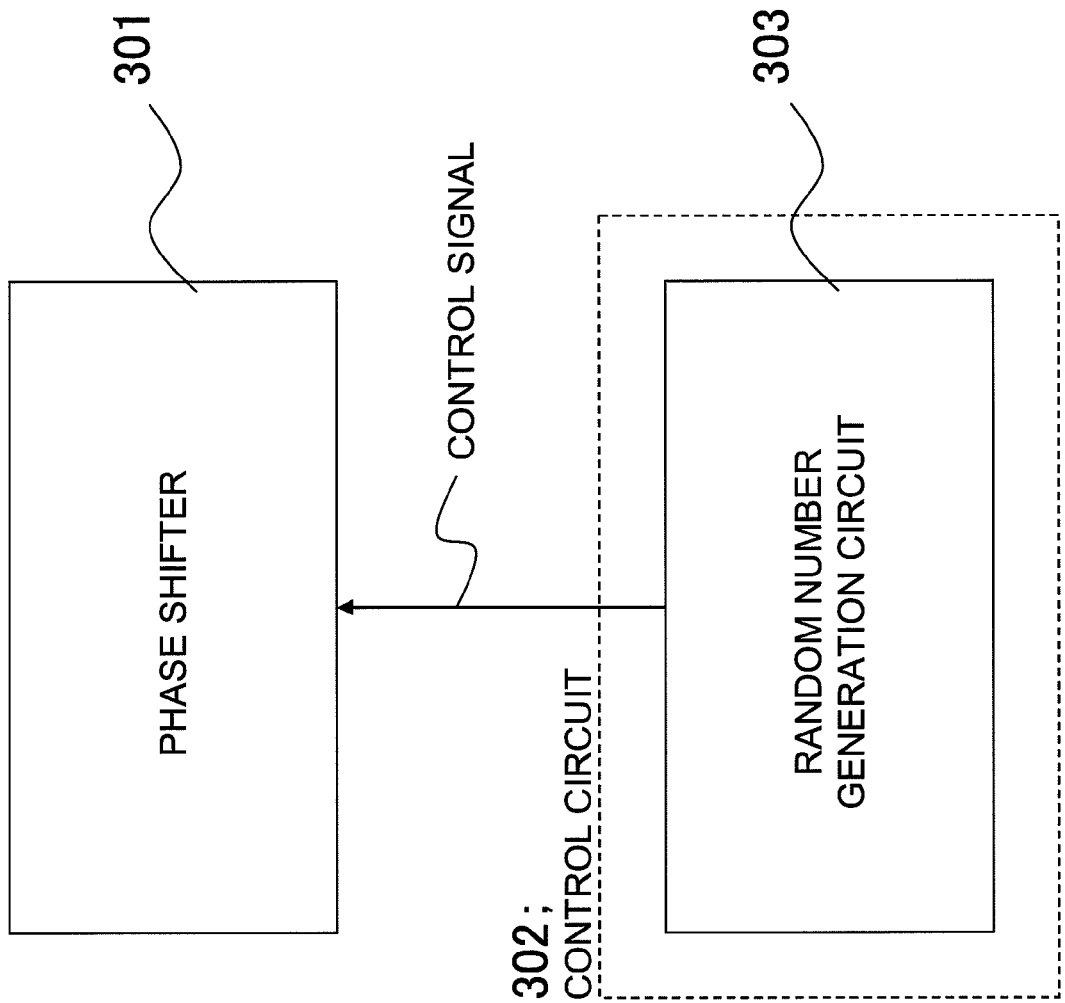
FIG. 30 is a diagram showing a configuration of the clock adjusting circuit of another exemplary embodiment of the present invention.

FIG. 30 is a diagram showing a configuration of a control circuit of another exemplary embodiment of the present invention and is an example that uses a random number generation circuit 303. By using a random number as a control signal of a phase shifter 301, it is possible to generate random jitter. This is a configuration that is necessary in case spread spectrum or the like is realized. Furthermore, by making the random jitter large in a pseudo manner, it is possible to perform an operation margin test or the like with respect to the random jitter of a semiconductor integrated circuit.

Figure 31:
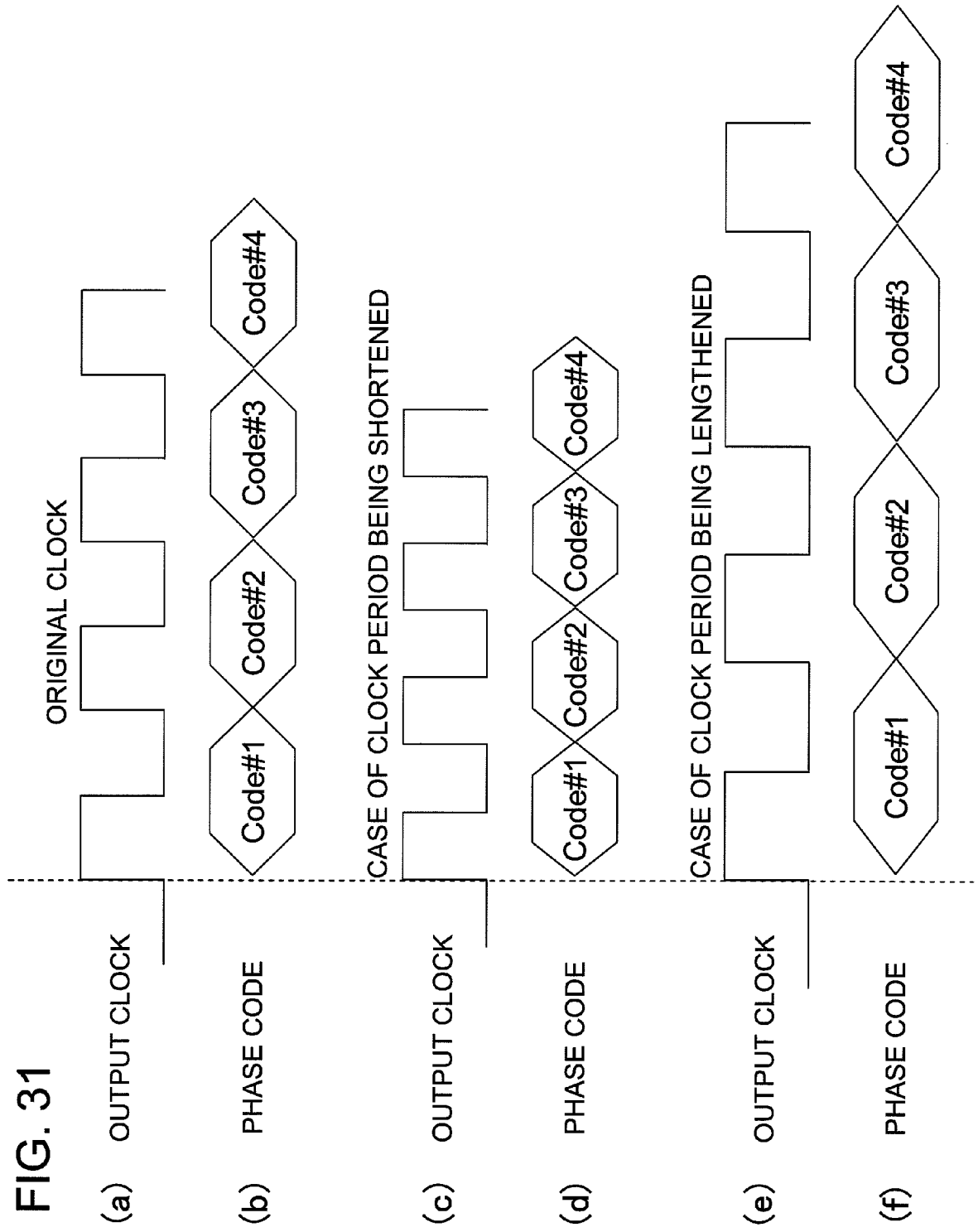
FIG. 31 is a diagram describing operation of an exemplary embodiment of the present invention.

In case a clock adjusting circuit of the present exemplary embodiment is used to perform adjustment of a clock period, as shown in FIG. 31, the control signal supplied to the phase shifter must be supplied synchronously with an output clock.

For example, in case the clock period is shortened by 10%, the period of the control signal of the phase shifter must also be shortened by 10%. As a result, it is desirable that the control circuit be driven by an output clock of the phase shifter.

Figure 32:
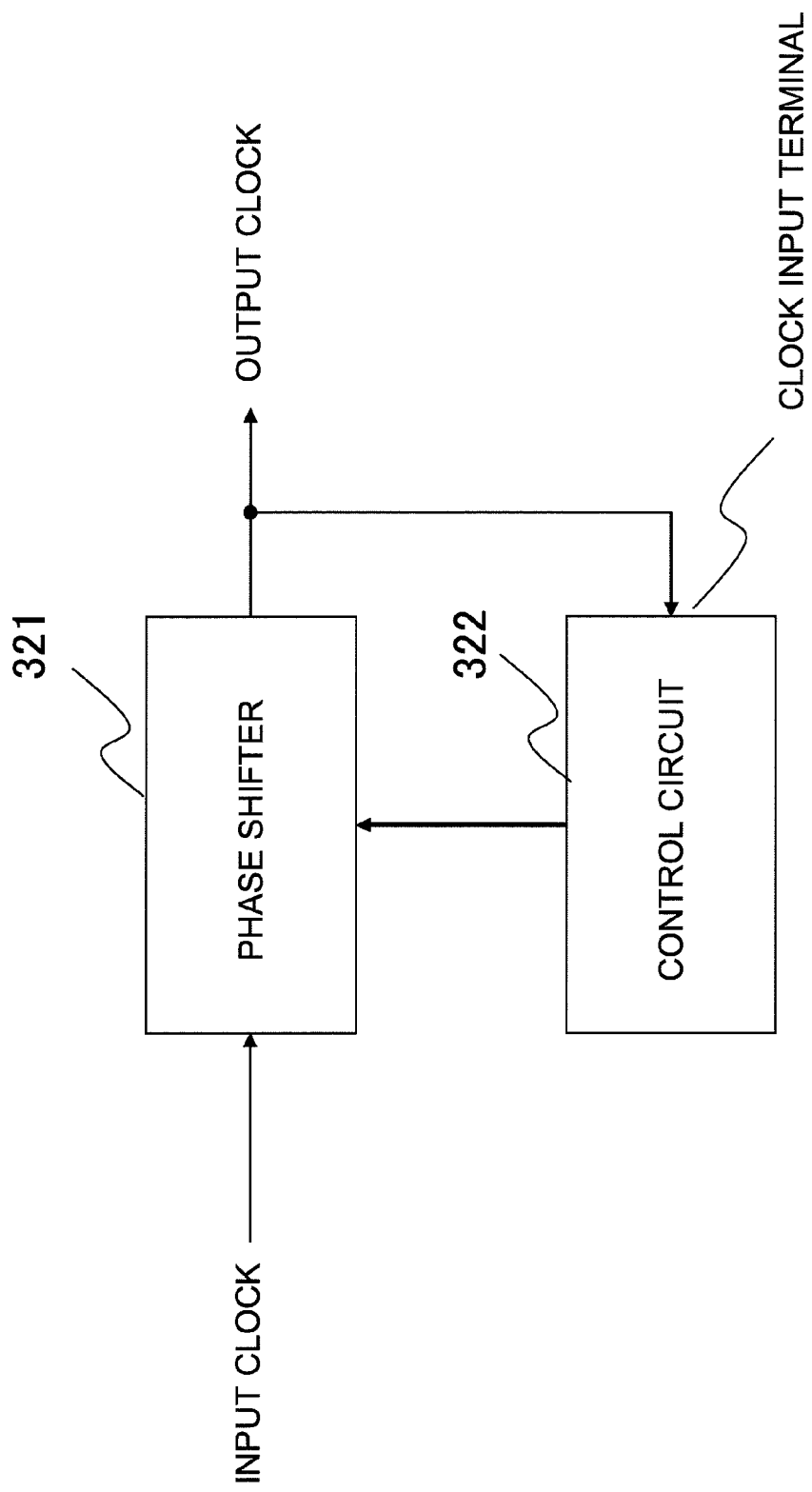
FIG. 32 is a diagram showing a configuration of the clock adjusting circuit of another exemplary embodiment of the present invention.
Figure 33:
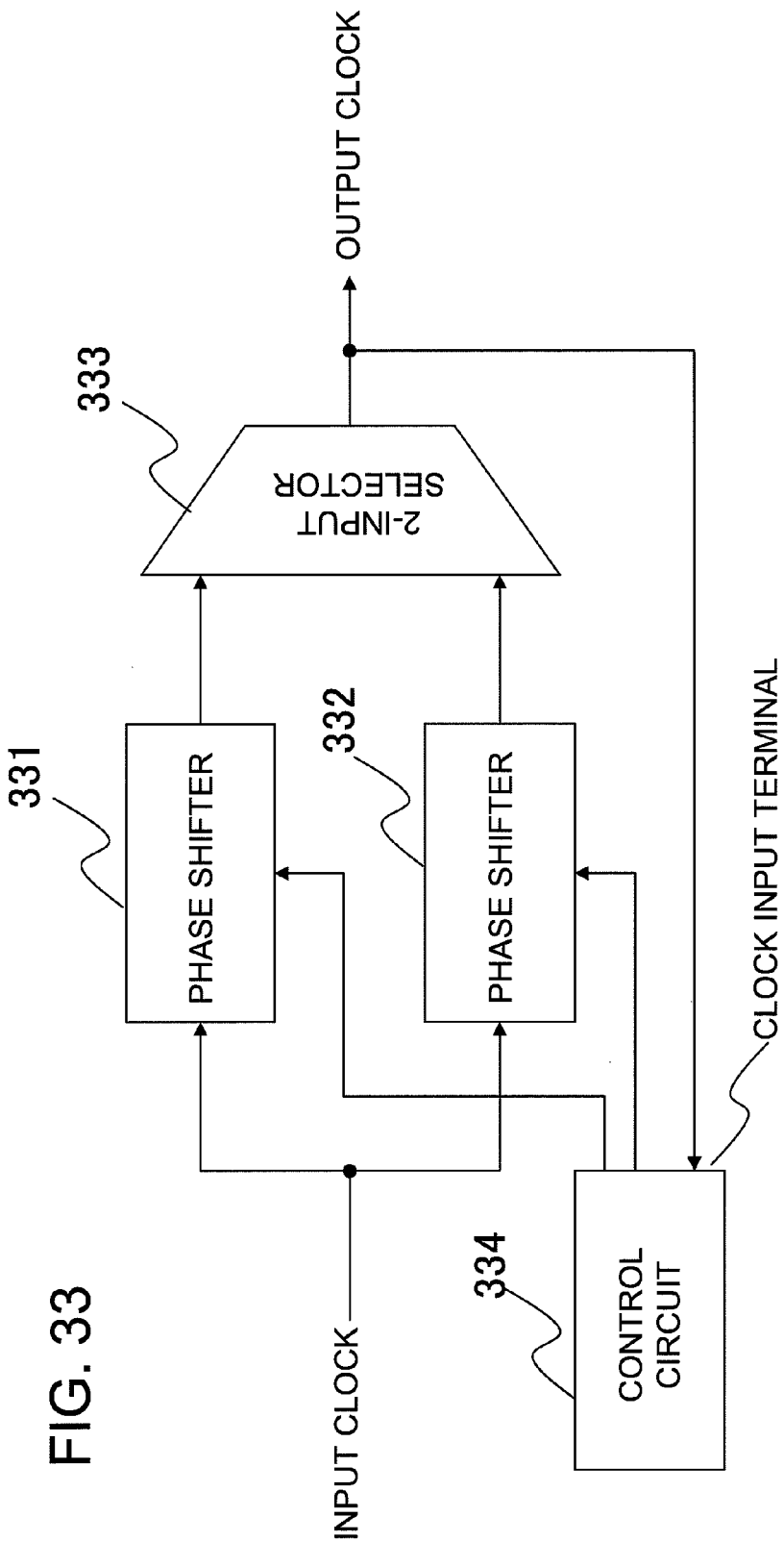
FIG. 33 is a diagram showing a configuration of the clock adjusting circuit of another exemplary embodiment of the present invention.
Figure 34:
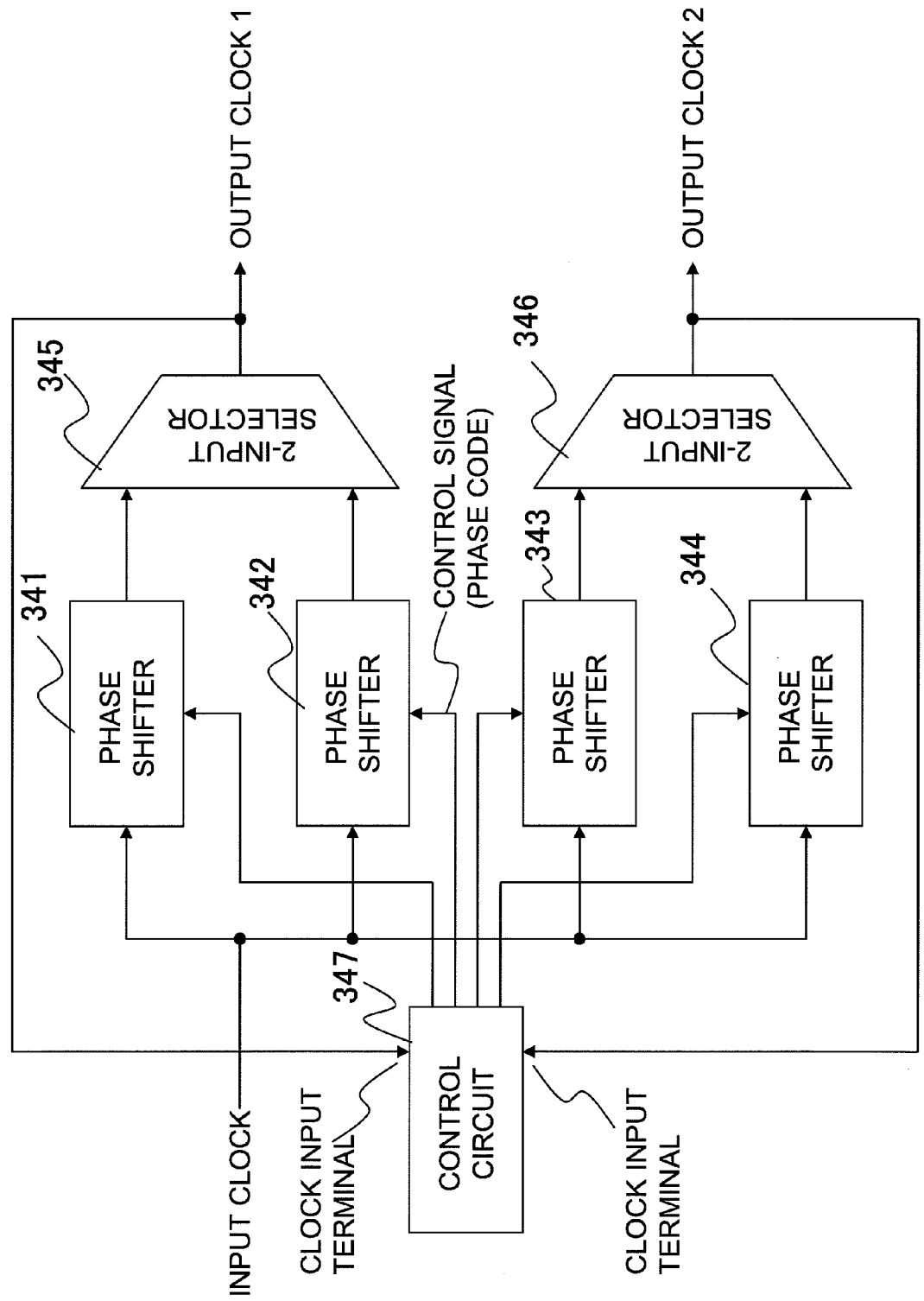
FIG. 34 is a diagram showing a configuration of the clock adjusting circuit of another exemplary embodiment of the present invention.

FIG. 32, FIG. 33, and FIG. 34 illustrate examples of connections of clock input terminals of control circuits, with respect to circuits shown in FIGS. 15A, 15B, FIG. 16, and FIG. 19.

In FIG. 32, an output clock signal of a phase shifter 321 is received by a clock input terminal of a control circuit 322.

In FIG. 33, an output clock signal of a selector 333 is received by a clock input terminal of a control circuit 334.

In FIG. 34, output clock signals of selectors 345 and 346 are respectively received by clock input terminals of a control circuit 347.

Figure 35:
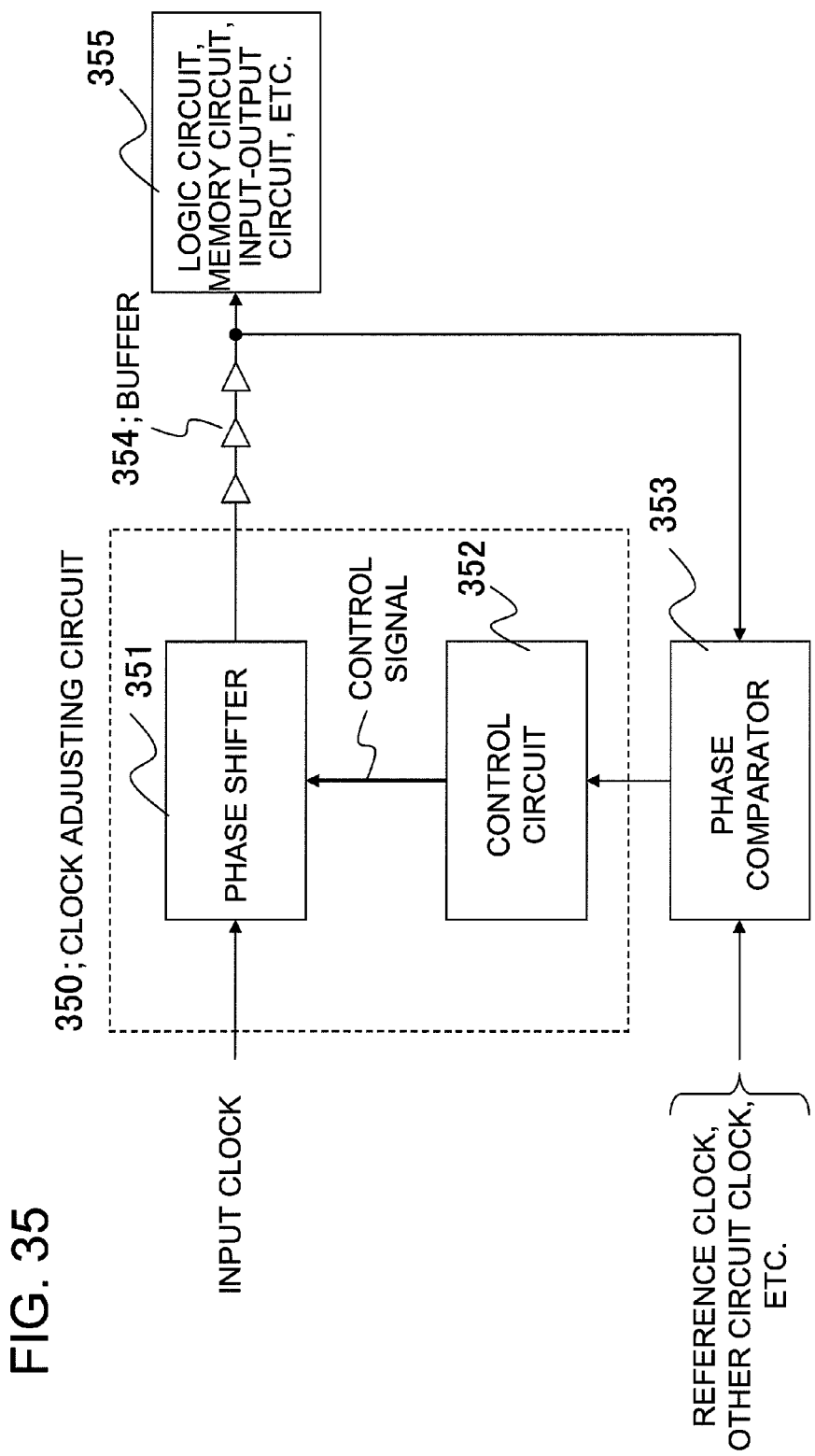
FIG. 35 is a diagram showing a configuration of the clock adjusting circuit of another exemplary embodiment of the present invention.

FIG. 35 is an example in which a phase comparator 353 is connected to a control circuit 352 of a clock adjusting circuit 350 of the present exemplary embodiment. In cases of adjusting a phase of an output clock of the clock adjusting circuit 350, it is necessary to comprehend a relative phase relationship with a clock that is referential, such as a reference clock, a clock of another circuit, or the like.

The phase comparator 353 can output information as to which clock among two input clocks has a phase that is advanced or delayed.

By using a circuit configuration as shown in FIG. 35, when a value of the control signal of the phase shifter is set to some level, it is possible to comprehend whether a phase of an output clock signal of the clock adjusting circuit 350 matches a phase of the reference clock or a clock of another circuit.

In case the control circuit 352 adjusts a clock phase, by using information output from this phase comparator 353, a phase match of higher accuracy is possible.

In the present exemplary embodiment, the clock adjusting circuit 350 can set a phase of a clock signal inside a semiconductor integrated circuit to an arbitrary phase, while making a comparison with a phase of another clock.

Figure 36A:
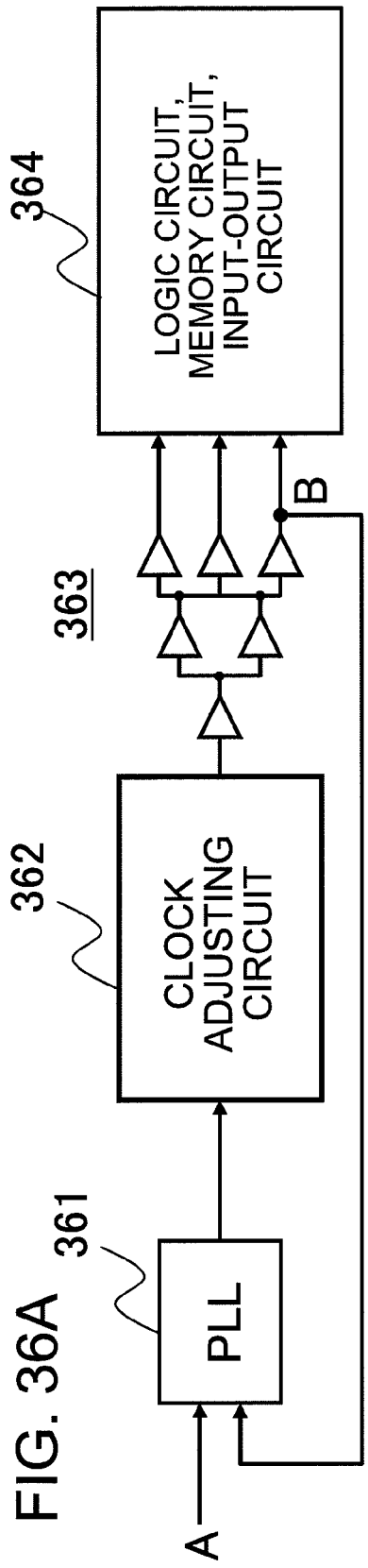
FIGS. 36A and 36B are diagrams showing configurations of an exemplary embodiment of the present invention.

However, in cases of clock systems as shown in FIG. 36A, a phase of a clock signal inside a semiconductor integrated circuit (point B) undergoes feedback control by a PLL 361 so as to match a phase of a clock signal from outside (point A). As a result, it is not possible to arbitrarily set the phase of the clock at point B.

Figure 36B:
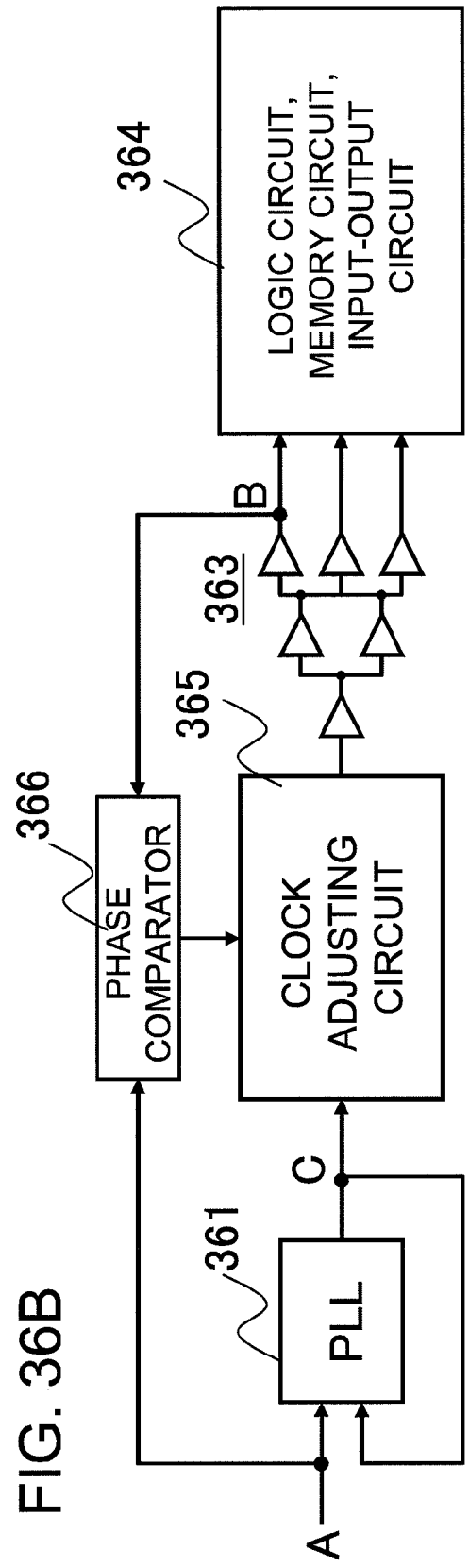

Consequently, as shown in FIG. 36B, by configuring the clock system, it is possible to arbitrarily control the phase of the clock inside a semiconductor integrated circuit.

In the configuration of FIG. 36B, the PLL 361 performs feedback control so that the phases of the clock signals at point A and point C match, but the phase of the clock signal at point B is arbitrary. In case it is desired to adjust a relative phase different of the clock signals at point A and point B, output of the phase comparator 366 may be monitored while adjusting the clock phase by the clock adjusting circuit.

Figure 37:
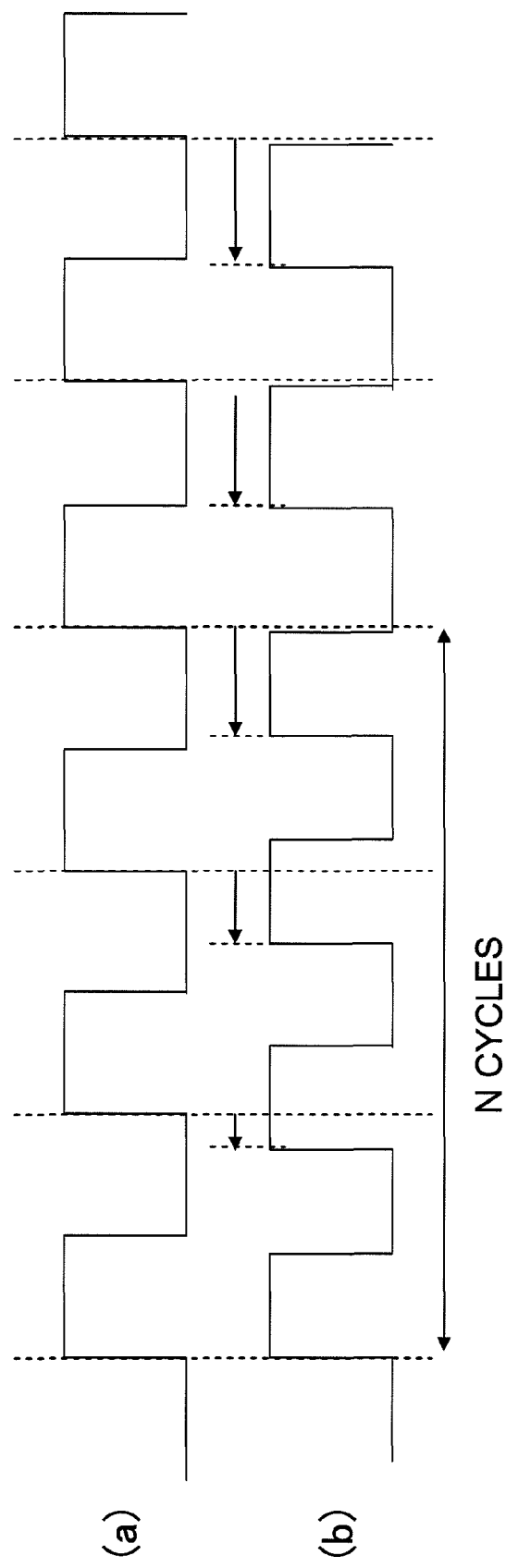
FIG. 37 is a waveform diagram describing operation of one exemplary embodiment of the present invention.

By mounting the circuit having functions as described above inside a semiconductor integrated circuit, as shown in FIG. 37, it is possible to reduce or increase a clock period of arbitrary N cycles.

For example, by providing an appropriate control code ΔPeriod during N cycles of the output clock, by the control circuit shown in FIG. 24 to FIG. 26, it is possible to obtain a clock signal as in FIG. 37 in which the clock period is reduced to only a desired value. (a) and (b) of FIG. 37 represent input (input of PLL) of the clock adjusting circuit and an output clock of the clock adjusting circuit.

By providing a non-zero value to the ΔPeriod by the control circuit shown in FIG. 24 to FIG. 26, the value of the control signal gradually increases or decreases. As a result, an advance amount or a delay amount of the phase output by the phase shifter gradually increases or decreases.

With respect to the waveform of (b) of FIG. 37, this corresponds to the phase difference of the output clock and the input clock gradually increasing during N cycles. After N cycles, if the ΔPeriod is returned to zero, the period of the output clock is the same as the period of the input clock.

Figure 38:
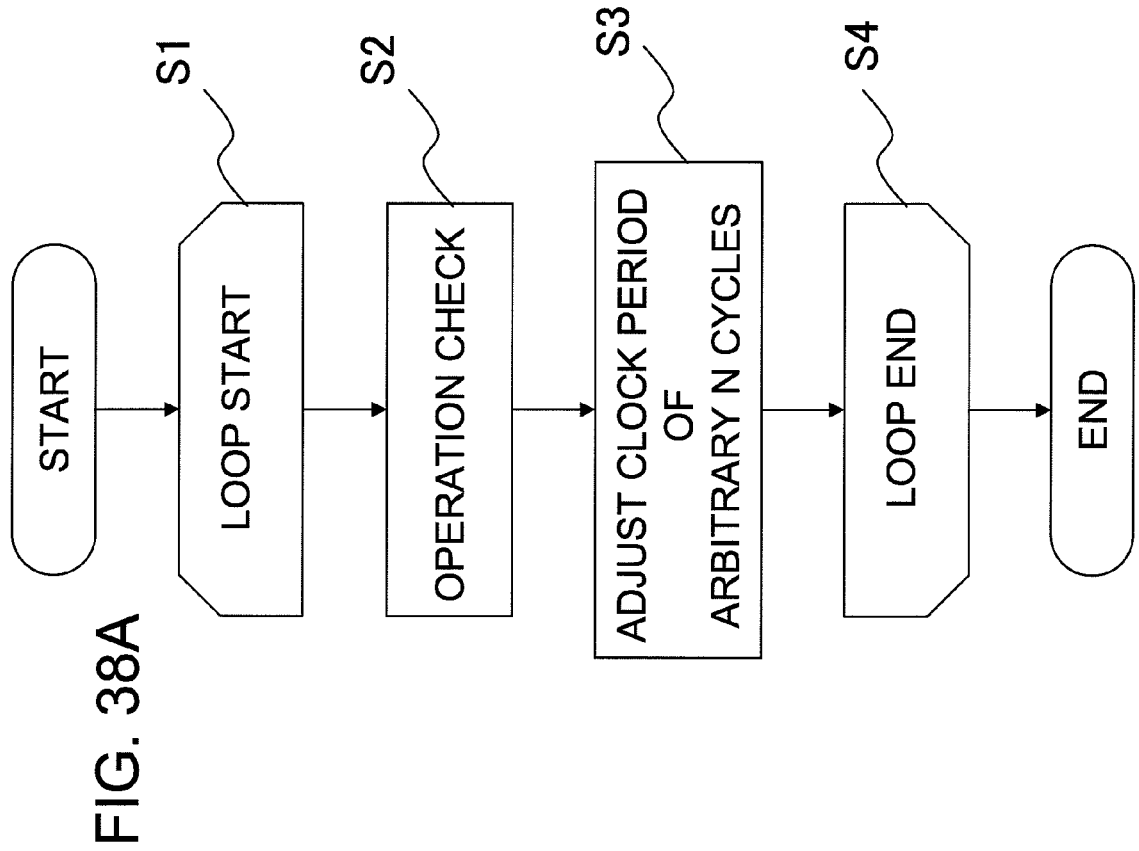
FIGS. 38A and 38B are, respectively, a flow diagram showing a test procedure, and a descriptive diagram, of one exemplary embodiment of the present invention.

In a test of the semiconductor integrated circuit, as in a flowchart shown in FIG. 38A, by increasing or reducing the clock period and executing a test pattern of arbitrary N clock cycles, it is possible to search for a limiting clock period at which the circuit operates normally. A clock period during N cycles is adjusted, and operation is checked (a PASS/FAIL judgment).

For example, it is possible to examine a margin with regard to how much higher a frequency than a prescribed operation frequency a logic circuit can operate at.

In a test using an LSI tester, a similar test can be performed by changing a frequency of a reference clock supplied from outside, but since it is desired to perform this type of test with a semiconductor integrated circuit mounted on a printed circuit board, the test of the present invention is useful.

Furthermore, in a conventional clock adjusting circuit disclosed in Patent Document 1 or the like, the number of clock cycles in which consecutive clock periods can be increased or reduced is limited, and it has not been possible to improve completeness of the test; however, in comparison thereto, a clock modulation circuit of the present invention is useful.

Figure 39:
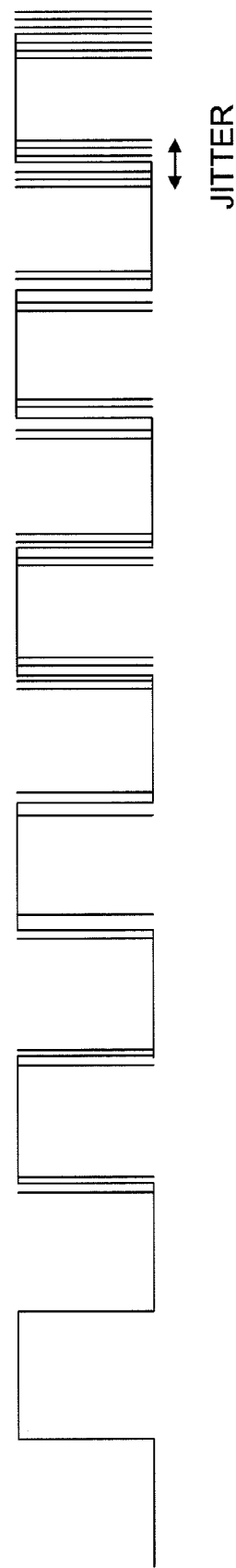
FIG. 39 is a diagram describing jitter in the present exemplary embodiment.

Furthermore, by using the clock modulation circuit of the present invention, it is possible also to generate jitter as shown in FIG. 39.

For example, if reducing a certain clock period and increasing a subsequent clock period are repeated, since clock edge timing does not greatly diverge from an original phase, it is possible to examine operation margin for a clock period, while maintaining synchronization with a circuit of another clock domain or an external circuit.

Figure 40:
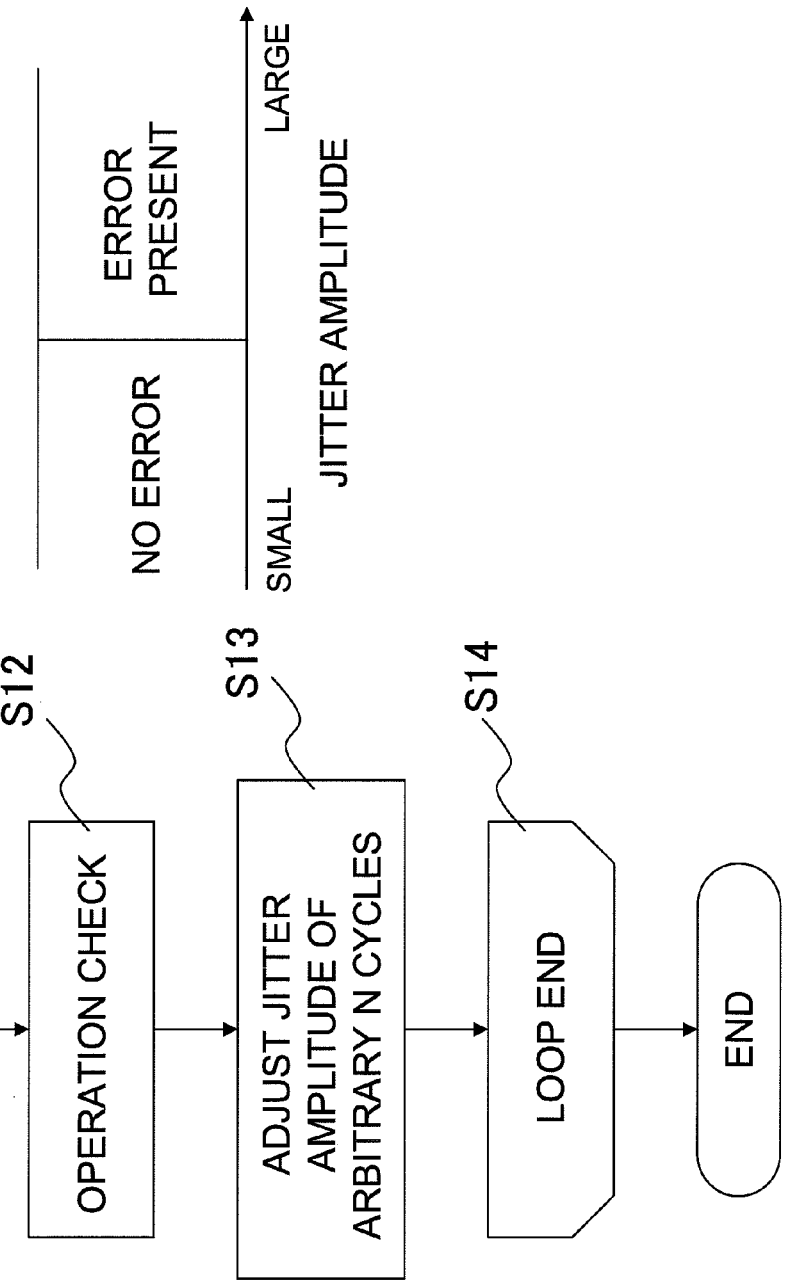
FIGS. 40A and 40B are, respectively, a flow diagram showing a test procedure, and a descriptive diagram, of one exemplary embodiment of the present invention.

FIGS. 40A and 40B are diagrams showing one example of a test procedure for the semiconductor integrated circuit provided with the clock adjusting circuit of the above described exemplary embodiment, and is a flowchart for testing an operation limitation while increasing and decreasing clock jitter. This test is able, for example, to examine margin as regards how high a clock frequency a logic circuit can operate at, while maintaining synchronization with an external circuit during the test. Furthermore, in an input-output circuit or the like, usage is also possible in a test of jitter tolerance, such as to what level of jitter is possible, while performing communication correctly.

Figure 41:
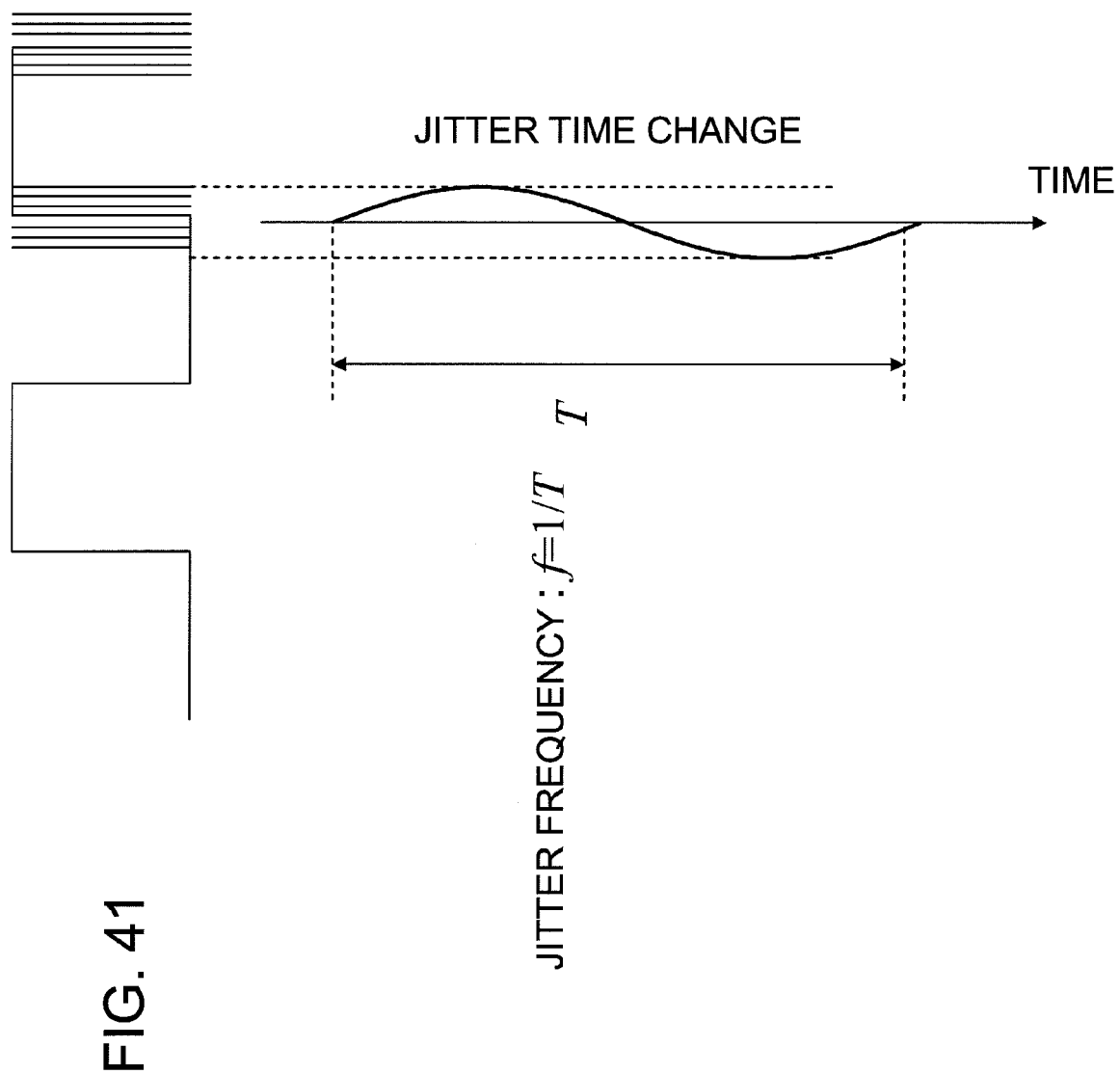
FIG. 41 is a diagram describing jitter frequency.

In addition, using this clock modulation circuit, it is also possible to change jitter frequency. The jitter refers to timing of an actual clock edge being around a vicinity of timing of an original clock edge, but the periodic jitter as shown in FIG. 41 has a particular frequency at a timing change of the clock edge.

Some input-output circuits have a function to follow timing change, but in general cannot follow jitter that changes at high speed, but can easily follow jitter than changes at low speed.

In such cases of testing circuits in which a characteristic changes by jitter frequency, it is important to perform the test while changing the jitter frequency.

FIGS. 42A and 42B are diagrams showing one example of a test procedure for the semiconductor integrated circuit provided with the clock adjusting circuit of the above described exemplary embodiment, and is a flowchart for cases in which the test is performed while changing the jitter frequency. By this test it is possible to monitor what level of jitter frequency the circuit is able to follow.

Figure 43B:
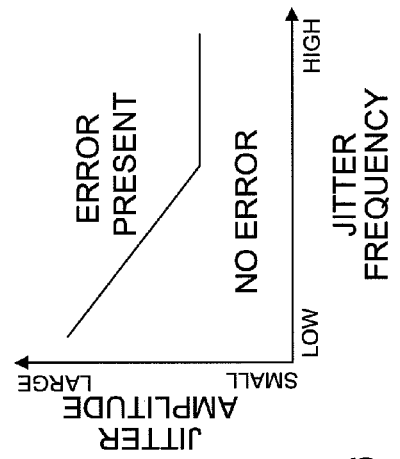
FIGS. 43A and 43B are, respectively, a flow diagram showing a test procedure, and a descriptive diagram, of one exemplary embodiment of the present invention.
Figure 43A:
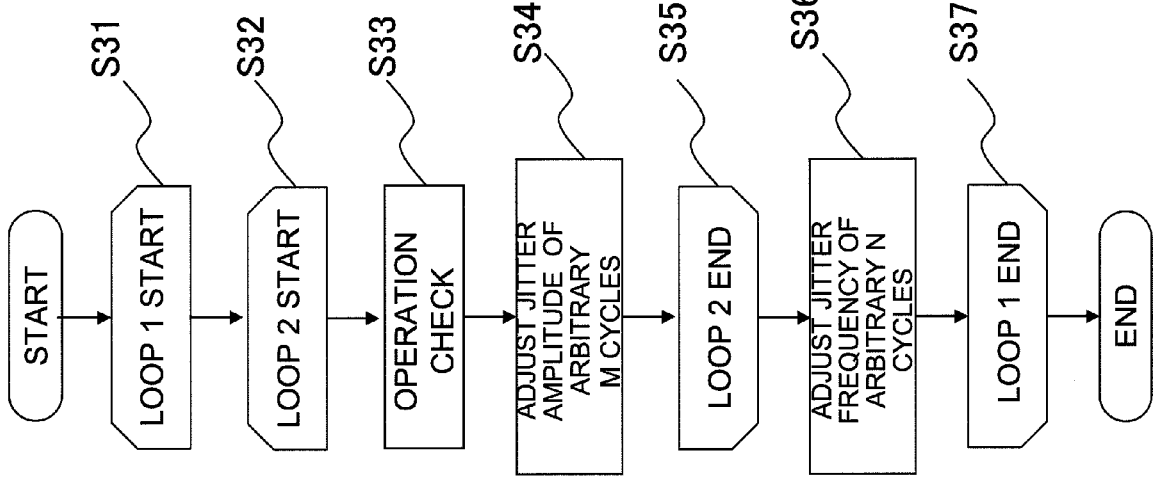

FIGS. 43A and 43B are diagrams showing one example of a test procedure for the semiconductor integrated circuit provided with the clock adjusting circuit of the above described exemplary embodiment, and is a flowchart for a case in which an operation test of the circuit is performed by sweeping, in two dimensions, jitter amplitude and jitter frequency. In a loop on an outer side of a loop 1 start and a loop 1 end, the jitter frequency is swept, and in a loop on an inner side of a loop 2 start and a loop 2 end, jitter amplitude is swept based on a given jitter frequency.

In general, in input-output circuits and the like, the lower the jitter frequency is, the larger the jitter amplitude that can be withstood, and if jitter frequency becomes high, only jitter of small amplitude can be withstood.

In a test shown in FIGS. 43A and 43B, a relationship of jitter frequency and allowable jitter amplitude can be obtained.

This is an important test for serial communication circuits and the like, in particular, but it has not been possible to perform the test with a conventional LSI tester or BIST (Built In Self Test) circuits.

Figure 44C:
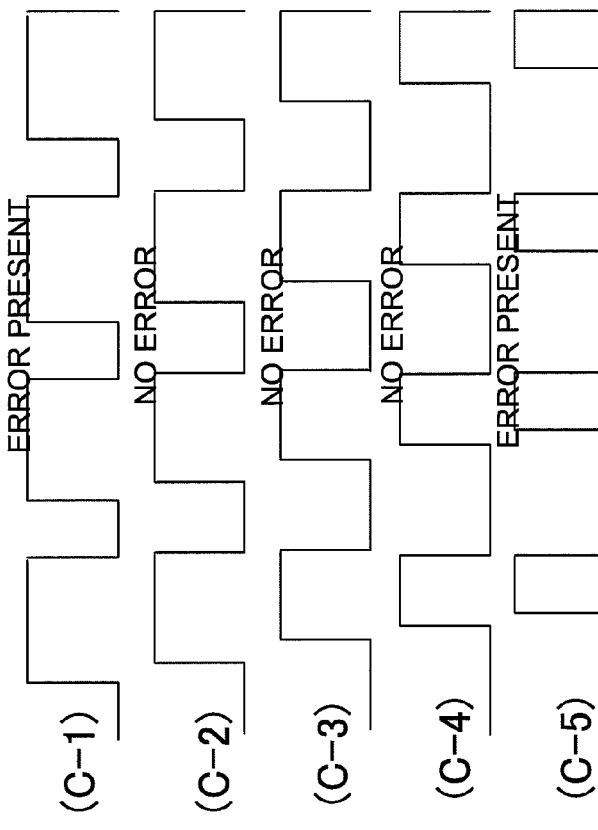
FIGS. 44A to 44C are, respectively, flow diagrams showing a test procedure, a descriptive diagram, and a waveform diagram, of one exemplary embodiment of the present invention.
Figure 44B:
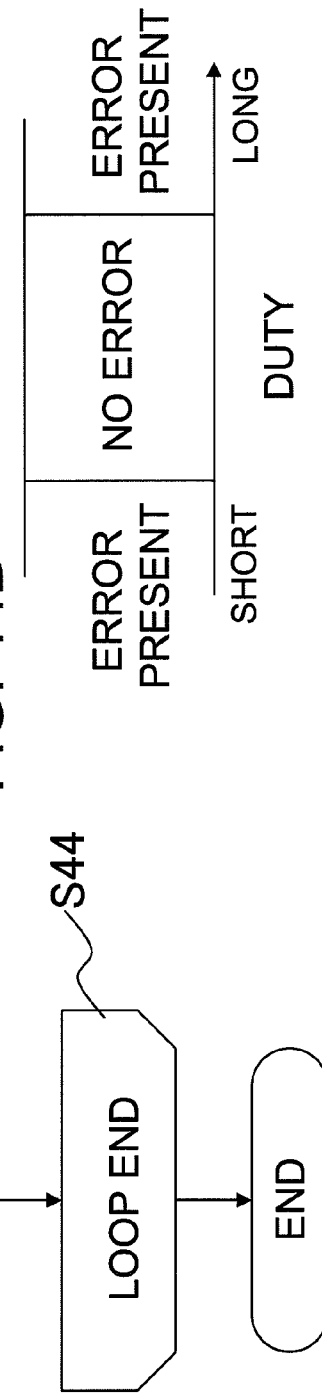
Figure 44A:
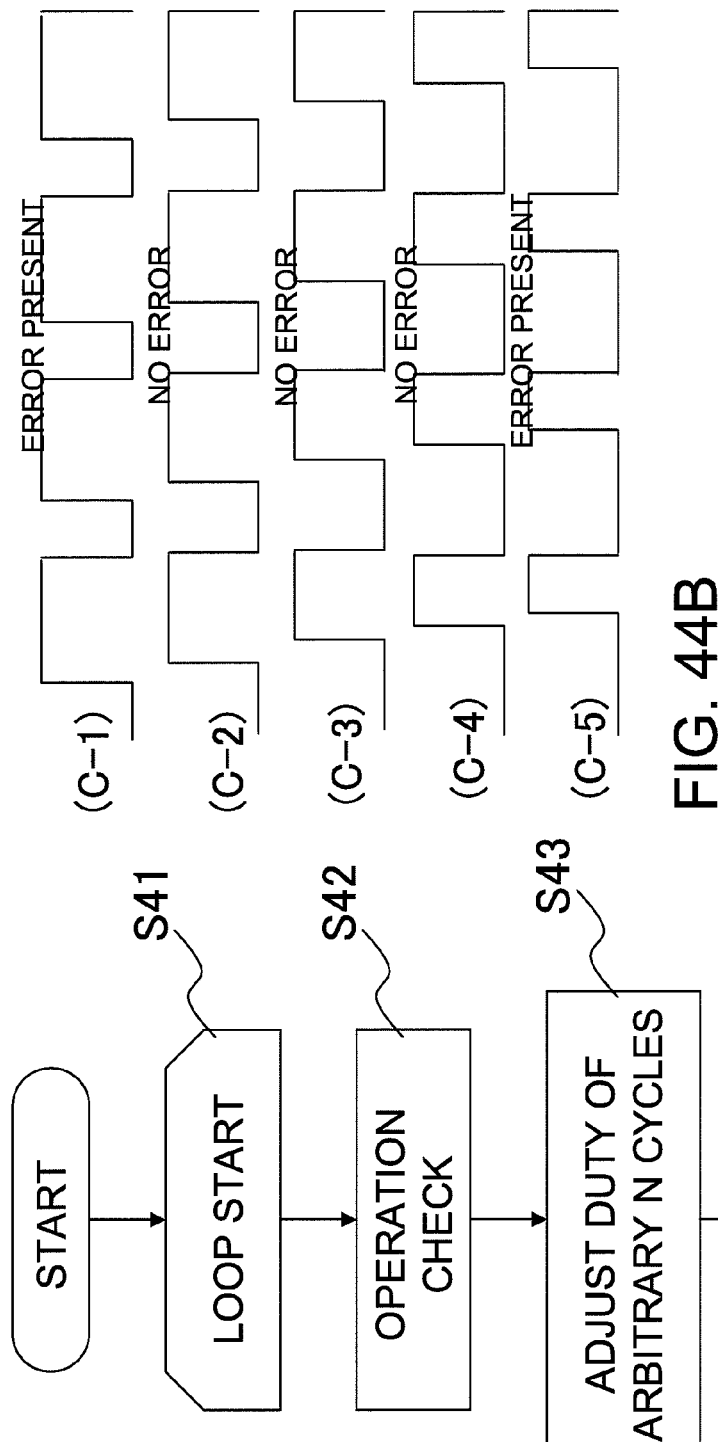

FIGS. 44A to 44C are diagrams showing one example of a test procedure for the semiconductor integrated circuit provided with the clock adjusting circuit of the above described exemplary embodiment; the drawing shows a flowchart of a test to search for a limit at which the circuit operates correctly, while changing the duty ratio of the clock signal (FIG. 44A), and an outline of an evaluation result (FIG. 44B). In (c-1) to (c-5) of FIG. 44C show examples of waveforms of an output clock in case the duty ratio is changed in step S43.

In general, when the duty ratio is 1:1, errors are least likely to occur, and if there is an extreme difference in the duty ratio, the circuit no longer operates normally.

In this test, it is possible to test an operation margin of the circuit with respect to a duty distortion of the clock signal.

In a test using a conventional LSI tester, since adjustment of the clock signal inside a semiconductor integrated circuit is not possible, this type of test is not possible, but realization is possible with the semiconductor integrated circuit of the present invention and a test method thereof.

Figure 45B:
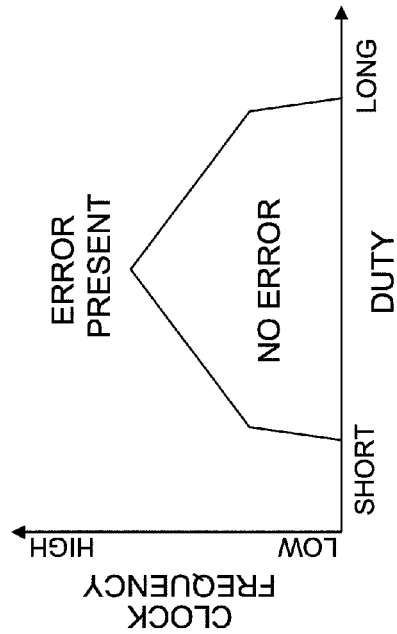
FIGS. 45A and 45B are, respectively, a flow diagram showing a test procedure, and a descriptive diagram, of one exemplary embodiment of the present invention.
Figure 45A:
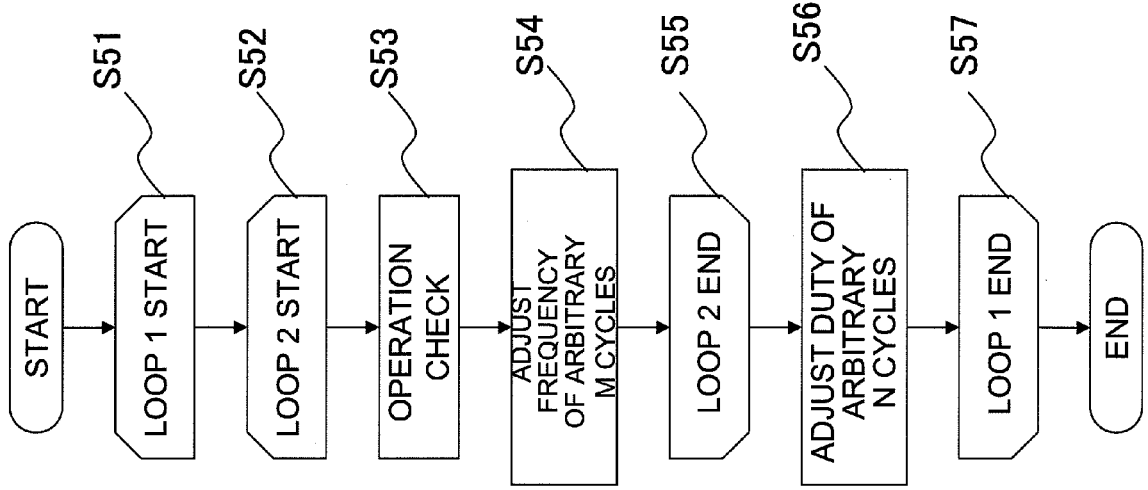

FIGS. 45A and 45B are diagrams showing one example of a test procedure for the semiconductor integrated circuit provided with the clock adjusting circuit of the above described exemplary embodiment, and is a flowchart for performing a test on a circuit, while making a two dimensional sweep of two parameters, the clock frequency and the duty ratio FIG. 45A), and an example of a test result thereof (SHMOO plot) (FIG. 45B).

In general, in case a clock duty ratio is not appropriate, there is a tendency for a limiting frequency, at which the circuit can operate, to decrease. This type of test is appropriate for performing a test as to whether adequate operation is possible at a prescribed operation frequency even when the duty breaks down within a prescribed range. Furthermore, by searching for a setting for the duty at which an operation limit frequency is highest, and making a setting, it is possible to improve operation margin of the semiconductor integrated circuit.

FIG. 46 shows an example of a clock waveform in case clock skew is adjusted between different clock domains. A clock of a clock domain under test is delayed or advanced with respect to a reference, based on the control signal, from outside a chip.

In general, a clock phase is often out of alignment between different clock domains. FIGS. 47A and 47B are diagrams showing gone example of the test procedure for the semiconductor integrated circuit provided with the clock adjusting circuit of the above described exemplary embodiment, and is a flowchart for testing tolerance with regard to misalignment (skew) of a clock phase.

In general, when the clock phase is in a central vicinity, it is possible to perform communication normally with other clock domains, but if the clock phase is advanced too much or is delayed too much, an error occurs. Recent semiconductor integrated circuits often have a plurality of clock domains, but along with speeding up of clock frequency, timing margin is reduced, and there are cases of timing errors occurring in communication between different clock domains and the like.

In a test that uses an LSI tester, since it is not possible to adjust a clock phase inside the LSI, it is not possible to test operation margin with regard to this type of skew.

The semiconductor integrated circuit provided with the clock adjusting circuit of the present invention and the test method thereof make this possible.

Figure 48B:
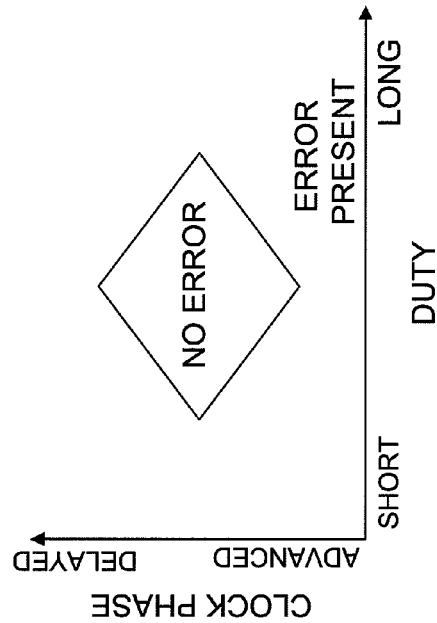
FIGS. 48A and 48B are, respectively, a flow diagram showing a test procedure, and a descriptive diagram, of one exemplary embodiment of the present invention.
Figure 48A:
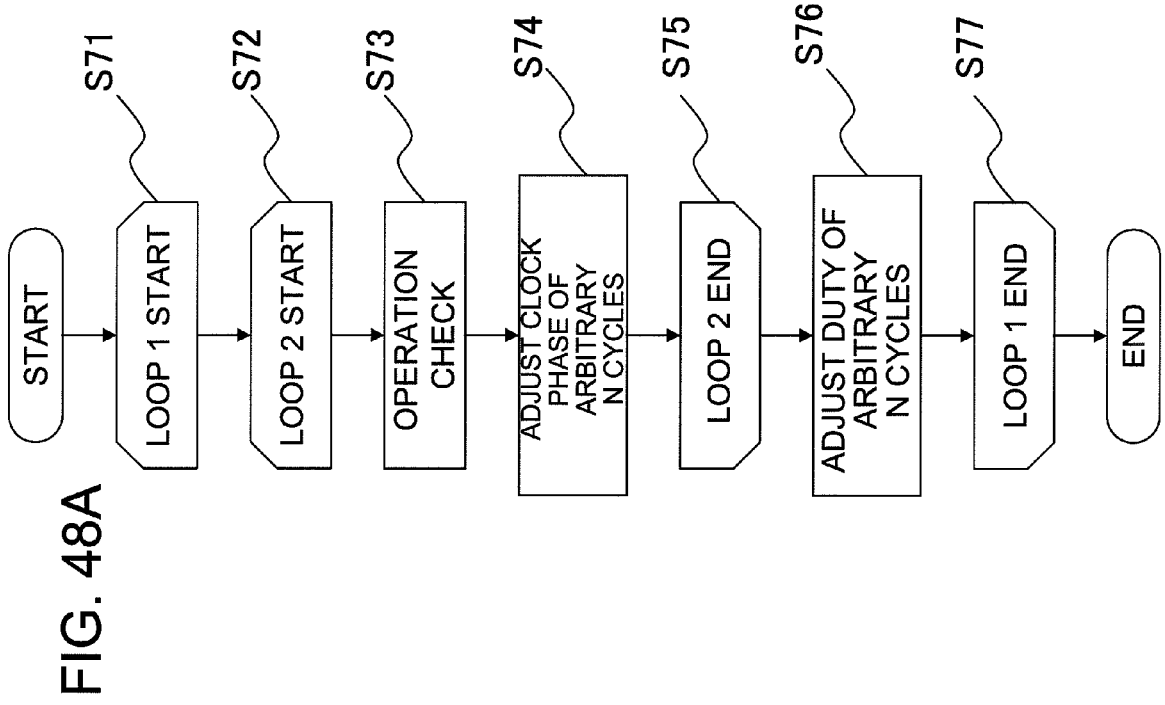

FIGS. 48A and 48B are diagrams showing one example of a test procedure for the semiconductor integrated circuit provided with the clock adjusting circuit of the above described exemplary embodiment, and shows an example of a flowchart for a test in which two parameters, the duty ratio of the clock signal and the skew, are swept in two dimensions (FIG. 48A, and a test result (FIG. 48B)

In general, when duty ratio is set to an appropriate value, the operation margin becomes large with respect to the clock skew, and in the same way, if the clock skew is set to an appropriate value, the operation margin becomes large with respect to duty distortion. If this fact is applied, it is possible to search for a set value of the skew or the duty ratio at which the operation margin is largest.

By performing the margin test of the semiconductor integrated circuit as described above when a selection test is done before shipping of the semiconductor integrated circuit, there is an effect of preventing mixing fail products and products that break down easily.

Furthermore, besides fails at an initial stage, semiconductor integrated circuits may deteriorate due to stress accompanying usage or may break down due to degradation over time. In order to prevent these types of faults, it is desirable that the semiconductor integrated circuit itself, as mounted in a product, perform margin tests periodically.

Since the semiconductor integrated circuit provided with the clock adjusting circuit according to the present invention has a function built-in for testing the margin inside a semiconductor integrated circuit, it is also applicable to this type of self testing.

Figure 49:
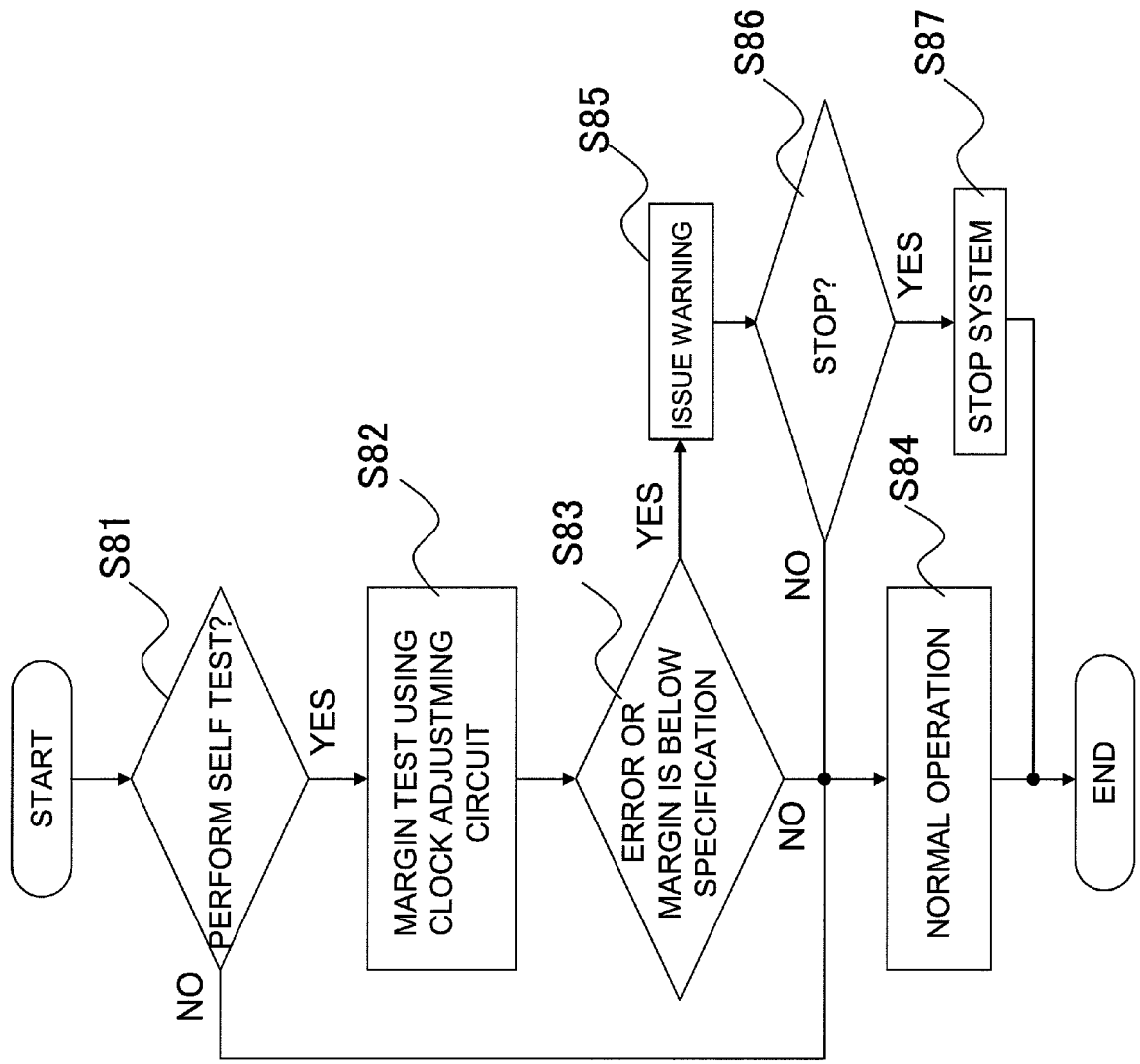
FIG. 49 is a flow diagram showing a test procedure of one exemplary embodiment of the present invention.

FIG. 49 is a flowchart showing one example of a procedure when the semiconductor integrated circuit of the present invention performs a self test. The semiconductor integrated circuit performs the self test with certain conditions (YES branch at step S81). There are no limitations in particular, but examples of these conditions may include any of:

a case in which usage time reaches a fixed time;
a case in which a fixed time is reached from when shipped;
a case in which a change to a usage conduction, such as temperature, voltage, or the like, is detected;
startup time of a device;
a case in which a user performs a prescribed operation so as to perform the test; or random conditions or the like.

When the test is performed, the clock adjusting circuit of the abovementioned exemplary embodiment is used to perform the test of the above described margin (step S82).

When the test is not performed (NO branch at step S81), normal operation is performed (step S84).

As a result of the margin test, in case a fail or fault, or a decrease in margin or the like is detected, a warning is issued (step S85). This warning may, for example, be a request for interrupt processing with regard to hardware information related to an operating system or application software, or
a warning message or voice notification to the user.

If the result of the margin test is such that the system must be promptly stopped (YES branch at step S86), an operation for stopping the system is performed (step S87), and a program is ended.

If the result of the margin test is normal, or if the matter is not one requiring urgency (NO branch at step S86), normal operation is performed (step S84).

By the clock adjusting circuit working together with a BIST (Built-In Self-Test) circuit mounted in the semiconductor integrated circuit, it is possible to improve level of completeness of the self test that the BIST performs. For example, by performing the BIST while generating a clock signal with more severe conditions than actual operation conditions with the clock adjusting circuit, it is possible to test not only whether the circuit is functioning correctly, but also whether a sufficient operation margin is secured.

Figure 50:
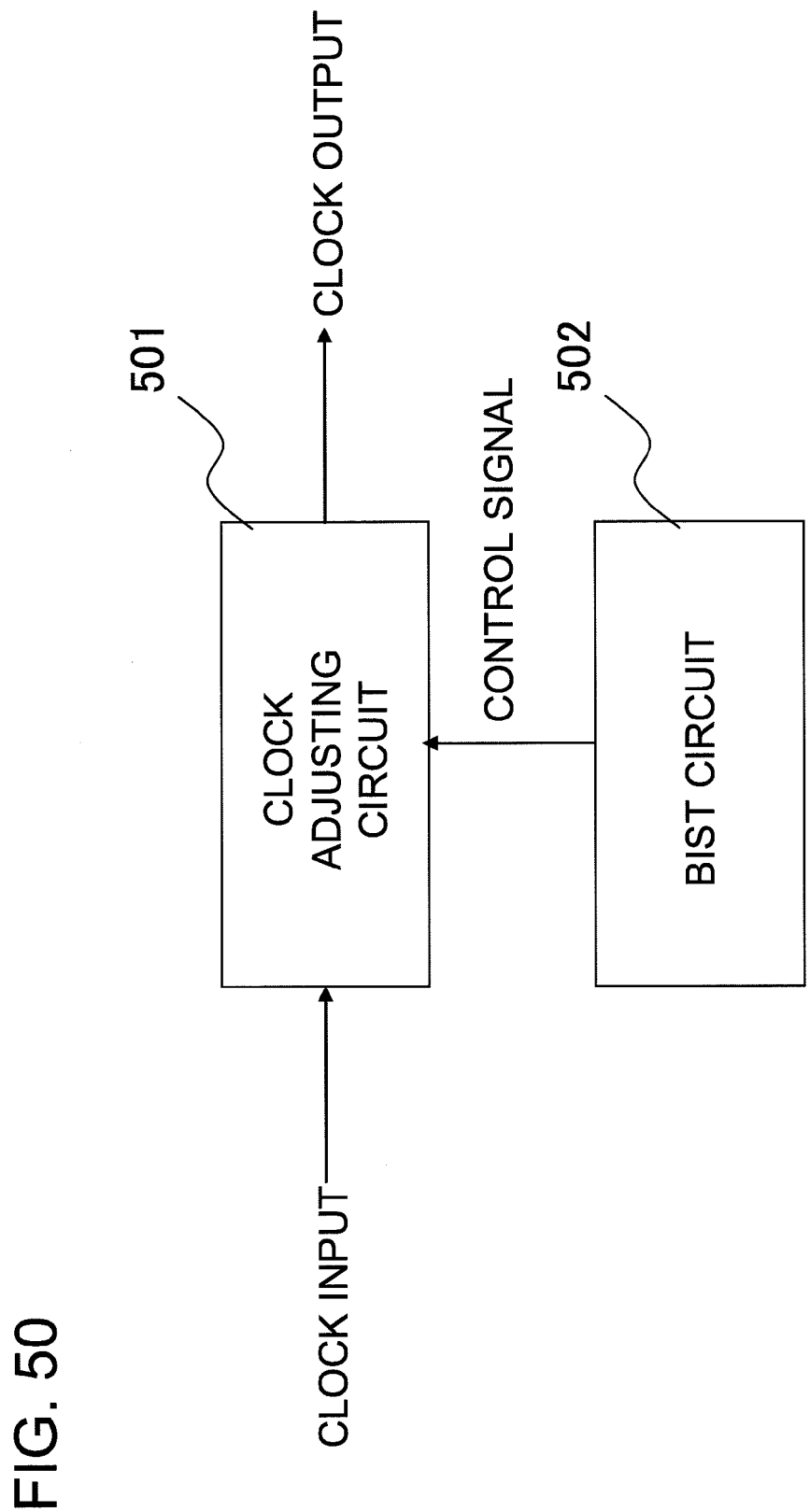
FIG. 50 is a diagram showing a configuration of another exemplary embodiment of the present invention.

In order to realize this type of function, as shown in FIG. 50, a structure may be considered in which a control terminal of the clock adjusting circuit 501 is connected to a BIST circuit 502, and a clock signal at a time of testing by the BIST circuit 502 is adjusted.

Next, an even further exemplary embodiment of the present invention will be described. By simultaneously using a clock adjusting circuit of the present invention and an on-chip waveform monitoring circuit mounted in order to monitor a signal waveform inside a semiconductor integrated circuit, it is possible to further raise accuracy of a margin test.

Inside a semiconductor integrated circuit, which is operating, a power supply voltage changes, and an operation margin of a circuit changes due to this power supply change. For example, cases may be considered such as, when the power supply voltage decreases, delay of the circuit becomes large, and the operation margin is reduced; and conversely, when the power supply voltage increases, delay of the circuit becomes small, and the operation margin increases.

In case the clock adjusting circuit of the present invention is used to perform a margin test of the semiconductor integrated circuit, it is desirable to change a clock signal provided to a circuit under test while making the signal synchronous with change of the above-mentioned operation margin. For example, when the operation margin decreases, a clock signal with more severe conditions is provided; and conversely, when the operation margin increases, by relaxing conditions of the clock signal, it is possible to examine the operation margin under the worst conditions.

Furthermore, when the operation margin increases, a clock signal with a more severe condition is supplied; and conversely, when the operation margin decreases, by relaxing the condition of the clock signal, it is possible to cancel out an effect of the operation margin change.

Figure 51:
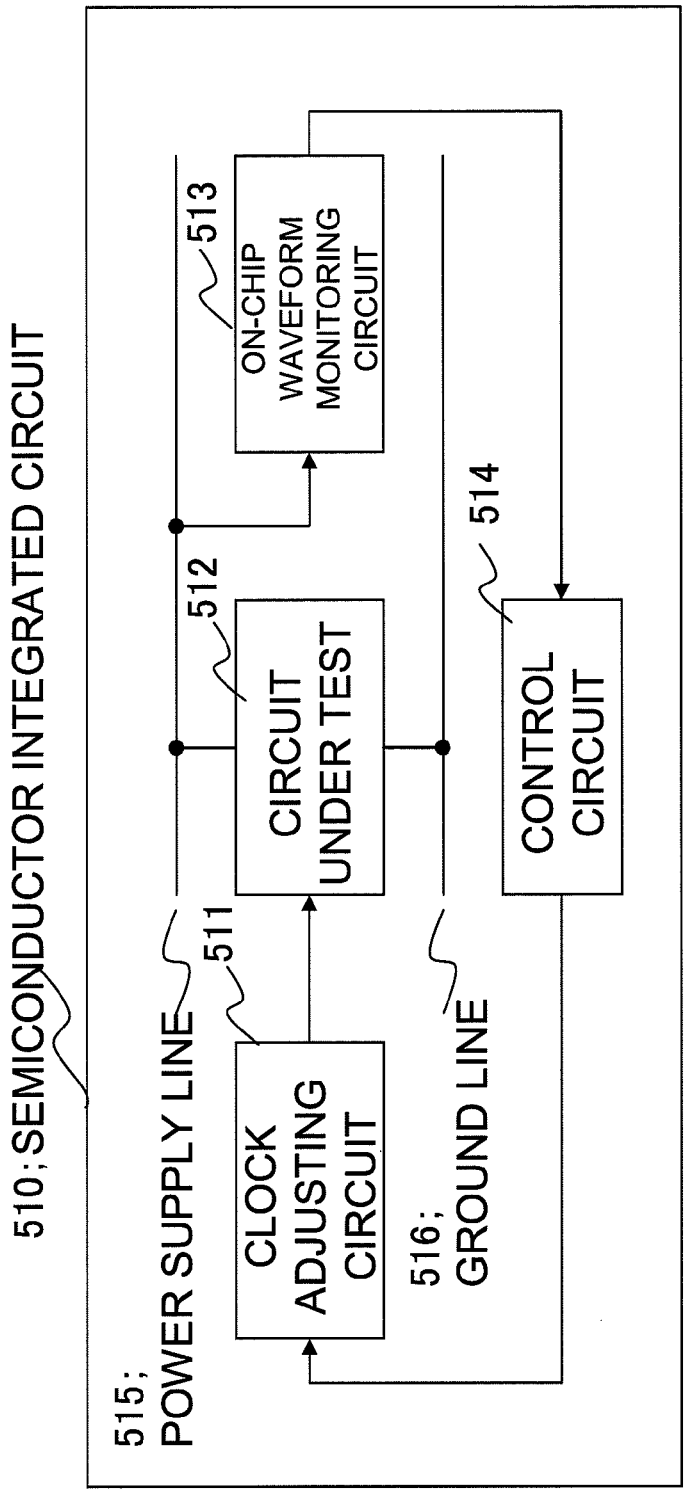
FIG. 51 is a diagram showing a configuration of an even further exemplary embodiment of the present invention.

FIG. 51 is a diagram showing a configuration of an exemplary embodiment using the clock adjusting circuit of the present invention, and is a diagram showing a circuit configuration for performing an operation margin test, while confirming the effect of the power supply change.

Referring to FIG. 51, in the present exemplary embodiment, inside a semiconductor integrated circuit 510 are provided: an on-chip waveform monitoring circuit 513, the clock adjusting circuit 511 of the present invention described in the abovementioned exemplary embodiments, a circuit to be tested (referred to as a circuit under test) 512 which receives a supply of a clock signal from the clock adjusting circuit 511 to operate, and a control circuit 514 which controls the clock adjusting circuit 511. The on-chip waveform monitoring circuit 513 is a circuit for monitoring voltage waveform of a power supply line 515. Though there is no particular limitation imposed on the present invention, in FIG. 51, a power supply waveform of the power supply terminal (power supply line nearest to the circuit under test 512) of the circuit under test 512 is monitored. The on-chip waveform monitoring circuit 513 samples the power supply waveform by an A/D converter, not shown in the drawings; this may be a device that can sample the voltage waveform (power supply noise) by prescribed time accuracy and amplitude accuracy; and sampling frequency (conversion speed) and resolution of the A/D converter is arbitrary. Furthermore, a method of sampling of the on-chip waveform monitoring circuit 513 may directly digitize transient waveforms and the like, or may use a principle of a sampling oscilloscope which obtains high speed instant signal voltage values at low frequency, at a plurality of points, and reproduces a waveform.

In the present exemplary embodiment, as described above, a state of the power supply change is monitored by the on-chip waveform monitoring circuit 513, and based on information obtained by this monitoring, the control circuit 514 computes an appropriate value of the clock frequency and the like, and controls the clock adjusting circuit 511. The clock signal from the clock adjusting circuit 511 is supplied to the circuit under test 512.

For example, after shipping, in cases of performing a test (operation margin test) in a state in which the semiconductor integrated circuit 510 is mounted on a circuit board or the like (diagnosis test, failure analysis, or the like), data, control signals and the like, outside of clock signals supplied to the circuit under test 512 may be supplied from another circuit block inside a semiconductor integrated circuit 510, or from a BITS circuit, or an external pattern data generator. In case the semiconductor integrated circuit 510 is tested by a tester or the like, the data, control signals and the like, outside of the clock signals supplied to the circuit under test 512, may be supplied from the tester or the like. Activation and deactivation of the on-chip waveform monitoring circuit 513 may be controlled by a test mode signal, not shown, during normal operation, the on-chip waveform monitoring circuit 513 may be in an inactive state, clock adjustment by the control circuit 514 may be stopped, and power consumption may be reduced. A similar situation is applied also to the following exemplary embodiment.

Figure 52A:
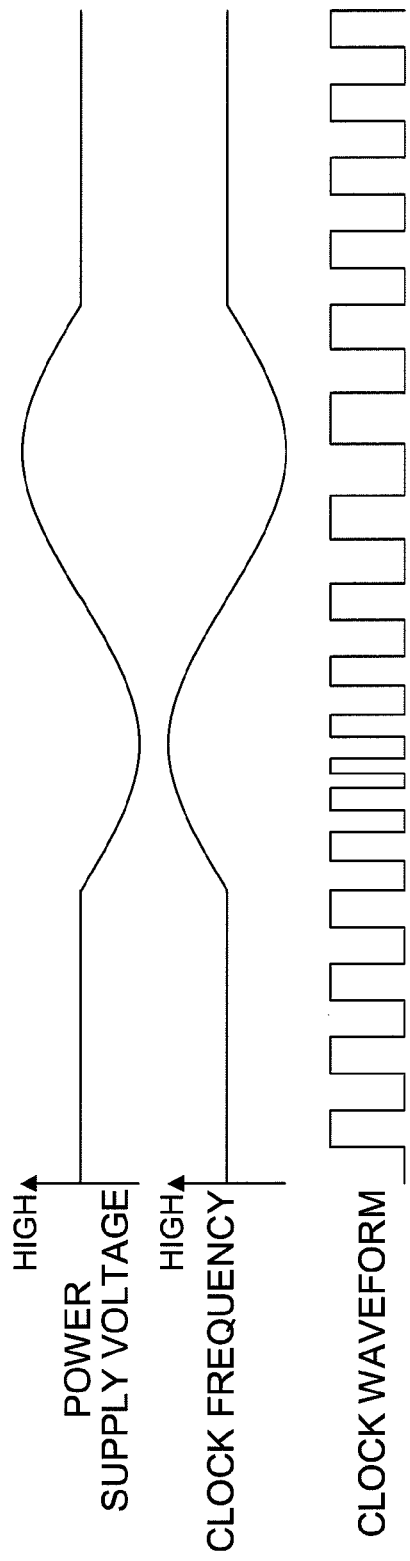
FIGS. 52A and 52B are diagrams describing an operation margin test example of the exemplary embodiment of FIG. 51.
Figure 52B:
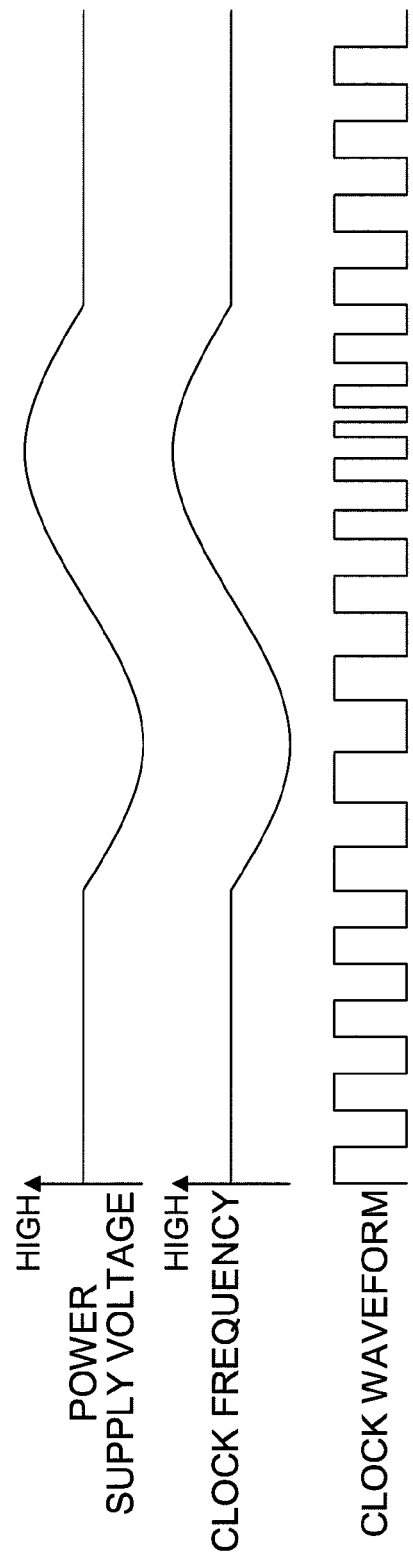

FIGS. 52A and 52B include waveform diagrams showing one example of control when performing the operation margin test, using the circuit of FIG. 51. In order to guarantee quality of the semiconductor integrated circuit, it is necessary to reserve an operation margin of a level at which a malfunction is not caused even when the operation margin is reduced.

In order to confirm this operation margin, in an example of FIG. 52A, when the operation margin is reduced, a clock signal at more severe conditions is received. For example, when the power supply voltage monitored by the on-chip waveform monitoring circuit 513 is low (for example, when judged low in comparison to an operation specification value of the circuit), a control signal is supplied to the clock adjusting circuit 511 by the control circuit 514 which receives a monitoring result of the on-chip waveform monitoring circuit 513, and a clock signal of a higher frequency is received by the circuit under test 512.

By performing the operation margin test under such conditions, it is possible to confirm whether a safe margin is reserved, even in a state in which the operation margin is reduced by a power supply change.

In an example of FIG. 52B, when the operation margin is reduced, the clock signal frequency is lowered and operation conditions are relaxed, and effects of the operation margin change are cancelled out. For example, when the power supply voltage is low, a delay D of the circuit under test 512 increases, and becomes D+ΔT. At this time, a clock period T is increased to T+ΔT (that is, the clock frequency is lowered). In case the operation margin is defined by a difference between the clock period and a delay of the circuit under test 512, irrespective of change in the power supply voltage, the operation margin can keep constant as in $$T+\Delta T-(D+\Delta T)=T-D$$

In this way, by changing the frequency and the like of the clock signal, matching the change of the operation margin, it is possible to measure the original operation margin of the circuit under test 512 without receiving an effect of the power supply change or the like.

In the operation margin test of FIG. 52A, when the power supply voltage has become high, the operation frequency may be raised. In a similar way, in the operation margin test of FIG. 52B, when the power supply voltage has become high, the operation frequency may be lowered. By so doing, synchronization with the clock signal when the clock frequency is constant can be maintained.

Figure 53:
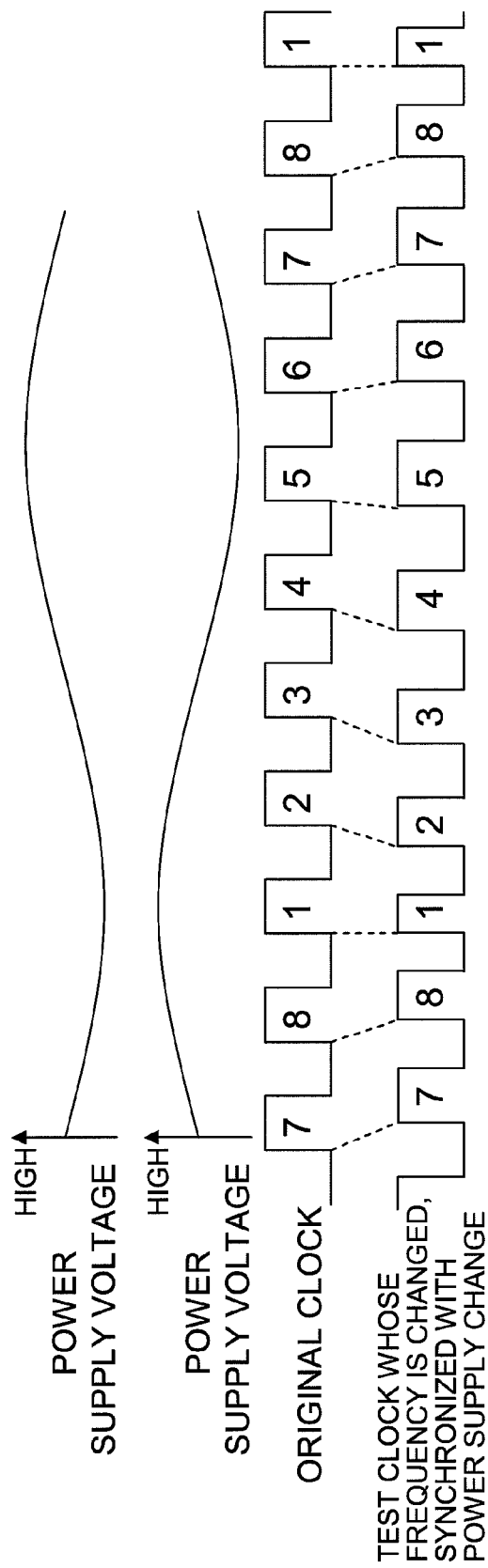
FIG. 53 is a diagram describing the operation margin test example of the exemplary embodiment of FIG. 51.

An example in FIG. 53 shows a clock waveform (test clock) in a case in which synchronization with the power supply change is performed and the frequency is changed, and a waveform of a clock signal (original clock) in a case where this does not apply. In either case, average clock frequency is the same.

Figure 54:
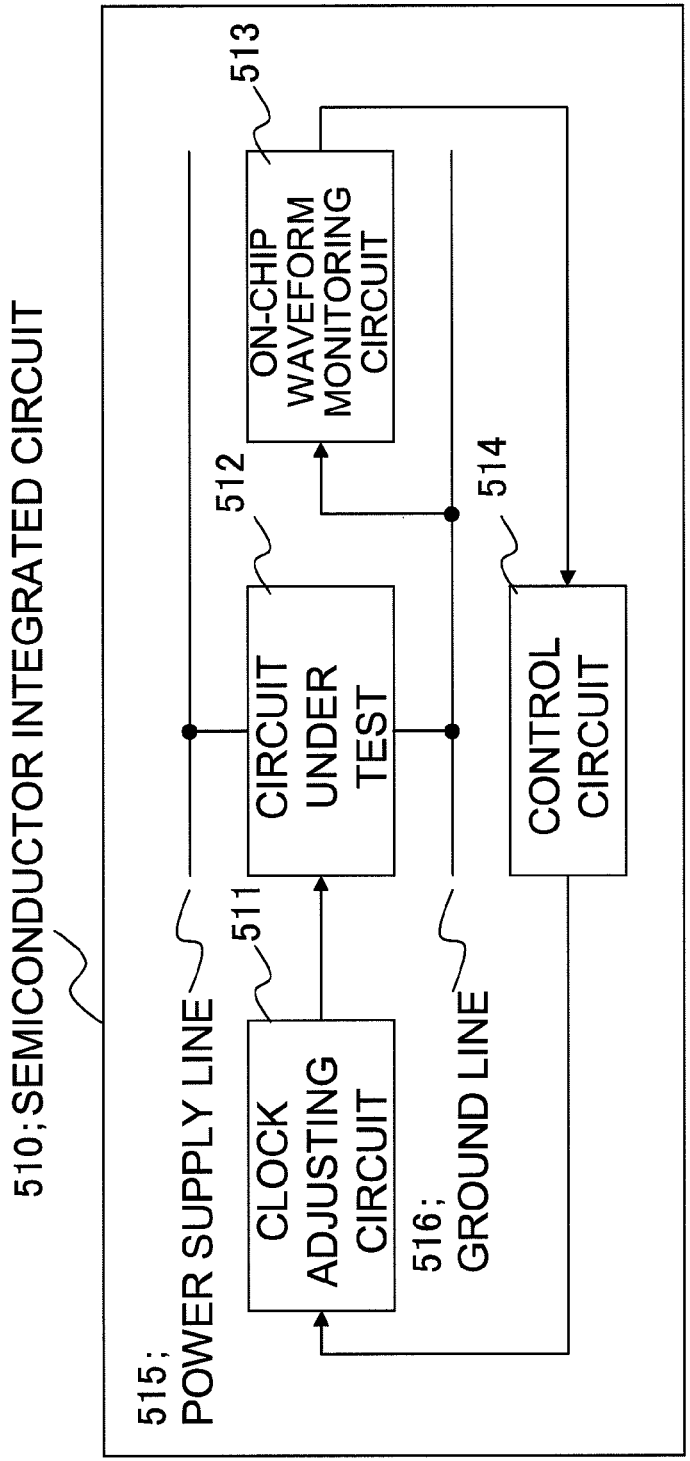
FIG. 54 is a diagram showing a modified example of the exemplary embodiment of FIG. 51.

In the configuration of the exemplary embodiment shown in FIG. 51, an example has been shown in which the power supply voltage inside a semiconductor integrated circuit 510 is measured by the on-chip waveform monitoring circuit 513, and synchronization with the change of the power supply voltage is performed, to adjust the clock frequency and the like, but since the change in the operation margin of the semiconductor integrated circuit receives an effect of change of ground voltage, the change that is to be measured may be the ground voltage. FIG. 54 is a diagram showing a configuration example in which the change in the ground voltage is monitored, and the change thereof is matched, to adjust the frequency of the clock signal or the like. The on-chip waveform monitoring circuit 513 monitors the ground potential, and based on information obtained by this monitoring, the control circuit 514 computes an appropriate value of the clock frequency and the like, to control the clock adjusting circuit 511. A clock signal from the clock adjusting circuit 511 is supplied to the circuit under test 512.

FIGS. 55A and 55B show an example of control in cases of performing an operation margin test using the circuit configuration of FIG. 54. It is considered that when the ground voltage becomes high, circuit delay becomes large, and the operation margin decreases. In the example of FIG. 55A, when the ground voltage has become high, by providing a clock with a higher frequency, and providing more sever conditions, it is possible to measure the operation margin under a worst condition. On the other hand, in the example of FIG. 55B, when the ground voltage has become high, by providing a clock with a lower frequency, and canceling out change of the operation margin, the original operation margin of a non-test circuit is measured without receiving an effect of the power supply change.

Figure 56:
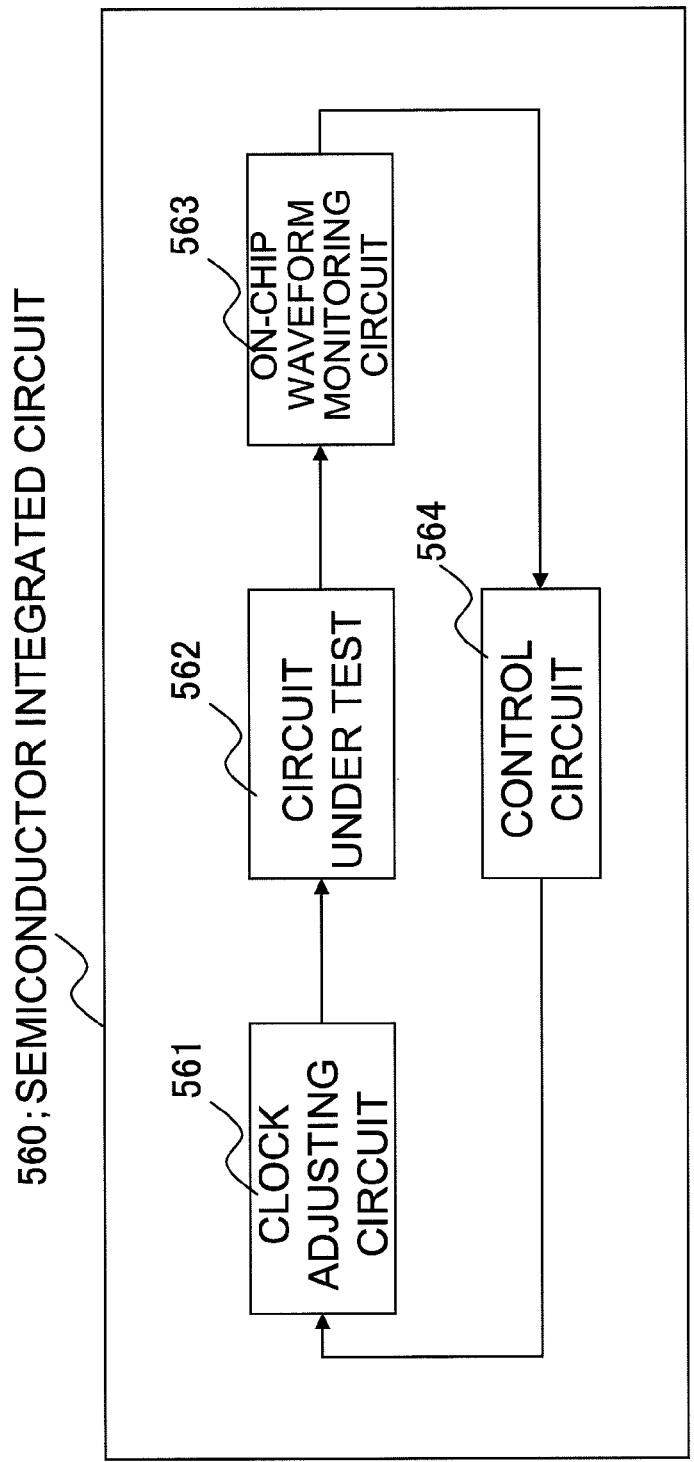
FIG. 56 is a diagram showing a configuration of an even further exemplary embodiment of the present invention.

FIG. 56 is a diagram showing a configuration of an even further exemplary embodiment of the present invention. Referring to FIG. 56, by an on-chip waveform monitoring circuit 563 monitoring an output signal of a circuit under test 562, which is operating, and monitoring a change in an operation margin, based on information obtained by this monitoring, a control circuit 564 computes an appropriate value of a clock frequency and the like, and controls a clock adjusting circuit 561. If the signal monitored by the on-chip waveform monitoring circuit 563 is one that reflects the operation margin of the circuit under test 562, an arbitrary signal of output (O), input (I), and input-output (I/O) of the circuit under test 562 is used, and an internal signal of the circuit under test 562 may be extracted to the on-chip waveform monitoring circuit 563, to be monitored.

For example, by monitoring delay of a logic circuit forming the circuit under test 562;

bit line voltage or word line voltage of a memory circuit forming the circuit under test 562;

the signal waveform and the like of the input-output (I/O) forming the circuit under test 562; and the like by the on-chip waveform monitoring circuit 563, it is possible to comprehend if operation margins of these circuits are reducing, or increasing. The bit line voltage, the word line voltage of the memory circuit, or the like, correspond to a signal inside the circuit under test 562.

Based on information related to the operation margin monitored by the on-chip waveform monitoring circuit 563, by the control circuit 564 adjusting the clock signal output from the clock adjusting circuit 561, a high accuracy operation margin test is possible. The on-chip waveform monitoring circuit 563 that monitors the signal waveform of the circuit under test 562, by a sampling clock of a frequency higher than the frequency of the clock signal supplied to the circuit under test 562, may perform high speed digitizing of a transient characteristic or the like of the signal waveform, or, for example, may use the principle of a sampling oscilloscope which shifts sample points by a low frequency sampling clock, to take a plurality of samples of instant voltage values of a signal (a high speed repeated signal) output from the circuit under test 562, and reproduce a waveform. A force pattern from a BIST pattern generation circuit, not shown in the drawings, inside a semiconductor integrated circuit 560 may be applied to the circuit under test 562, or a test pattern from an external LSI tester or the like may also be applied.

Figure 57A:
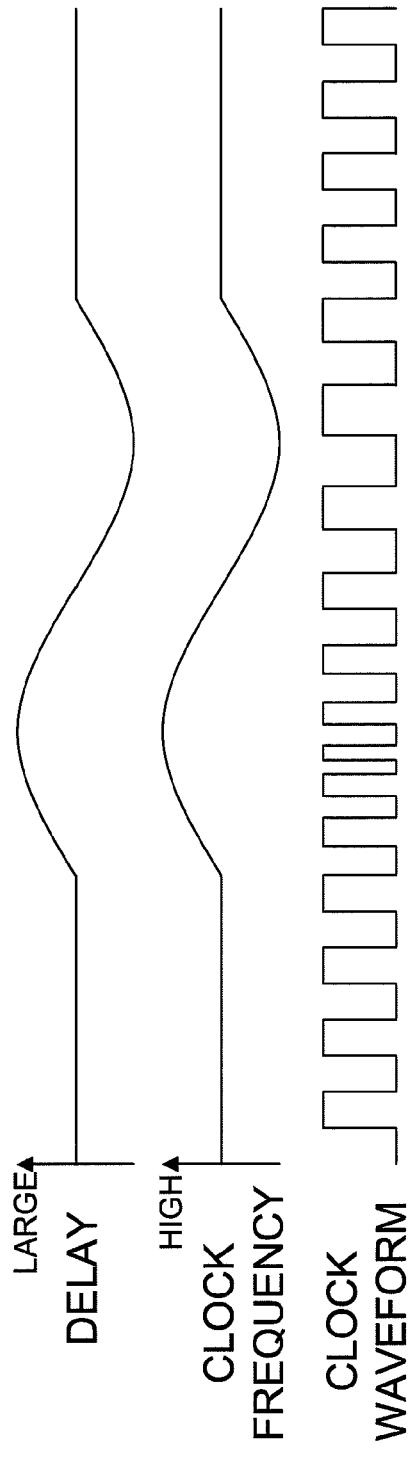
FIGS. 57A and 57B are diagrams describing an operation margin test example of the exemplary embodiment of FIG. 56.
Figure 57B:
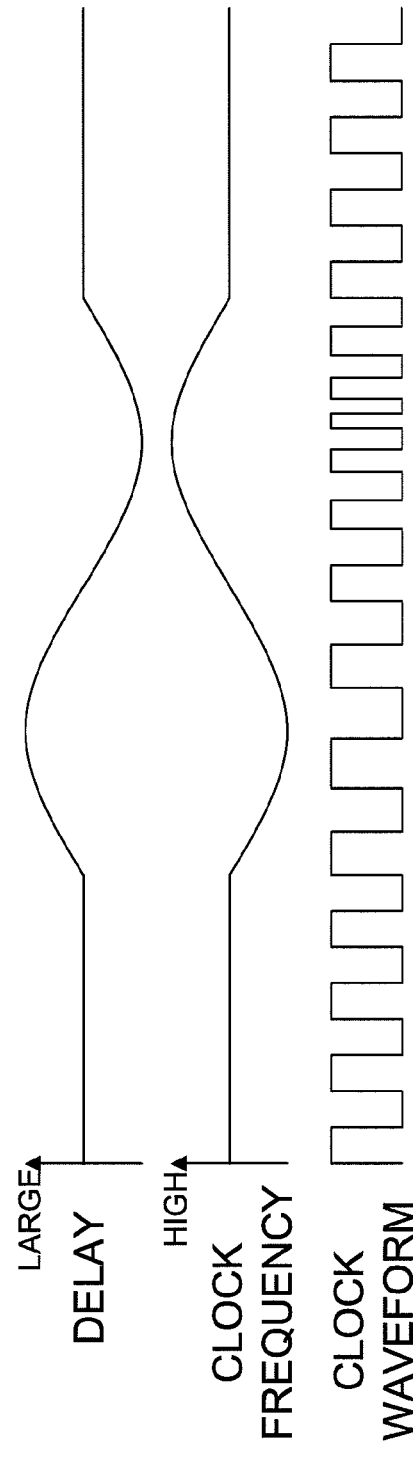

FIGS. 57A and 57B show an example of control in which the on-chip waveform monitoring circuit 563 of FIG. 56 monitors change in delay of the logic circuit (circuit under test 562), the clock adjusting circuit 561 is controlled by the control circuit 564, and the clock signal adjusted.

When the delay of the circuit under test 562 becomes large, in case the operation margin decreases, as in FIG. 57A, by increasing the clock frequency and making conditions severe, it is possible to confirm whether or not the operation margin is sufficient.

Conversely, when the delay becomes large as in FIG. 57B, the clock frequency is decreased, and it is possible to cancel out operation margin change due to power supply change, and to measure the original operation margin of the circuit under test 562.

Figure 58:
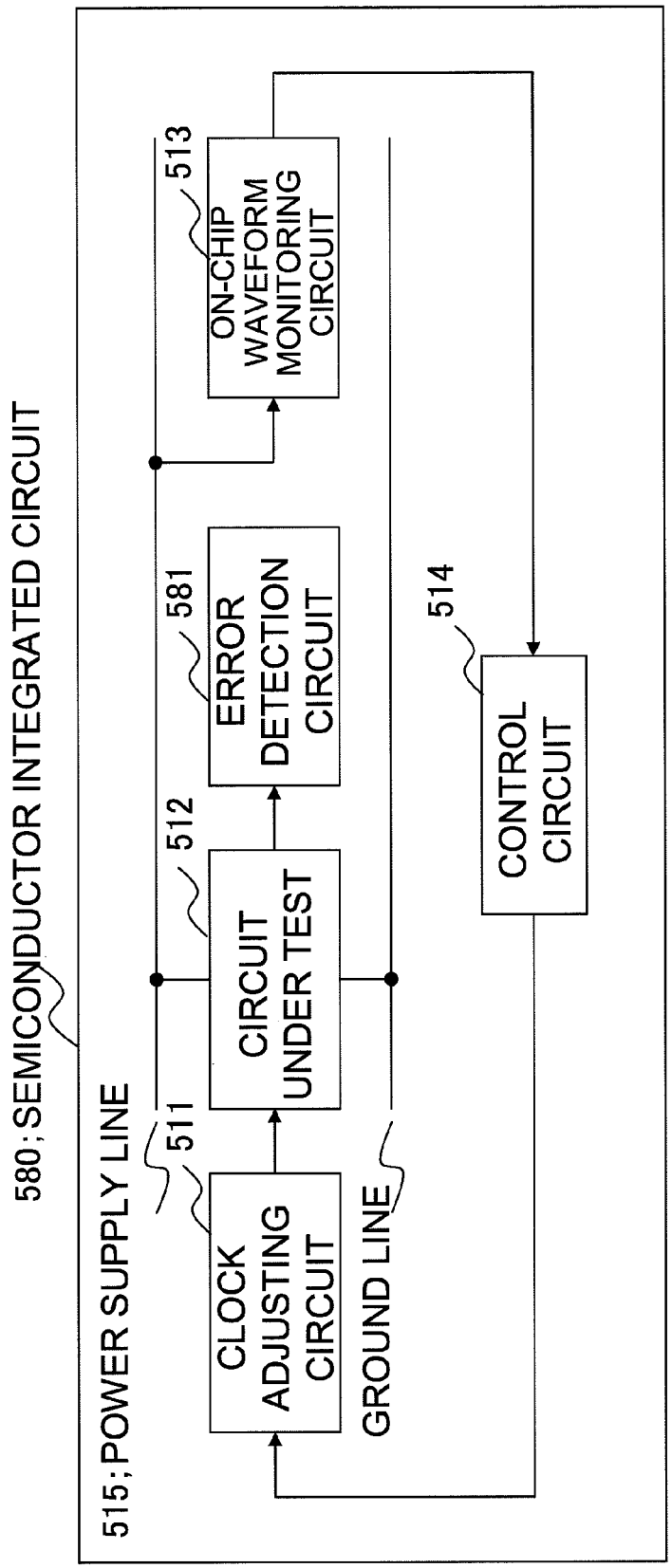
FIG. 58 is a diagram showing a configuration of another exemplary embodiment of the present invention.

FIG. 58 is a diagram showing a configuration of an even further exemplary embodiment of the present invention, and is a diagram showing a configuration of a circuit in order to test a relationship of an operation margin and a phase difference of a power supply change and a clock change. Referring to FIG. 58, an error detection circuit 581 which receives output of a circuit under test 512 and detects errors, is provided in a configuration of FIG. 51. In the present exemplary embodiment, similar to the configuration example shown in FIG. 51, and the control example shown in FIGS. 52A and 52B, change of a clock signal is synchronized with a power supply change, but, while changing a phase difference of the change of the clock signal and the power supply change, by respective phase changes thereof, an allowable clock signal change amount is tested. An expected value pattern and a force test pattern supplied to each of the circuit under test 512 and the error detection circuit 581 may be supplied from a BIST, not shown in the drawings, inside a semiconductor integrated circuit 580, or may be supplied from an external LSI tester or the like. In such cases, the error detection circuit 581 may be configured to be provided with a comparator circuit which compares output of the circuit under test 512 and the expected value pattern. The error detection circuit 581 may output an error detection result (pass/fail information) from an output pin to the LSI tester or the like (not shown in the drawings) outside the semiconductor integrated circuit 580; and in the LSI tester or the like, a SHMOO PLOT or the like, of FIG. 59B described later, may be created. As a modified example, the present invention does not exclude a configuration in which the error detection circuit 581 is replaced by the LSI tester.

FIGS. 59A and 59B are diagrams for describing one example of control of the circuit shown in FIG. 58. Disturbance amplitude is changed and pass/fail of the circuit under test 512 is verified via the error detection circuit 581, and sensitivity of the operation margin is verified with respect to a parameter such as phase difference or the like. FIGS. 59A and 59B describe an example in which synchronization with power supply change is performed, and clock frequency is changed.

For example, as shown in the clock frequency (1), the clock frequency (2), and the clock frequency (3) of FIG. 59A, the clock frequency change phase is changed with respect to the power supply voltage change (change in power supply noise) shown in FIG. 59A.

When this type of test is performed, if a clock frequency change of a phase as shown in the clock frequency (1), for example, with respect to the power supply voltage change, is provided, in case amplitude (amount of change) of the frequency change is comparatively large, the circuit can operate normally (the operation margin is large).

Conversely, if a clock frequency change of a phase, such as the clock frequency (3), with respect to the power supply voltage change shown in FIG. 59A, is provided, even when the amplitude (amount of change) of the frequency change is comparatively small, the circuit may malfunction (the operation margin is small).

In a result of this type of operation margin test, as shown in FIG. 59B, a plot (SHMOO PLOT) can be made, as a relationship of a phase difference of the power supply change and the clock frequency change (horizontal axis) and the operation margin (allowable clock frequency amplitude and the like) (vertical axis). From this result, the relationship of the phase difference of the power supply change and the clock frequency change, in which the operation margin is smallest or largest, is understood. This type of result of measuring the operation margin and the phase difference between the power supply change and the clock frequency change is useful in making the test of the operation margin of the semiconductor integrated circuit more efficient, in improving design accuracy, in failure analysis, and the like.

By using the clock adjusting circuit of the present invention, it is possible to adjust jitter, duty ratio, skews and the like, of the clock signal, but a PLL or a clock buffer also generate jitter, duty distortion, skew, and the like, due to power supply change or variation. As a result, jitter, duty ratio, and skew, intentionally generated by a user in the clock adjusting circuit, and jitter, duty ratio, and skew due to variation or change, not intentionally generated by the user, are present in a clock signal supplied to a logic circuit or the like.

FIG. 60 is a diagram showing a configuration of yet a further exemplary embodiment using a clock adjusting circuit of the present invention. The present exemplary embodiment is a circuit configuration arranged so that a clock signal supplied to a logic circuit or the like is made to approach as much as possible a signal intended by the user.

Referring to FIG. 60, in the present exemplary embodiment, a clock signal from a PLL (phase locked loop) is supplied to the clock adjusting circuit 601. Furthermore, a clock buffer 606 configured from CTS (Clock Tree Synthesis), for example, is arranged between output of the clock adjusting circuit 601 and a circuit under test 602, and skew adjustment of a plurality of clocks supplied to the circuit under test 602 is performed.

The on-chip waveform monitoring circuit 603 monitors a waveform of a clock signal received from the clock buffer 606, close to a clock input terminal of the circuit under test 602. The on-chip waveform monitoring circuit 603 that monitors the clock signal waveform, by a sampling clock of a multiplier frequency of the clock signal, may digitize the clock signal waveform, or may use a principle of a sampling oscilloscope which shifts sample points by a low frequency sampling clock, to take a plurality of samples of instant signal voltage of the clock signal waveform and reproduce the clock signal waveform.

In the present exemplary embodiment, the on-chip waveform monitoring circuit 603 monitors a clock signal shared with the circuit under test 602, and a parameter of the clock adjusting circuit 601 is adjusted so that this monitored waveform approaches a waveform intended by the user.

For example, consideration may be given to providing a duty distortion or jitter, referred to as X, to the clock signal of the circuit under test 602.

In FIG. 60, when, in the PLL 605 a duty distortion or jitter referred to as A is generated, and in the clock buffer 606 a duty distortion or jitter referred to as B is generated, a duty distortion or jitter referred to as X+A+B is present in a clock signal that passes through the clock buffer 606 and reaches the circuit under test 602.

This aspect is monitored as a waveform by the on-chip waveform monitoring circuit 603. If information of the waveform monitored by the on-chip waveform monitoring circuit 603 is fed back to a control circuit 604 for the clock adjusting circuit, the control circuit 604 for the clock adjusting circuit judges that the jitter or duty distortion is excessive, and the jitter or duty distortion generated by the clock adjusting circuit 601 decreases. Finally, by the clock adjusting circuit 601 generating distortion or jitter referred to as X-A-B, it is possible for the circuit under test 602 to receive a clock signal having a distortion or jitter referred to as X that is intended by the user.

The PLL 605 inside a semiconductor integrated circuit or a clock distribution circuit (clock buffer) 606 often have various adjustment functions. For example, in the PLL 605, it is often possible to adjust a charge pump current, a frequency gain of a voltage controlled oscillator (VCO), a loop filter constant, or the like.

Furthermore, a delay adjustment circuit (variable delay circuit) (not shown in the drawings) or the like may also be built into the clock adjusting circuit 606.

By adjustment thereof, the size of the clock signal jitter or duty distortion may change. In such cases, by set values thereof, the operation margin changes.

Figure 61:
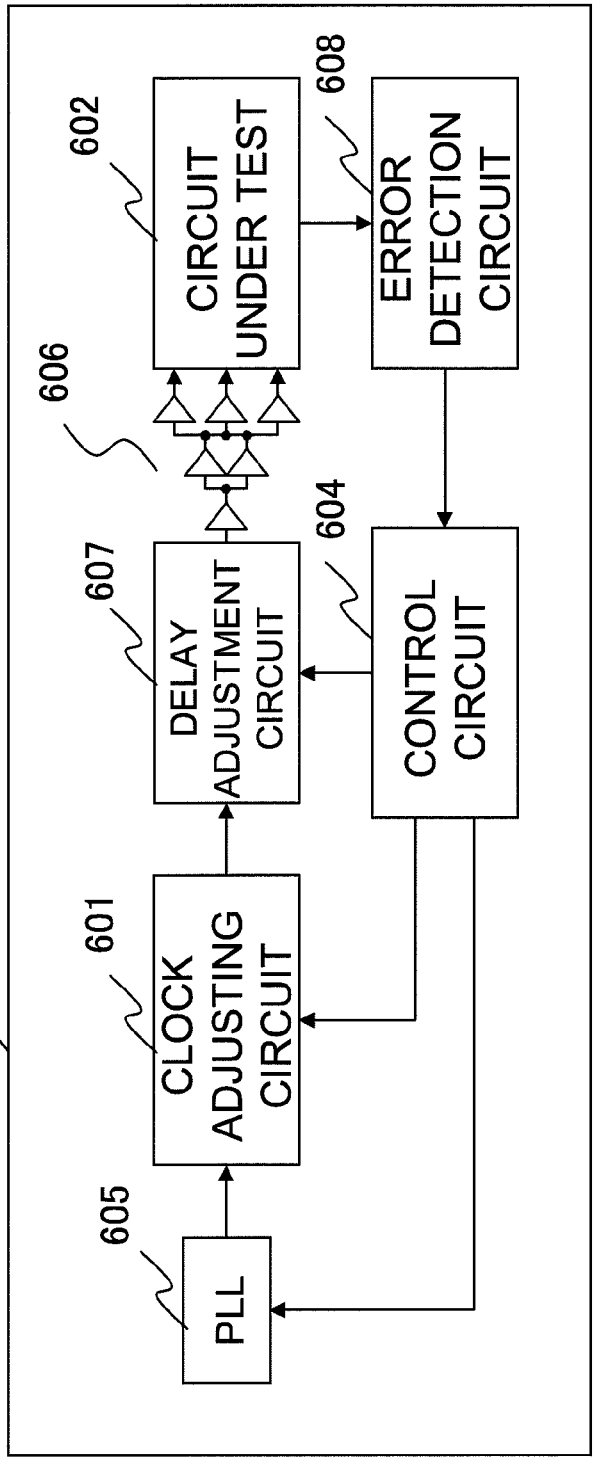
FIG. 61 is a diagram showing a configuration of another exemplary embodiment of the present invention.

FIG. 61 is a diagram showing a configuration of yet a further exemplary embodiment using a clock adjusting circuit of the present invention. In the present exemplary embodiment, a relationship of operation margin and a set value of jitter or duty distortion of a clock signal is measured, or a set value is adjusted so that the operation margin or the like is optimal. An error detection circuit 608 receives output of a circuit under test 602 and detects an error.

Figure 62:
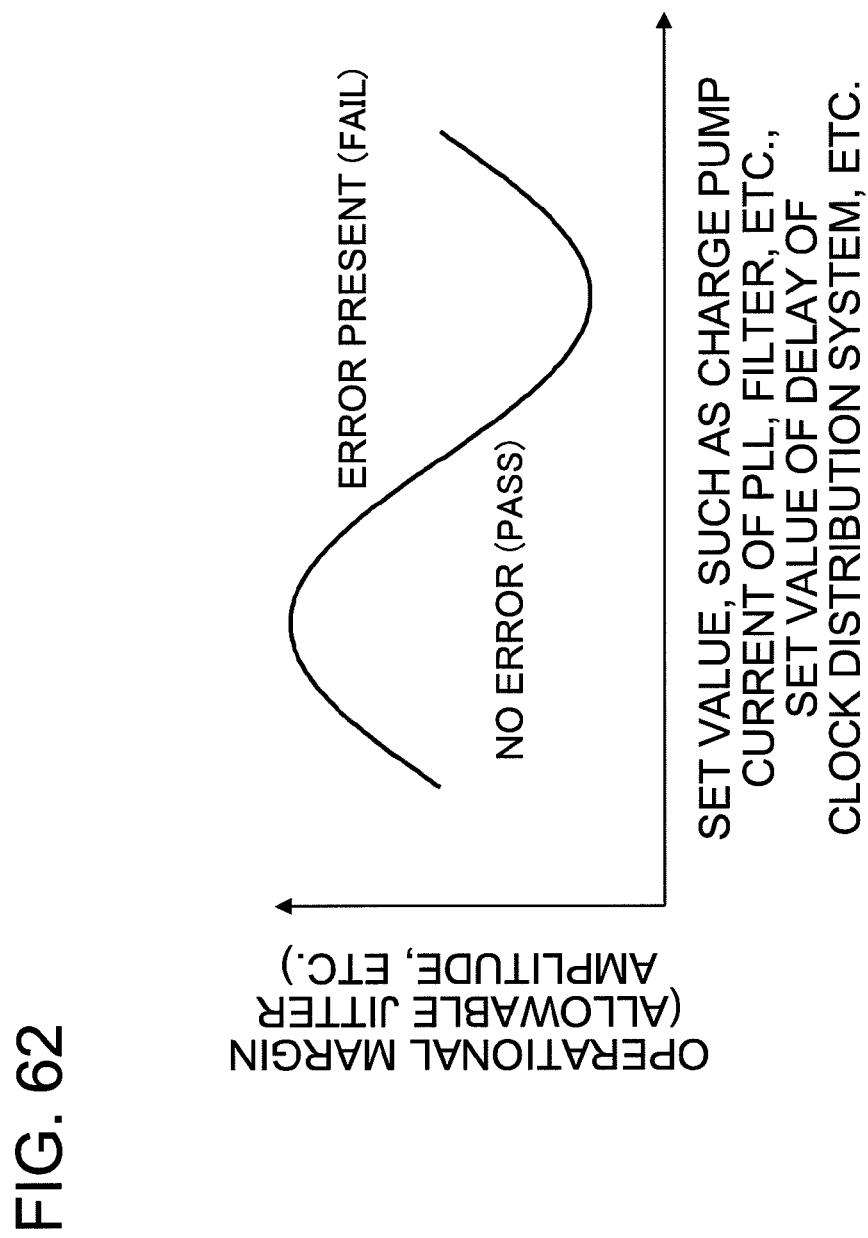
FIG. 62 is a diagram describing an operation margin of the exemplary embodiment of FIG. 61.

By increasing jitter or duty distortion generated in the clock adjusting circuit 601 and measuring a tolerance limit, while changing a set value of a circuit, such as a charge pump current of a PLL 605, not shown in the drawings, a frequency gain of a voltage controlled oscillator (VCO), a loop filter constant, a delay of a clock distribution circuit, or the like, as shown in FIG. 62, it is possible to measure a relationship (SHMOO plot) of the set values of the circuit (for example, a current of the charge pump of the PLL 605, the set value of the loop filter of the PLL 605, a set value of a clock distribution system, or the like) and the operation margin (for example, allowable jitter amplitude, or the like). Using this type of test result, it is possible to design a semiconductor integrated circuit such that the operation margin has an optimal value.

Figure 63:
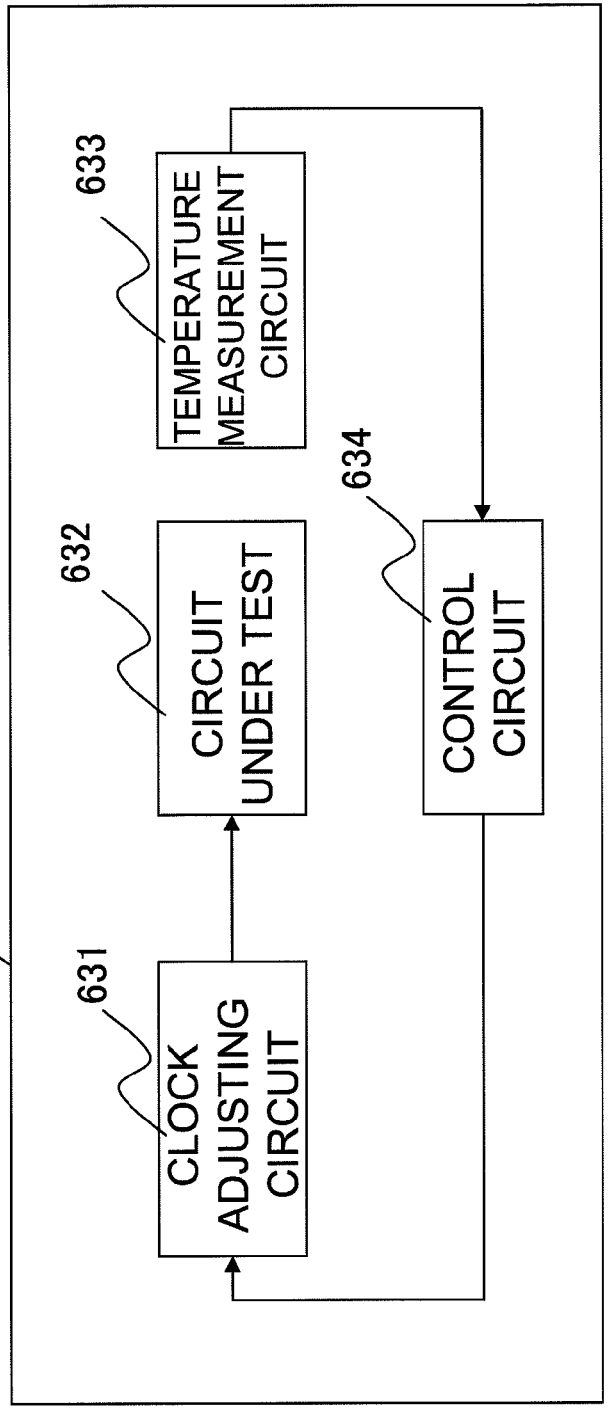
FIG. 63 is a diagram showing a configuration of another exemplary embodiment of the present invention.

FIG. 63 is a diagram showing a configuration of yet a further exemplary embodiment using a clock adjusting circuit of the present invention. Referring to FIG. 63, in the present exemplary embodiment, a clock signal is adjusted according to temperature inside a semiconductor integrated circuit 630. A temperature measuring circuit (on-chip temperature measuring circuit), which includes an on-chip temperature sensor such as a diode or the like, monitors change in temperature, controls a clock adjusting circuit 631 by a control circuit 634, and adjusts a clock signal. In general, when the temperature of the semiconductor integrated circuit increases, delay of the circuit increases, and operation margin decreases. At this time, by lowering clock frequency to match the decrease in the operation margin, it is possible to measure the original margin possessed by a circuit under test, without receiving an effect of temperature change.

As described above, the operation margin of the circuit under test changes due to power supply voltage change, temperature change, or the like.

This type of operation margin change (change of operation margin due to power supply voltage change or temperature change) can be monitored also by using a circuit (replica circuit) that simulates the circuit under test.

Figure 64:
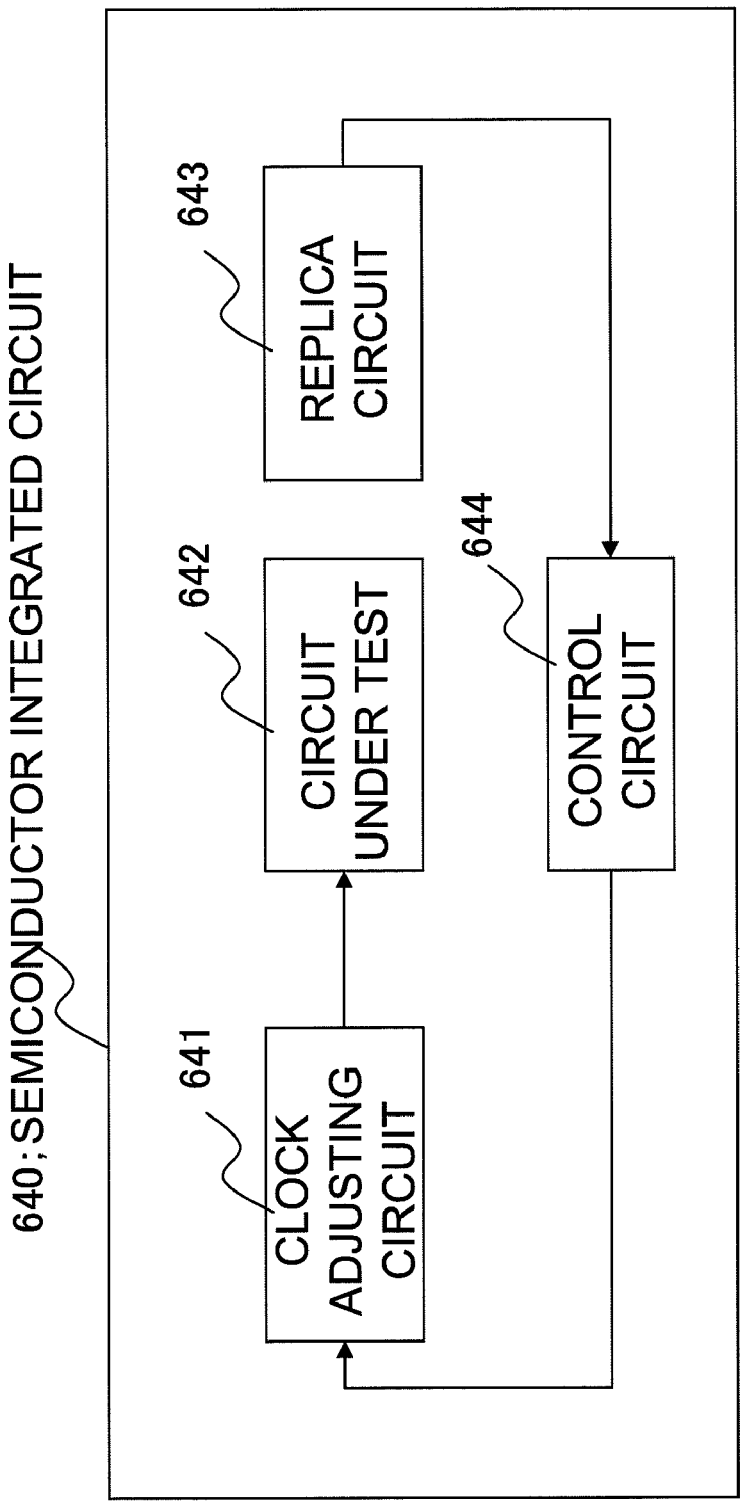
FIG. 64 is a diagram showing a configuration of another exemplary embodiment of the present invention.
Figure 65:
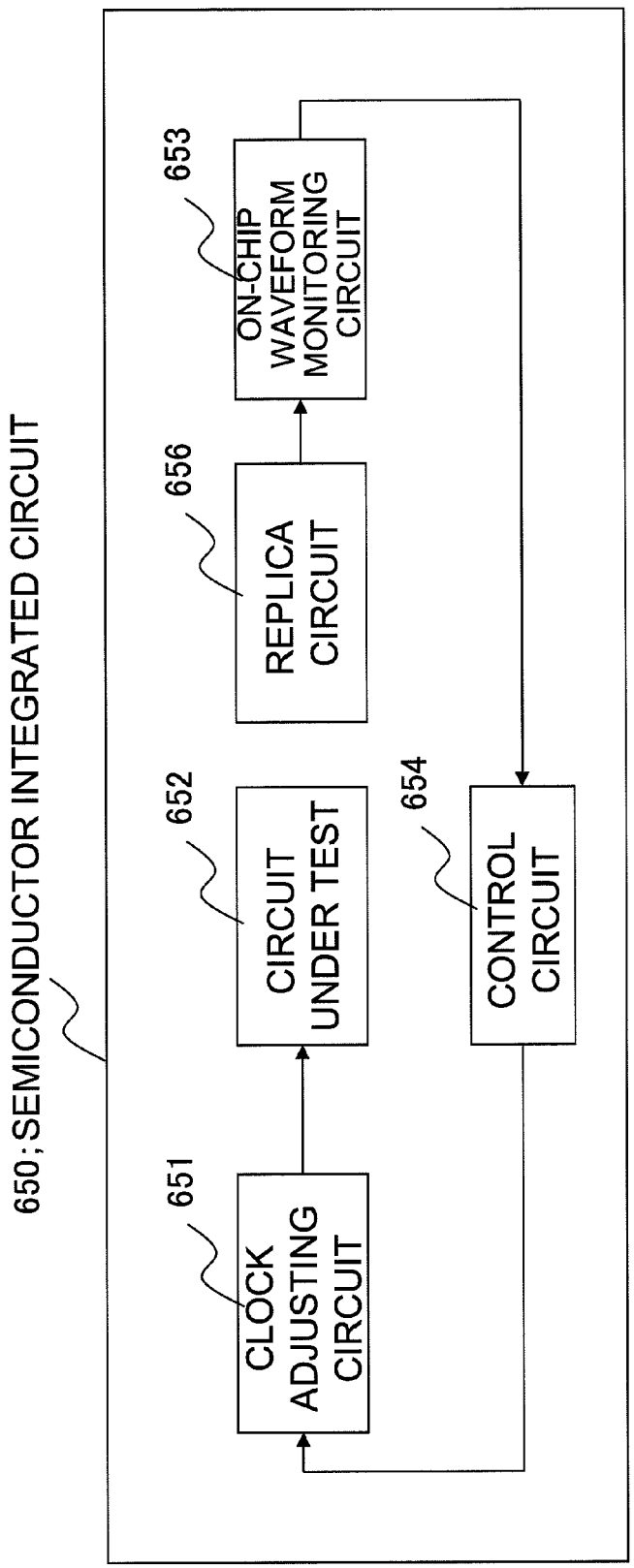
FIG. 65 is a diagram showing a configuration of another exemplary embodiment of the present invention.

FIG. 64 and FIG. 65 are each diagrams showing a configuration of yet further exemplary embodiments using a clock adjusting circuit of the present invention. In the present exemplary embodiments of FIG. 64 and FIG. 65, by using replica circuits 643 and 656 that simulate circuits under test 642 and 652, the abovementioned operation margin change is detected, and clock signals of the circuits under test 642 and 652 are adjusted.

If the replica circuits 643 and 656 show change corresponding to characteristic changes of the circuits under test 642 and 652, it is possible to use any circuit.

In the exemplary embodiment shown in FIG. 64, output of the replica circuit 643 is received by a control circuit 644, and a clock signal provided to the circuit under test 642 is adjusted. That is, the output of the replica circuit 643 is directly received by the control circuit 644. In such cases, the replica circuit 643 is provided, for example, with a ring oscillator in which inverters are connected in a ring format with an odd number of stages, and may output information of an oscillation frequency thereof or the like to the control circuit 644. In cases of a circuit in which the replica circuit 643 is driven by a clock, a clock signal supplied to the replica circuit 643 may be a clock signal of the same system as the circuit under test 642, or may be a clock signal of another system. Or, a force pattern from a BIST pattern generation circuit, not shown in the drawings, inside a semiconductor integrated circuit may be applied to the replica circuit 643, or a test pattern from an external LSI tester or the like may also be applied.

In the exemplary embodiment shown in FIG. 65, output of the replica circuit 656 is monitored by an on-chip waveform monitoring circuit 653, and, based on information obtained by this monitoring, the control circuit 654 computes an appropriate value of a clock frequency or the like, and controls the clock adjusting circuit 651.

In the exemplary embodiment shown in FIG. 65, since an output waveform of the replica circuit 656 is monitored by the on-chip waveform monitoring circuit 653, it is possible to use any circuit configuration as the replica circuit 656. The replica circuit 656 may be the same as the circuit under test 652, or may have output of a function block of part of the circuit under test 652. The replica circuit 656 may be a different circuit (for example, a ring oscillator or the like) provided independently from the circuit under test 652. In cases of a circuit in which the replica circuit 656 is driven by a clock, this clock may be a clock signal of a system the same as the circuit under test 652, or may be a clock signal of a different system. Furthermore, a force pattern from a BIST pattern generation circuit, not shown in the drawings, inside a semiconductor integrated circuit may be applied to the replica circuit 656, or a test pattern from an external LSI tester or the like may also be applied.

The operation margin of the circuit under test changes due to power supply voltage change, temperature change, or the like, but, since the replica circuits 643 and 656 also receive the same effect at this time, by monitoring signals output from the replica circuits 643 and 656, it is possible to predict change of the operation margins of the circuits under test 642 and 652. Using this monitoring result, it is possible to adjust frequency of the clock signal provided to the circuits under test 642 and 652.

The clock adjusting circuits shown after FIG. 51 may be as in the clock adjusting circuits shown after FIGS. 15A and 15B. Furthermore, a clock signal output by the clock adjusting circuit in view of a power supply voltage change, may be not only a clock frequency, but also a duty ratio, jitter, or the like.

In the present exemplary embodiment, from a result of both a measured value measured by a circuit for measuring the power supply voltage inside a chip, and a value of the operation margin measured by the clock adjusting circuit, by judging quality (size of operation margin) of the chip, in a chip selection test or the like, it is possible to raise accuracy of a judgment related to size of operation leeway of the chip.

For example, a monitoring result of the operation margin is assumed to be 2 for a chip A, and 1 for a chip B.

In monitoring of only the operation margin, the quality of the chip B is judged to be worse than the chip A.

However, by knowing at the same time the power supply voltage when the operation margin is observed, for example, the information:
in the chip A, when the operation margin is 2, the power supply voltage at this time is 1.0, and
in the chip B, when the operation margin is 1, the power supply voltage at this time is 0.5,
can be obtained.

Now, when a specification of the power supply voltage is 1.0, irrespective of a very bad condition in which the power supply voltage is 0.5, a judgment is possible that chip quality for the chip B, in which the operation margin is 1, is better than the chip A.

Here, when the operation margin is measured, it is possible to change targets of measurement, such as, besides the power supply voltage, chip temperature, stress, and the like.

In this way, simultaneously measuring the operation margin and the power supply voltage or the like at the same time, to judge the quality of the chip by respective sets thereof, is, for example, just the same as if, when measuring body fat percentage for a human, not only measuring the body fat percentage overall, but simultaneously measuring weight and height at the same time as the body fat percentage, to judge health level.

Descriptions have been given above according to the abovementioned exemplary embodiments of the present invention, but the present invention is not limited to only configurations of the abovementioned exemplary embodiments, and clearly includes every type of transformation and modification that a person skilled in the art can realize within the scope of the present invention.

What is claimed is:

1. A clock adjusting circuit comprising:
a phase shifter circuit that receives a clock signal and that variably shifts and outputs a timing phase of both or one of a rising edge and a falling edge of a clock pulse, based on a control signal; and
a control circuit that supplies the control signal at timing prior to a transition edge of the clock signal output from the phase shifter circuit, to the phase shifter;
the clock adjusting circuit being able to output a clock signal that has at least one parameter out of a clock period, duty ratio, jitter, and skew changed on a clock cycle base;
wherein the phase shifter circuit comprises:
a first and a second phase shifter that receive an input clock signal in common; and
a selector that receives outputs of the first and second phase shifters, and selectively outputs one thereof based on a selection control signal supplied thereto;
the control circuit supplying a first and a second control signal to the first and second phase shifters, respectively;
the first and second phase shifters variably shifting a rising edge and falling edge of the clock signal, respectively, and
the selector selecting an output of the first phase shifter as a rising edge of the clock signal rising edge, and selecting an output of the second phase shifter as a falling edge of the clock signal; and wherein a signal generated from an output signal of the selector is used in the selection control signal.

2. A clock adjusting circuit comprising:
a phase shifter circuit that receives a clock signal and that variably shifts and outputs a timing phase of both or one of a rising edge and a falling edge of a clock pulse, based on a control signal; and
a control circuit that supplies the control signal at timing prior to a transition edge of the clock signal output from the phase shifter circuit, to the phase shifter;
the clock adjusting circuit being able to output a clock signal that has at least one parameter out of a clock period, duty ratio, jitter, and skew changed on a clock cycle base;
wherein the phase shifter circuit comprises a plurality of circuit units, each of the circuit units including:
a pair of phase shifters that receive the input clock in common, and
a selector that receives outputs of the pair of phase shifters and selectively outputs one thereof based on a selection control signal;
the control circuit supplying respective control signals to the respective phase shifters of the plurality of circuit units, and
multi-phase clocks being output from the selectors of the plurality of circuit units,
at least a first and a second circuit unit, as the plurality of circuit units;
the selector of the first circuit unit receiving output of the selector of the second circuit unit, as a selection control signal, and
the selector of the second circuit unit receiving output of the selector of the first circuit unit, as a selection control signal.

3. The clock adjusting circuit according to claim 2, wherein the control circuit comprises:
a first adder that receives control code specifying a clock period;
a register that holds an output of the first adder, an output of the register being received by the first adder;
a second adder that adds ½ of the control code and the output of the register,
the output of the register and an output of the second adder being supplied to one pair of phase shifter circuits of the first circuit unit; a third adder that adds ¼ of the control code and the output of the register; and
a fourth adder that adds ½ the control code specifying the clock period and an output of the third adder,
outputs of the third and fourth adders being supplied to one pair of phase shifter circuits of the second circuit unit.

4. The clock adjusting circuit according to claim 3, comprising:
a pair of adders that add control code for any one of a clock phase, skew, and duty, with respect to an output of the register and an output of the second adder; and
a pair of adders that add control code for any one of a clock phase, skew, and duty, with regard to outputs of the third and fourth adders.

5. A clock adjusting circuit comprising:
a phase shifter circuit that receives a clock signal and that variably shifts and outputs a timing phase of both or one of a rising edge and a falling edge of a clock pulse, based on a control signal; and
a control circuit that supplies the control signal at timing prior to a transition edge of the clock signal output from the phase shifter circuit, to the phase shifter;
the clock adjusting circuit being able to output a clock signal that has at least one parameter out of a clock period, duty ratio, jitter, and skew changed on a clock cycle base;
wherein the control circuit comprises:
a counter that counts a clock signal;
a decoder that receives a count value of the counter and that generates an address signal; and
a memory that reads data of the address signal output from the decoder, and outputs the data as the control signal.

6. A clock adjusting circuit comprising:
a phase shifter circuit that receives a clock signal and that variably shifts and outputs a timing phase of both or one of a rising edge and a falling edge of a clock pulse, based on a control signal; and
a control circuit that supplies the control signal at timing prior to a transition edge of the clock signal output from the phase shifter circuit, to the phase shifter;
the clock adjusting circuit being able to output a clock signal that has at least one parameter out of a clock period, duty ratio, jitter, and skew changed on a clock cycle base;
wherein the control circuit comprises:
a shift register that performs a shift operation responsive to a clock signal and outputs the shifted result as the control signal.

7. A semiconductor integrated circuit device comprising:
a clock adjusting circuit comprising:
a phase shifter circuit that receives a clock signal and that variably shifts and outputs a timing phase of both or one of a rising edge and a falling edge of a clock pulse, based on a control signal; and
a control circuit that supplies the control signal at timing prior to a transition edge of the clock signal output from the phase shifter circuit, to the phase shifter;
the clock adjusting circuit being able to output a clock signal that has at least one parameter out of a clock period, duty ratio, jitter, and skew changed on a clock cycle base;
a circuit that receives via a buffer an output clock of the clock adjusting circuit; and
a phase comparator that compares phases of a reference clock and a clock signal received by the circuit that receives via a buffer an output clock of the clock adjusting circuit, and supplies a comparison result to the control circuit.

8. The semiconductor integrated circuit according to claim 7, wherein the semiconductor integrated circuit performs a margin test of a timing operation by executing at least one out of:
changing a clock period of an arbitrary cycle;
changing jitter amplitude, and/or jitter frequency of a clock signal of an arbitrary cycle;
changing a frequency, and/or a duty ratio of a clock signal of an arbitrary cycle;
delaying or advancing a phase of a clock of a clock domain under test with respect to another clock domain or an external clock; and
changing a phase of a clock signal of an arbitrary cycle, and/or a duty ratio of a clock signal; and
judges whether or not there is an error.

9. A semiconductor integrated circuit device comprising:
a unit that receives a clock signal, and, based on a control signal, generates a clock signal in which a timing phase of both edges or one edge of a clock pulse is changed; and a unit that generates the control signal,
a timing phase of an edge of the clock pulse being changeable on a clock cycle base, and
a clock adjusting circuit that supplies a clock signal obtained by variably adjusting at least one parameter out of a clock period, duty ratio, jitter, and skew between clock domains, to a circuit that is a clock supply destination inside a semiconductor integrated circuit device;
wherein after the semiconductor integrated circuit device has been shipped, the testing is performed autonomously using the clock adjusting circuit mounted in the semiconductor integrated circuit device, and
a self test of an operation margin of the semiconductor integrated circuit device is performed.

10. The semiconductor integrated circuit device according to claim 9, comprising
a unit that issues a warning for reduction of operation margin, according to a result of the self test.

11. The semiconductor integrated circuit device according to claim 9, comprising
a unit that stops a system, according to a result of the self test.

12. A semiconductor integrated circuit device comprising:
a unit that receives a clock signal, and, based on a control signal, generates a clock signal in which a timing phase of both edges or one edge of a clock pulse is changed; and
a unit that generates the control signal,
a timing phase of an edge of the clock pulse being changeable on a clock cycle base, and
a clock adjusting circuit that supplies a clock signal obtained by variably adjusting at least one parameter out of a clock period, duty ratio, jitter, and skew between clock domains, to a circuit that is a clock supply destination inside a semiconductor integrated circuit device;
wherein the clock adjusting circuit is connected to a BIST (Built In Self Test) circuit, and
a self test is performed while adjusting at least one of a period, a duty ratio, and skew of a clock signal by the BIST circuit.

13. A semiconductor integrated circuit device comprising:
a clock adjusting circuit in which, with regard to a clock signal of an arbitrary number of cycles or a limitless number of cycles, which are consecutive, at least one of a clock period, duty ratio, and delay, can be adjusted to a value different from a value of an input clock signal;
wherein the clock adjusting circuit includes:
a clock input terminal;
a clock output terminal;
a control input terminal;
a phase shifter circuit that adjusts delay between a clock signal received by the clock input terminal and a clock signal output from the clock output terminal, based on a value of a digital signal received by a control signal input terminal; and
a control circuit;
wherein the phase shifter circuit includes:
a clock input terminal;
a clock output terminal;
a control input terminal; and
a unit that has at least one of a selector or a phase compensation circuit, and that adjusts delay between a clock received by the clock input terminal and a clock signal output from the clock output terminal, based on a value of a digital signal received by the control signal input terminal;
a delay of a clock signal adjusted by the phase shifter circuit being adjusted in N stages (N is a prescribed positive integer), a change amount of delay of one stage is 1/N of a clock period, and the delay being able to be shifted; and
wherein the control circuit includes:
a control input terminal; and
a control output terminal;
the control output terminal of the control circuit being connected to the control input terminal of the phase shifter circuit;
the control input terminal of the control circuit being connected to the control signal input terminal of the clock adjusting circuit;
the clock input terminal of the clock adjusting circuit being connected to the clock input terminal of the phase shifter circuit;
the clock output terminal of the clock adjusting circuit being connected to the clock output terminal of the phase shifter circuit;
the clock input terminal of the clock adjusting circuit being connected to a clock input terminal from outside or to an output terminal of a clock signal generation circuit inside a semiconductor integrated circuit; and
the clock output terminal of the clock adjusting circuit being connected to at least one of a logic circuit inside the semiconductor integrated circuit, a memory circuit, and an input-output circuit;
wherein the clock adjusting circuit comprises:
a first phase shifter circuit;
a second phase shifter circuit;
a 2-input selector circuit; and
a control circuit;
wherein the first and second phase shifter circuits each comprise:
a clock input terminal;
a clock output terminal; and
a control input terminal;
the clock output terminal of the phase shifter circuit outputting a clock signal obtained by shifting a phase of a clock signal supplied from the clock input terminal of the phase shifter circuits,
a phase difference between a clock signal received by the clock input terminal of the phase shifter circuits and a clock signal output from the output terminal of the phase shifter circuits being determined based on a value of a digital signal given from the control input terminal of the phase shifter circuits,
the phase difference being adjusted in N stages (N is an integer),
an adjustment step of the phase difference being 360/N degrees,
the control input terminal of the phase shifter circuits is connected to the control circuit,
wherein the 2-input selector circuit comprises:
a first clock signal input terminal;
a second clock signal input terminal;
an output terminal; and
a selection signal input terminal;
any signal given by the first and second clock signal input terminals being selected, by a value supplied from the selection signal input terminal, and the selected signal being output from the output terminal, and
wherein the control circuit comprises:
a first output terminal; and
a second output terminal;

an input clock signal being connected to the clock input terminal of the first and second phase shifter circuits, the clock output terminal of the first and second phase shifter circuits being connected to the first and second clock signal input terminals of the 2-input selector circuit respectively, the control input terminals of the first and second phase shifter circuits being respectively connected to the first and second output terminals of the control circuit, and a clock signal being output from the output terminals of the 2-input selector.

14. The clock adjusting circuit according to claim 13, further comprising a delay element, the delay element including:
an input terminal; and
an output terminal; and
the output terminal of the 2-input selector circuit being connected to the input terminal of the delay element, and
the output terminal of the delay element being connected to the selection signal input terminal of the two input selector circuit.

15. A semiconductor integrated circuit device comprising:
a clock adjusting circuit in which, with regard to a clock signal of an arbitrary number of cycles or a limitless number of cycles, which are consecutive, at least one of a clock period, duty ratio, and delay, can be adjusted to a value different from a value of an input clock signal;
wherein the clock adjusting circuit includes:
a clock input terminal;
a clock output terminal;
a control input terminal;
a phase shifter circuit that adjusts delay between a clock signal received by the clock input terminal and a clock signal output from the clock output terminal, based on a value of a digital signal received by a control signal input terminal; and
a control circuit;
wherein the phase shifter circuit includes:
a clock input terminal;
a clock output terminal;
a control input terminal; and
a unit that has at least one of a selector or a phase compensation circuit, and that adjusts delay between a clock received by the clock input terminal and a clock signal output from the clock output terminal, based on a value of a digital signal received by the control signal input terminal;
a delay of a clock signal adjusted by the phase shifter circuit being adjusted in N stages (N is a prescribed positive integer), a change amount of delay of one stage is 1/N of a clock period, and the delay being able to be shifted; and
wherein the control circuit includes:
a control input terminal; and
a control output terminal;
the control output terminal of the control circuit being connected to the control input terminal of the phase shifter circuit;
the control input terminal of the control circuit being connected to the control signal input terminal of the clock adjusting circuit;
the clock input terminal of the clock adjusting circuit being connected to the clock input terminal of the phase shifter circuit;
the clock output terminal of the clock adjusting circuit being connected to the clock output terminal of the phase shifter circuit;

the clock input terminal of the clock adjusting circuit being connected to a clock input terminal from outside or to an output terminal of a clock signal generation circuit inside a semiconductor integrated circuit; and the clock output terminal of the clock adjusting circuit being connected to at least one of a logic circuit inside the semiconductor integrated circuit, a memory circuit, and an input-output circuit wherein the clock adjusting circuit comprises:
a first phase shifter circuit;
a second phase shifter circuit;
a third phase shifter circuit;
a fourth phase shifter circuit;
a first 2-input selector circuit;
a second 2-input selector circuit; and
a control circuit;
the first, second, third, and fourth phase shifter circuits each comprising:
a clock input terminal;
a clock output terminal; and
a control input terminal;
the first and second 2-input selector circuits each comprising:
a first clock signal input terminal;
a second clock signal input terminal;
an output terminal; and
a selection signal input terminal;
any signal supplied from the first and second clock signal input terminals being selected, by a value supplied from the selection signal input terminal, and the selected signal being output from an output terminal,
the control circuit comprising:
first, second, third, and fourth output terminals,
an input clock signal being connected to the clock input terminals of the first, second, third, and fourth phase shifter circuits,
the clock output terminals of the first and second phase shifter circuits being respectively connected to the first and second clock signal input terminals of the first 2-input selector circuit,
the clock output terminals of the third and fourth phase shifter circuits being respectively connected to the first and second clock signal input terminals of the second 2-input selector circuit,
the control input terminals of the first, second, third, and fourth phase shifter circuits being respectively connected to the first, second, third, and fourth output terminals of the control circuit, and
two clock signals being output respectively from the output terminal of the first 2-input selector and from the output terminal of the second 2-input selector.

16. The clock adjusting circuit according to claim 15, wherein a phase of a clock signal output from the first 2-input selector circuit and a phase of a clock signal output from the second 2-input selector circuit are different.

17. The clock adjusting circuit according to claim 15, wherein the output terminal of the first 2-input selector is connected to the selection signal input terminal of the second input selector, and
the output terminal of the second 2-input selector is connected to the selection signal input terminal of the first 2-input selector.

18. The clock adjusting circuit according to claim 15, wherein the control circuit comprises two clock input terminals, output terminals of the first and second 2-input selector circuits being connected to two clock inputs of the control circuit.

19. A clock adjusting circuit mounted in a semiconductor integrated circuit device, comprising:
a phase shifter circuit; and
a control circuit;
wherein the phase shifter circuit comprises:
a clock input terminal;
a clock output terminal; and
a control input terminal;
the clock output terminal of the phase shifter circuit outputting a clock signal obtained by shifting a phase of a clock signal supplied from the clock input terminal of the phase shifter circuit,
a phase difference between a clock signal received by the clock input terminal of the phase shifter circuit and a clock signal output from the output terminal of the phase shifter circuit being determined based on a value of a digital signal given from the control input terminal of the phase shifter circuit,
the phase difference being adjusted in N stages (N is an integer);
an adjustment step of the phase difference is 360/N degrees, and
the control input terminal of the phase shifter circuit being connected to the control circuit;
wherein the control circuit comprises:
one or more N bit adders, an output terminal of the adder being connected to a control input terminal of the phase shifter, via an output terminal of the control circuit;
a first adder; and
a second adder;
wherein the first and second adders comprises:
an N bit first input terminal;
an N bit second input terminal; and
an N bit or an N+1 bit output terminal;
a clock period control signal being connected to the first input terminal of the first adder;
an output terminal of the first adder being connected via a register to the second input terminal of the first adder,
the output terminal of the first adder being further connected also to the second input terminal of the second adder,
a value of half the clock period control signal or a value obtained by performing a 1 bit shift on the clock control signal being received by the first input terminal of the second adder, and
the output terminals of the first adder and the second adder being further connected respectively to control input terminals of the first and the second phase shifters, via output terminals of the control circuit.

20. The clock adjusting circuit according to claim 19, wherein the control circuit further comprises:
a third adder; and
a fourth adder; wherein
the third and fourth adders each comprises
an N bit first input terminal,
an N bit second input terminal, and
an N bit or an N+1 bit output terminal;
the output terminal of the first adder being further connected to the second input terminal of the third adder,
a value of a quarter of the clock period control signal or a value obtained by performing a 2 bit shift on the clock control signal being received by the first input terminal of the third adder,
the output terminal of the third adder being connected to the second input terminal of the fourth adder,
a value of half the clock period control signal or a value obtained by performing a 1 bit shift on the clock control signal being received by the first input terminal of the fourth adder, and
the output terminals of the first to fourth adders being connected respectively to control input terminals of the first to fourth phase shifters, via output terminals of the control circuit.

21. A clock adjusting circuit mounted in a semiconductor integrated circuit device, comprising:
a phase shifter circuit; and
a control circuit;
wherein the phase shifter circuit comprises:
a clock input terminal;
a clock output terminal; and
a control input terminal;
the clock output terminal of the phase shifter circuit outputting a clock signal obtained by shifting a phase of a clock signal supplied from the clock input terminal of the phase shifter circuit,
a phase difference between a clock signal received by the clock input terminal of the phase shifter circuit and a clock signal output from the output terminal of the phase shifter circuit being determined based on a value of a digital signal given from the control input terminal of the phase shifter circuit,
the phase difference being adjusted in N stages (N is an integer);
an adjustment step of the phase difference is 360/N degrees, and
the control input terminal of the phase shifter circuit being connected to the control circuit;
wherein the control circuit comprises:
a memory circuit; and
a counter circuit;
the memory circuit comprising:
an address input terminal;
a data output terminal; and
a plurality of memory cells,
each memory cell having a function for holding data,
data stored in one corresponding memory cell based on a value received by the address input terminal being output from the data output terminal,
the counter circuit comprising:
an output terminal;
a function for increasing or decreasing an output value for each of one or a plurality of clock cycles;
the output terminal of the counter circuit being connected to an address input terminal of the memory circuit, and
the data output terminal of the memory circuit being connected to a control input terminal of the phase shifter circuits of the clock adjusting circuit.

22. A clock adjusting circuit mounted in a semiconductor integrated circuit device, comprising:
a phase shifter circuit; and
a control circuit;
wherein the phase shifter circuit comprises:
a clock input terminal;
a clock output terminal; and
a control input terminal;

the clock output terminal of the phase shifter circuit outputting a clock signal obtained by shifting a phase of a clock signal supplied from the clock input terminal of the phase shifter circuit, a phase difference between a clock signal received by the clock input terminal of the phase shifter circuit and a clock signal output from the output terminal of the phase shifter circuit being determined based on a value of a digital signal given from the control input terminal of the phase shifter circuit, the phase difference being adjusted in N stages (N is an integer);

an adjustment step of the phase difference is 360/N degrees, and the control input terminal of the phase shifter circuit being connected to the control circuit;

wherein the control circuit comprises:
 a shift register circuit including a plurality of register circuits,
 each of the plurality of register circuits inside the shift register comprising:
 a data input terminal; and
 a data output terminal;
 the plurality of register circuits inside the shift register being connected in a row, in a form in which a data output terminal is connected to a data input terminal of another register circuit,
 the plurality of register circuits being provided with a function in which data stored by the register is transferred to an adjacent register, driven by a clock signal, and
 the data output terminal of any register inside the shift register circuits being connected to a control input terminal of the phase shifter circuits.

23. A clock adjusting circuit mounted in a semiconductor integrated circuit device, comprising:
 a phase shifter circuit; and
 a control circuit;
 wherein the phase shifter circuit comprises:
 a clock input terminal;
 a clock output terminal; and
 a control input terminal;
 the clock output terminal of the phase shifter circuit outputting a clock signal obtained by shifting a phase of a clock signal supplied from the clock input terminal of the phase shifter circuit,
 a phase difference between a clock signal received by the clock input terminal of the phase shifter circuit and a clock signal output from the output terminal of the phase shifter circuit being determined based on a value of a digital signal given from the control input terminal of the phase shifter circuit,
 the phase difference being adjusted in N stages (N is an integer);
 an adjustment step of the phase difference is 360/N degrees, and
 the control input terminal of the phase shifter circuit being connected to the control circuit;
 wherein the control circuit comprises a random number generation circuit.

24. The clock adjusting circuit according to claim 19, wherein the control circuit further comprises
 one or a plurality of adders,
 each of the plurality of adders comprising:
 a first input terminal;
 a second input terminal; and
 an output terminal;
 the first input terminal of each of the adders being connected to a control signal output terminal of the clock adjusting circuit;
 the second input terminal of each of the adders being connected to a signal from outside the control circuit;
 an output terminal of each of the adders being connected respectively to a control input terminal of the phase shifter circuits; and
 a constant value being added to a control signal, by the adders, and a result of addition being supplied to the phase shifter circuits.

25. A clock adjusting circuit mounted in a semiconductor integrated circuit device, comprising:
 a phase shifter circuit; and
 a control circuit;
 wherein the phase shifter circuit comprises:
 a clock input terminal;
 a clock output terminal; and
 a control input terminal;
 the clock output terminal of the phase shifter circuit outputting a clock signal obtained by shifting a phase of a clock signal supplied from the clock input terminal of the phase shifter circuit,
 a phase difference between a clock signal received by the clock input terminal of the phase shifter circuit and a clock signal output from the output terminal of the phase shifter circuit being determined based on a value of a digital signal given from the control input terminal of the phase shifter circuit,
 the phase difference being adjusted in N stages (N is an integer);
 an adjustment step of the phase difference is 360/N degrees, and
 the control input terminal of the phase shifter circuit being connected to the control circuit;
 a phase comparator, the phase comparator including:
 a first input terminal;
 a second input terminal; and
 and output terminal;
 the phase comparator comparing a phase of a clock signal received by the first input terminal and a phase of a clock signal received by the second input terminal, and outputting from the output terminal a result of comparison as to whether a phase of any clock is advanced or delayed,
 the first input terminal of the phase comparator being connected to a clock signal output from the clock adjusting circuit,
 the second input terminal of the phase comparator being connected to a reference clock terminal or to a clock signal terminal of another circuit not connected to the clock adjusting circuit, and
 the output terminal of the phase comparator being connected to an input terminal of the control circuit of the clock adjusting circuit.

26. A method of testing a semiconductor device, comprising:
 generating a clock signal for a test in which a phase difference between a clock signal received by the semiconductor device and a clock signal output from the semiconductor device is adjusted in N stages; and
 adjusting at least one or more items selected out of a clock period, jitter frequency, jitter amplitude, duty, and delay of the clock signal for the test.

27. A semiconductor integrated circuit device, comprising:
a clock adjusting circuit comprising:
- a phase shifter circuit that receives a clock signal and that variably shifts and outputs a timing phase of both or one of a rising edge and a falling edge of a clock pulse, based on a control signal; and
- a control circuit that supplies the control signal at timing prior to a transition edge of the clock signal output from the phase shifter circuit, to the phase shifter;
- the clock adjusting circuit being able to output a clock signal that has at least one parameter out of a clock period, duty ratio, jitter, and skew changed on a clock cycle base;
a circuit that operates responsive to a clock signal supplied from the clock adjusting circuit;
an on-chip waveform monitoring circuit that monitors a waveform of a prescribed signal inside a semiconductor integrated circuit; and
a replica circuit that predicts characteristic change of a circuit that operates responsive to a clock signal supplied from the clock adjusting circuit;
wherein the on-chip waveform monitoring circuit monitors change in at least one out of an input signal, an output signal, and an input-output signal of the replica circuit, and an internal signal of the replica circuit.

28. A semiconductor integrated circuit device, comprising:
a clock adjusting circuit comprising:
- a phase shifter circuit that receives a clock signal and that variably shifts and outputs a timing phase of both or one of a rising edge and a falling edge of a clock pulse, based on a control signal; and
- a control circuit that supplies the control signal at timing prior to a transition edge of the clock signal output from the phase shifter circuit, to the phase shifter;
- the clock adjusting circuit being able to output a clock signal that has at least one parameter out of a clock period, duty ratio, jitter, and skew changed on a clock cycle base;
a circuit that operates responsive to a clock signal supplied from the clock adjusting circuit; and
a replica circuit that predicts characteristic change of a circuit that operates responsive to a clock signal supplied from the clock adjusting circuit.

29. The semiconductor integrated circuit device according to claim 28, wherein the control circuit generates the control signal based on an output signal of the replica circuit, and variably controls a waveform of a clock signal output from the clock adjusting circuit.

30. A semiconductor integrated circuit device comprising a clock adjusting circuit including:
a unit that receives a control signal generated by a control circuit arranged inside the semiconductor integrated circuit device, and that variably adjusts, with respect to a clock signal supplied to at least one clock supply destination circuit inside the semiconductor integrated circuit device, in accordance with the control signal, at least one characteristic out of a period, duty, jitter, and skew of the clock signal, on a clock cycle base; wherein
the control circuit generates the control signal, based on at least one out of:
a waveform monitoring result of a prescribed power supply terminal inside the semiconductor integrated circuit device;
a waveform monitoring result of a prescribed ground terminal inside the semiconductor integrated circuit device;
a monitoring result of a signal waveform of the clock supply destination circuit;
a temperature measurement result inside the semiconductor integrated circuit device;
an output of a replica circuit arranged inside the semiconductor integrated circuit device for predicting a characteristic change in the clock supply destination circuit; and
an error detection result related to output of the clock supply destination circuit.

31. The semiconductor integrated circuit device according to claim 30, further comprising
a clock generation circuit that generates a clock signal to supply the clock adjusting circuit, wherein
control signals from the control circuit are respectively supplied, besides the clock adjusting circuit, to the clock generation circuit, and a characteristic of a clock signal supplied to the clock supply destination is variably controlled.

32. The semiconductor integrated circuit device according to claim 30, further comprising
a variable delay circuit that receives a clock signal output from the clock adjusting circuit and supplies a clock to the clock supply destination circuit, wherein
a control signal from the control circuit is supplied also to the variable delay circuit, and a characteristic of a clock supplied to the clock supply destination is variably controlled.

* * * * *